(12) United States Patent
Xu et al.

(10) Patent No.: US 10,373,725 B2
(45) Date of Patent: Aug. 6, 2019

(54) HIGHLY TWINNED, ORIENTED POLYCRYSTALLINE DIAMOND FILM AND METHOD OF MANUFACTURE THEREOF

(71) Applicant: II-VI INCORPORATED, Saxonburg, PA (US)

(72) Inventors: Wen-Qing Xu, Medfield, MA (US); Chao Liu, Butler, PA (US); Charles J. Kraisinger, Saxonburg, PA (US); Charles D. Tanner, Saxonburg, PA (US); Ian Currier, Butler, PA (US); David Sabens, Harmony, PA (US); Elgin E. Eissler, Renfrew, PA (US); Thomas E. Anderson, Morristown, NJ (US)

(73) Assignee: II-VI Incorporated, Saxonburg, PA (US)

( * ) Notice: Subject to any disclaimer, the term of this patent is extended or adjusted under 35 U.S.C. 154(b) by 665 days.

(21) Appl. No.: 14/817,704

(22) Filed: Aug. 4, 2015

(65) Prior Publication Data

US 2016/0130725 A1 May 12, 2016

Related U.S. Application Data

(60) Provisional application No. 62/076,215, filed on Nov. 6, 2014.

(51) Int. Cl.
*H01B 1/04* (2006.01)
*C01B 32/25* (2017.01)
(Continued)

(52) U.S. Cl.
CPC .............. *H01B 1/04* (2013.01); *C01B 32/25* (2017.08); *C23C 16/274* (2013.01); *C23C 16/52* (2013.01)

(58) Field of Classification Search
None
See application file for complete search history.

(56) References Cited

U.S. PATENT DOCUMENTS 5,260,106 A * 11/1993 Kawarada ........... C23C 16/0272
117/91
5,275,798 A * 1/1994 Aida ..................... C23C 16/272
117/103
(Continued)

FOREIGN PATENT DOCUMENTS

JP 62107068 A 5/1987
JP 06240458 A 8/1994
(Continued)

OTHER PUBLICATIONS

Asmussen et al. (Editors), Diamond Films Handbook, 2002, 688 total book pages, Marcel Dekker, Inc. Ny, Ny, US.
Balmer, R.S. et al., "Chemical vapour deposition synthetic diamond: materials, technology and applications", Journal of Physics: Condensed Matter, 2009. vol. 21. No. 36, 364221 (3 pages).
(Continued)

*Primary Examiner* — Guinever S Gregorio
(74) *Attorney, Agent, or Firm* — The Webb Law Firm

(57) ABSTRACT

In a method of chemical vapor deposition (CVD) growth of a polycrystalline diamond film in a CVD reactor, a gas mixture of gaseous hydrogen and a gaseous hydrocarbon is introduced into the CVD reactor. A plasma formed from the gas mixture is maintained above a surface of a conductive substrate disposed in the CVD reactor and causes a polycrystalline diamond film to grow on the surface of the conductive substrate. A temperature T at the center of the polycrystalline diamond film is controlled during growth of the polycrystalline diamond film. The CVD grown polycrystalline diamond film includes diamond crystallites that can have a percentage of orientation along a [110] diamond lattice direction≥70% of the total number of diamond crystallites forming the polycrystalline diamond film.

10 Claims, 35 Drawing Sheets
(4 of 35 Drawing Sheet(s) Filed in Color)

(51) Int. Cl.
*C23C 16/27* (2006.01)
*C23C 16/52* (2006.01)

(56) References Cited

U.S. PATENT DOCUMENTS

| | | | |
|---|---|---|---|
| 6,051,063 | A | 4/2000 | Tanabe et al. |
| 2014/0230729 | A1 | 8/2014 | Brandon et al. |
| 2015/0030786 | A1 | 1/2015 | Coe et al. |
| 2015/0222087 | A1* | 8/2015 | Williams .............. C23C 16/274 428/64.1 |

FOREIGN PATENT DOCUMENTS

| | | |
|---|---|---|
| JP | 07005304 A | 1/1995 |
| JP | 3112896 A | 7/2005 |
| JP | 2009238971 A | 10/2009 |
| WO | 2012084661 A1 | 6/2012 |
| WO | 2014026930 A1 | 2/2014 |

OTHER PUBLICATIONS

Kobashi, "Diamond Films Chemical Vapor Deposition for Oriented and Heteroepitaxial Growth", 2005, 348 total book pages, Elsevier Ltd, Oxford UK.
Nazare et al., Properties, Growth and Applications of Diamond, 2001, 446 total book pages, INSPEC, London, UK.
Nelson, Stephen A., "Twinning, Polymorphism, Polytypism, Pseudomorphism", Tulane University (Mineralogy), 2013, pp. 1-12.
Prawer et al., "Raman spectroscopy of diamond and doped diamond", The Royal Society, 2004, pp. 2537-2565, 362, Phil. Trans. R. Soc. Lond. A.
Silva, F. et al., "Microwave engineering of plasma-assisted CVD reactors for diamond deposition", 2009, J. Phys.: Condens. Matter, vol. 21, No. 36, 364202 (3 pages).
Zaitsev, Optical Properties of Diamond—A Data Handbook, 2001, 508 total book pages, Springer-Verlag Berlin Heidelberg, NY, NY, US.

* cited by examiner

DETERMINING THE LEVEL OF TWINNING FOR DIAMOND WAFER 02A152 AT THE CENTER BY MEASURING THE LENGTHS OF TWINNED INTERSECTIONS AND THE LENGTHS OF MOTHER CRYSTALLITE BOUNDARIES IN SEM IMAGE

BOUNDARIES AMONG GRAINS (THICK LINES): 1,290mm

TWINNING INTERSECTIONS (THIN LINES) 2,700mm

TOTAL LENGTH 3,990mm

TWINNING % (METHOD 1) 2,700/3,990 = 67.7 %

FIG. 11A POLISHED GROWTH SURFACE
FIG. 11B POLISHED/ETCHED GROWTH SURFACE
POLISHED AND POLISHED AND ETCHED SEM IMAGES OF THE GROWTH SIDE OF DIAMOND WAFER 02A152

SEM IMAGE AND PERCENTAGES OF ORIENTATION DISTRIBUTIONS OF DIAMOND CRYSTALLITES OBTAINED FROM XRD PATTERNS OF DIAMOND WAFER 01A231A GROWN AT 1060 C° WITH 3% METHANE IN HYDROGEN FOR 16 HOURS (PREMATURE DELAMINATED AND SHATTERED)

SEM IMAGES OF THE GROWTH SIDE AND NUCLEATION SIDE, AND PERCENTAGES OF ORIENTATION DISTRIBUTIONS OF DIAMOND CRYSTALLITES OBTAINED FROM XRD PATTERNS OF DIAMOND WAFER 01A231 GROWN AT 1020° C WITH 3% METHANE IN HYDROGEN FOR 101 HOURS ON A DIAMOND-POWDERS-RUBBED SUBSTRATE

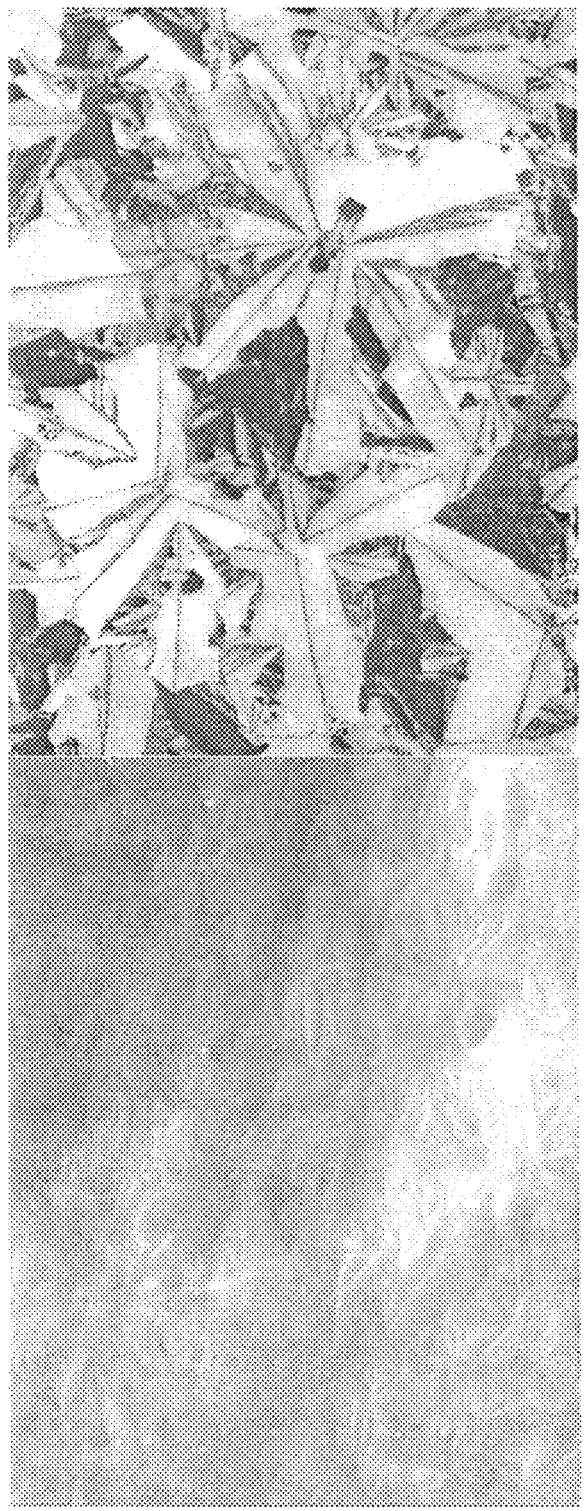
POLISHED AND POLISHED-AND-ETCHED SEM IMAGES OF THE GROWTH SIDE OF DIAMOND WAFER 01A226
FIG. 22A POLISHED GROWTH SURFACE
FIG. 22B POLISHED-AND-ETCHED GROWTH SURFACE

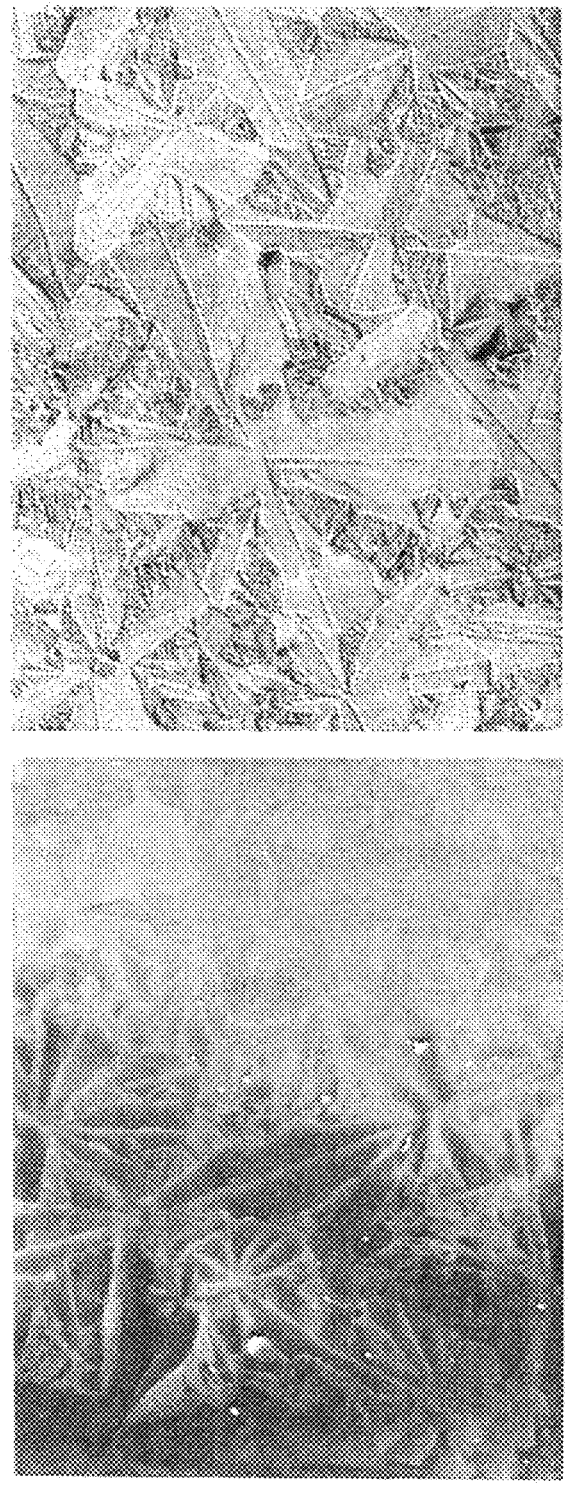
FIG. 28A — POLISHED GROWTH SURFACE
FIG. 28B — POLISHED AND ETCHED GROWTH SURFACE
POLISHED AND POLISHED-AND-ETCHED SEM IMAGES OF THE GROWTH SIDE OF WAFER 01A227

SEM IMAGES AT THE CENTER OF DIAMOND 01A235

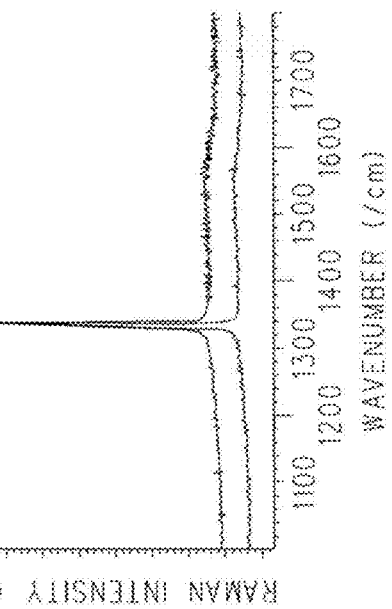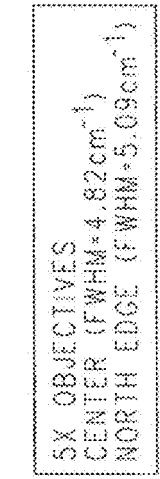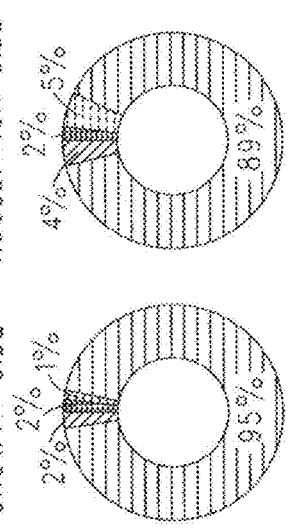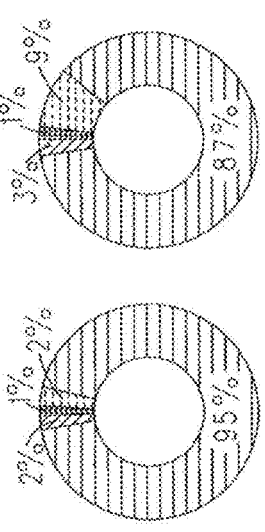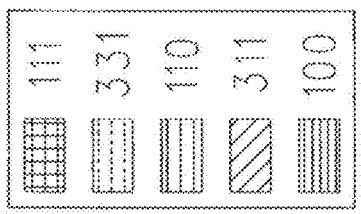
FIG. 31A
FIG. 31B

HIGHLY TWINNED, ORIENTED POLYCRYSTALLINE DIAMOND FILM AND METHOD OF MANUFACTURE THEREOF

CROSS REFERENCE TO RELATED APPLICATION

This application claims the benefit of U.S. Provisional Application No. 62/076,215, filed Nov. 6, 2014, which is incorporated herein by reference.

BACKGROUND OF THE INVENTION

Field of the Invention

The present invention relates to a polycrystalline diamond film comprising diamond crystallites and a method of growth of the polycrystalline diamond film.

Description of Related Art

Diamond is the hardest material known, having a Mohs Hardness of 10, which makes diamond most useful for applications of cutting, machining, drilling, milling, etc. Diamond is also the most thermally conductive material known, having a thermal conductivity up to 2000 to 2200 watts per meter per Kelvin, which makes it highly desirable for applications in thermal management under demanding conditions. Diamond also has an extremely low coefficient of friction, which makes it a versatile material for uses as brakes. Diamond is also an excellent optical material for transmitting microwave, infrared, visible, and other ultraviolet electromagnetic waves. Diamond has a high stability when used as detector for high fluence nuclear radiation. In addition, diamond is also highly inert in chemical environments that involve strong acid, strong base, strong oxidizing agent, or strong reducing agent, even at elevated temperatures or at cryogenic conditions. Furthermore, diamond is a high refractive index material, which leads to its popularity and premium value in jewelry industries. For more information, please refer to following references, (1) "Properties, Growth and Applications of Diamond", Edited by M. H. Nazare and A. J. Neves, 2001, published by The Institute of Electrical Engineers; (2) "Diamond Films Handbook", edited by Jes Asmussen and D. K. Reinhard, 2002, published by Marcel Dekker; and (3) "Diamond Films, Chemical Vapor Deposition for Oriented and Heteroepitaxial Growth", Edited by Koji Kobashi, 2005, published by Elsevier.

Though diamond is one of the most versatile and most premium materials, its availability is very limited in nature. Diamond mined from the earth is typically of single crystal with geometrical dimensions that are limited in size, most of the time, too small for industrial uses that require large dimensions. Many times, diamond formed in nature contains impurities and crystal defects. The diamond crystal that is relatively large in crystal size, relatively pure in chemical contents, and relatively perfect without crystal defects is very expensive, often times, priceless.

Synthetic diamond is known to be produced industrially in chemical reactors under extremely High Temperatures and extremely High Pressures, known as the HTHP process. Due to such harsh synthetic conditions, reactor sizes are limited, as are the dimensions of the diamond grown from the HTHP process, not to mention its associated high costs in process, equipment, and safety. Often times, the HTHP process produces diamond that has a yellow tint due to the incorporation of catalytic impurities into diamond lattices. In addition, the HTHP process is not able to produce diamond wafers of a large diameter.

Industrially, single crystal diamond can also be grown in reactors in a process called chemical vapor deposition (CVD), where suitable growth conditions can be achieved by microwave-enhanced plasma, tungsten hot-filament, DC-Jet plasma, laser-induced plasma, acetylene-torch, etc. It is known in art that CVD growth processes can also successfully grow polycrystalline diamond thin films on different substrates and/or free standing diamond thick films, though very challenging to obtain low stress films or non-cracked diamond of significant size. However, the CVD growth process can produce diamond substrates that can be significantly greater in size than the diameter of single crystal diamond from nature or grown using the HTHP process. Nevertheless, the growth rate of diamond in CVD process, or any other diamond growth process, is generally slow, e.g., in a range from a growth rate of less than 1 micron/hr to a growth rate of a few microns/hr, though there are reports of being able to grow single crystal at a higher growth rate, but with an increased number of defects.

For economic reasons, it is desirable to grow diamond film at a high growth rate with a large diameter, thus resulting in reduced production cost per unit volume of diamond. Higher growth temperature and higher methane concentration can drive the growth rate of diamond film. However, growing large diameter diamond films at high growth rates has challenges. The faster the diamond film grows, the more undesirable $Sp^2$ carbon atoms are incorporated into the diamond film along with the desirable $Sp^3$ carbon atoms due to a lack of time for hydrogen free radicals to etch away the undesirable $Sp^2$ carbon atoms from the diamond film, which results in an increased stress in the diamond film, and, often times, an undesirable quality of the diamond film. The faster the diamond grows, at the same time, the more diamond crystallites can be misaligned on the diamond film, which can also result in a higher level of stress in the diamond film. In addition, the larger the diameter of the substrate on which diamond grows, the more the stress is accumulated in the diamond film, which can result in undesirable premature delamination and shattering of the diamond film. Therefore, the challenge is to successfully grow diamond film fast and large with desirable features, attributes and properties for various applications.

Even though diamond is an extremely hard material, the hardness of a single crystal diamond varies with its crystal orientation. A surface perpendicular to the [111] crystallographic direction of a pure diamond is the hardest. A surface perpendicular to the [111] is 100 times harder than a surface perpendicular to the [100] crystallographic direction of a pure diamond. Therefore, the [111] direction of the diamond crystal is the most durable and most desirable for mechanical applications with respect to wear resistance, while the [100] direction is softest and most desirable for its level of easiness being machined/fabricated to various tool shapes.

CVD polycrystalline diamond for mechanical uses can be grown into a free-standing wafer with a thickness from a few hundred microns to as thick as a couple of thousand microns, sometimes as thick as 3,000 microns or more. An as-grown free standing diamond wafer can be used for mechanical applications without lapping or polishing. The surface of as-grown free standing diamond wafer can be optionally lapped, and can be optionally further polished, to a desired surface roughness and flatness. Then, an as-grown, surface-lapped and/or surface-polished free standing diamond wafer can be laser-cut, or electrical-discharge-milled (EDM), if the diamond film is doped for electric conductivity, into different geometries for mechanical applications such as dressing, cutting, milling, drilling, grinding, lathing, etc. The surface that is generated by laser-cutting or EDM is used as a working surface for mechanical purposes. Many times, such working surface needs to be machined or fabricated at a certain angle. Before its use, the newly-generated laser-cut or EDM surface is often finely grounded to precise and desirable geometric shape and finish. Therefore, it is very desirable to have a level of ease in machining or fabricating the needed angle of the working surface. For a piece of single crystal diamond, there are choices to machine or fabricate on the surface along a direction of the [100] of the diamond crystal lattice. For polycrystalline free-standing CVD diamond, there is no such choice unless all diamond crystallites are preferentially oriented into to certain directions. Accordingly, it would be desirable to have a [100] oriented surface on which a needed angle can be relatively easily machined or fabricated. Additionally, it would also be desirable to form a polycrystalline free-standing diamond tool having a working surface that is preferentially-oriented to the [111] direction so that this diamond tool is harder, which can work better, have a lower cost of ownership; and have less frequency of tool change, which is more efficient and requires lower investments in capital equipment, etc.

In summary, it would be desirable to successfully grow a polycrystalline diamond film at a high growth rate on a large diameter substrate to a desirable thickness with a level of benign stress that prevents premature delamination. It would also be desirable that such polycrystalline diamond film is highly-oriented to the [110]-orientation along growth direction, and also has preferential orientations (the [111] and [100] directions) on cross-section of the diamond film, at certain angles from the growth surface, in a way that such diamond film is easy to fabricate into different tool geometries ([100] direction preferred), as well as has a desired level of hardness (the [111] direction preferred) for various applications such as, but not limited to, mechanical, thermal management, optics, detectors, wear-resistance, chemical inertness, acoustic, electromagnetic wave management, etc. It would also be desirable that such polycrystalline diamond film behave like a polycrystalline diamond film of small grain size in disrupting the [111] crystal cleavage planes for attaining desirable mechanical durability, but while allowing phonons to transport to attain a desired level of thermal conductivity.

SUMMARY OF THE INVENTION

Disclosed is a polycrystalline diamond film comprising diamond crystallites that are of the [110]-orientation of the diamond crystal lattice along the growth direction of the diamond film. The diamond crystallites of this polycrystalline diamond film desirably have a preferred [111]-orientation at an angle of 35° from the growth surface and a preferred [100]-orientation at the angle of 45° from the growth surface, resulting in advantages having both a durability-preferred working angle and a fabrication-preferred edge-making angle. Highly [110]-oriented diamond crystallites minimize misalignment among diamond crystallites that is believed to result in a level of benign stress that allows successful high speed growth of a polycrystalline diamond film with a large diameter to a desirable thickness without suffering premature delamination.

Also disclosed is a polycrystalline diamond film comprising diamond crystallites that twin around the [110] axis, forming star-shaped crystal morphology or bicycle-wheel-shaped concentric pies whose tips almost converge to the center of a circle. Such twinning can behave like mechanical wedges that relieve any radial stress (360°), if existing, in addition to the stress reduction possibly resulting from the [110]-orientation, to a level that is benign enough to allow a successful high speed growth of a polycrystalline diamond film with a large diameter to a desirable thickness without suffering premature delamination. Such twinning introduces substantial amounts of plane discontinuity of diamond lattice and effectively reduces the size of diamond the [111] cleavage planes so that the inventive polycrystalline diamond film in accordance with the principals described herein behaves like a polycrystalline diamond film of small grains for enhanced mechanical durability without introducing additional grain boundaries, which allows a minimum loss of diamond intrinsic thermal conductivity because phonons transport through twinned planes with little scattering while phonon scatters substantially on grain boundaries. In addition, the diamond crystal uniformity of highly twinned, [110]-oriented diamond film described herein allows facilitates outstanding surface finishing of the polished diamond surfaces (nucleation side and growth side) with respect to average surface roughness (Ra), peak-to-valley value (PV), flatness, etc., with an 20×-object-measured area of 200 micron by 350 microns. The polycrystalline diamond film described herein can be used in applications including, but not limited to, mechanical, optics, detectors, thermal management, electromagnetic wave management, acoustic wave management, wearing, chemical inertness, etc.

Various preferred and non-limiting embodiments or aspects of the present invention will now be described and set forth in the following numbered clauses:

Clause 1: A CVD grown polycrystalline diamond film comprising diamond crystallites having a percentage of orientation along a [110] diamond lattice direction ≥70%, or ≥80%, or ≥85%, or ≥90% of the total number of diamond crystallites forming the polycrystalline diamond film.

Clause 2: The polycrystalline diamond film of clause 1, wherein the percentage of orientation along the [110] diamond lattice direction is for the growth side, the nucleation side, or both the growth side and the nucleation side of the polycrystalline diamond film.

Clause 3: The polycrystalline diamond film of clause 1 or 2, comprising: diamond crystallites having a star-shaped, or a bicycle-wheel-shaped, or a concentric pie-shaped twinning morphology; and a percentage of twinning of the diamond crystallites is ≥20%, or ≥25%, or ≥30%, or ≥35% of the total number of diamond crystallites forming the polycrystalline diamond film.

Clause 4: The polycrystalline diamond film of any of clauses 1-3, wherein: the star-shaped twinning morphology is on an as-grown surface of the polycrystalline diamond film; and the bicycle-wheel-shaped, or concentric pie-shaped twinning morphology is on a polished growth surface of the polycrystalline diamond film:

Clause 5. The polycrystalline diamond film of any of clauses 1-4, wherein: the diamond crystallites twin around the [110] diamond lattice direction; and a percentage of twinning of the diamond crystallites is ≥20%, or ≥25%, or ≥30%, or ≥35% of the total number of diamond crystallites forming the polycrystalline diamond film:

Clause 6. The polycrystalline diamond film of any of clauses 1-5, wherein: the twinning morphology is star-shaped on an as-grown of the polycrystalline diamond film; and the twinning morphology is bicycle-wheel-shaped or concentric pie-shaped on a polished growth surface of the polycrystalline diamond film:

Clause 7. The polycrystalline diamond film of any of clauses 1-6, wherein a percentage of diamond crystallites that have a [111] orientation at an angle of 35.3° from a plane of the growth surface is ≥40%; or ≥50%; or ≥55%; or ≥60% of the total number of diamond crystallites forming the polycrystalline diamond film.

Clause 8: The polycrystalline diamond film of any of clauses 1-7 wherein a percentage of diamond crystallites that have a [100] orientation at an angle of 45° from a plane of the growth surface is ≥25%; or ≥30%; or ≥35%; or ≥40% of the total number of diamond crystallites forming the polycrystalline diamond film.

Clause 9: The polycrystalline diamond film of any of clauses 1-8 wherein a percentage of diamond crystallites that have a combined [100]&[331] orientation at an angle of 45° from a plane of the growth surface is ≥50%; or ≥60%; or ≥70%; or ≥80% of the total number of diamond crystallites forming the polycrystalline diamond film.

Clause 10: The polycrystalline diamond film of any of clauses 1-9, wherein the polycrystalline diamond film is doped with at least one other element.

Clause 11: The polycrystalline diamond film of any of clauses 1-10, wherein the at least one other element includes one or more of the following: boron, nitrogen, and oxygen.

Clause 12: The polycrystalline diamond film of any of clauses 1-11, wherein the polycrystalline diamond film has a diameter ≥120 mm; or ≥140 mm; or ≥150 mm.

Clause 13: The polycrystalline diamond film of any of clauses 1-12, wherein the polycrystalline diamond film has a thickness ≥100 microns, or ≥200 microns, or ≥300 microns, or ≥400 microns.

Clause 14: The polycrystalline diamond film of any of clauses 1-13, wherein the polycrystalline diamond film has a total cracking length ≤500 mm, or ≤400 mm, or ≤300 mm, or ≤200 mm.

Clause 15: The polycrystalline diamond film of clauses 1-14, wherein the polycrystalline diamond film has a standard deviation in thickness of <9%, or <8%, or <6%, or <5%.

Clause 16: A method of chemical vapor deposition (CVD) growth of a polycrystalline diamond film in a CVD reactor, the method comprising: (a) igniting and maintaining a plasma above a surface of a conductive substrate disposed in the CVD reactor in the presence of flow of a gas mixture of gaseous hydrogen (H) and a gaseous hydrocarbon (GH) into the CVD reactor, whereupon the maintained plasma forms a polycrystalline diamond film on the surface of the conductive substrate; and (b) concurrent with step (a), controlling a temperature T at the center of the diamond film such that T≥800° C.; or ≥850° C.; or ≥900° C.; or 1100° C.≤T≤1180° C.

Clause 17: The method of clause 16, wherein the flow of the gas mixture includes: a flow of GH (Fox) of 10 mL/min≤Fox≤200 mL/min; and a flow of H ($F_H$) of 1000 mL/min≤$F_H$≤3500 mL/min.

Clause 18: The method of clause 16 or 17, wherein the gas mixture is introduced into the CVD reactor at a flow rate of ≥1000 mL/min, or ≥1200 mL/min, or ≥1400 mL/min, or ≥1600 mL/min.

Clause 19: The method of any of clauses 16-18, wherein a concentration of the gaseous hydrocarbon (Cox) in the mixture is 0.5%≤$C_{GH}$≤5%.

Clause 20: The method of any of clauses 16-19, wherein GH is methane ($CH_4$).

Clause 21: The method of any of clauses 16-20, wherein a concentration of methane (Caw) in the mixture is 1-4%.

Clause 22: The method of any of clauses 16-21, further including maintaining the CVD reactor at a pressure between 100-350 torr during growth of the diamond film.

Clause 23: The method of any of clauses 16-22, further including forming the plasma in step (a) by introducing microwave energy into the CVD reactor, wherein a power of the microwave energy introduced into the CVD reactor is between 15 k watts-30 k watts.

Clause 24: The method of any of clauses 16-23, wherein the microwave energy is introduced into the CVD reactor at a frequency of 915 Mhz.

Clause 25: The method of any of clauses 16-24, wherein the mixture further includes at least one of the following: nitrogen, boron, an oxygen containing gas, and an inert gas.

Clause 26: The method of any of clauses 16-25, wherein the polycrystalline diamond film is grown by one of the following techniques: microwave-plasma CVD, DC-Arc Jet plasma CVD, hot-filament CVD, and hydrocarbon (e.g., acetylene) torch CVD.

Clause 27: A tool comprising a polycrystalline diamond film grown according to the method of any of clauses 16-27 cut at an angle of 13°, or 35°, or 45° from a plane of a growth surface of the polycrystalline diamond film.

Clause 28: A polycrystalline diamond film grown according to the method of any one of clauses 16-26, wherein the polycrystalline diamond film has an average surface roughness (Ra) less than 61 angstroms, or less than 34 angstroms, or less than 32 angstroms, or less than 20 angstroms.

Clause 29: A polycrystalline diamond film grown according to the method of any one of clauses 16-27, wherein the polycrystalline diamond film has a Peak-to-Valley Ratio (PV) less than 13,500 angstroms, or less than 13,000 angstroms, or less than 12,000 angstroms, or less than 11,000 angstroms.

BRIEF DESCRIPTION OF THE DRAWINGS

The patent or application file contains at least one drawing executed in color. Copies of this patent or patent application publication with color drawing(s) will be provided by the office upon request and payment of the necessary fee.

FIGS. 11A and 11B are SEM images of the polished and polished-and-etched growth side of the diamond wafer of FIG. 3A;

FIGS. 22A and 22B are SEM images of a polished and a polished-and-etched growth surface of the wafer shown in FIG. 19;

FIGS. 28A and 28B are SEM images of a polished and a polished-and-etched growth surface of the diamond wafer shown in FIG. 24;

FIG. 31A shows four rings representing percentages of orientations of diamond crystallites obtained from XRD patterns of the wafer shown in FIG. 29 at the center growth side (top left ring), the center nucleation side (top right ring), the edge of the growth side (lower left ring), and the edge nucleation side (lower right ring); and FIG. 31B shows Raman study results of the diamond wafer shown in FIG. 29 taken at the center and one edge of the diamond wafer.

DESCRIPTION OF THE INVENTION

Figure 1:
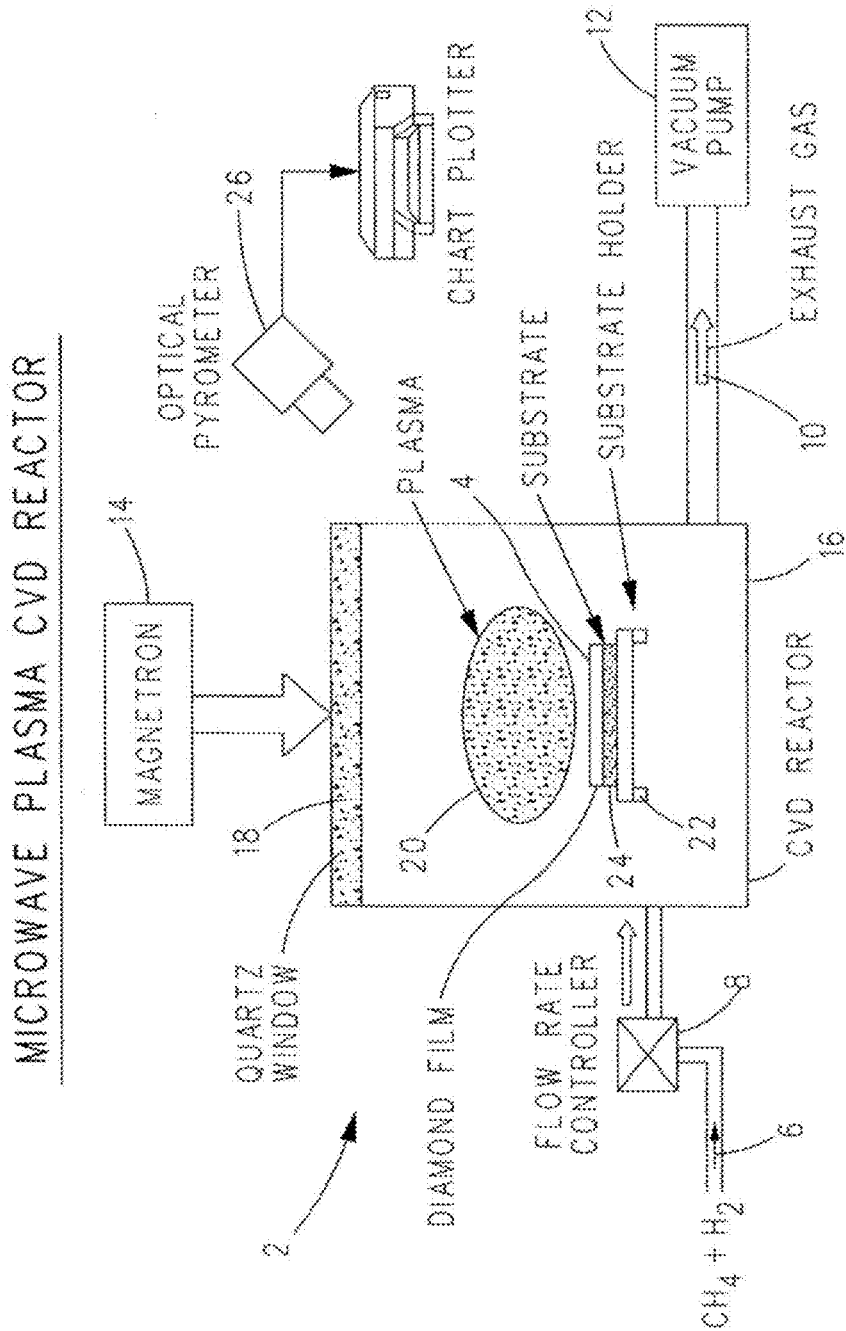
FIG. 1 is a schematic drawing of an exemplary microwave plasma chemical vapor deposition (CVD) system that can be used for depositing diamond films or wafers on a substrate in the manner described herein.

The present invention will now be described with reference to the accompanying figures where like reference numbers correspond to like elements.

Herein, temperature or temperatures expressed in terms of the degrees C. can vary ±3 degrees C.; time expressed in terms of hours can vary ±1/10 of an hour; distance expressed in terms of microns can vary ±10 microns; and each percentage (%) can vary ±0.2%).

A polycrystalline diamond film described herein exhibits [110]-preferred orientation along the growth surface of the polycrystalline diamond film. The diamond crystallites of the polycrystalline diamond film are highly oriented to the [110] diamond lattice direction along the growth direction, wherein the percentage of [110] orientation along the growth direction is desirably 70% or higher, more desirably 80% or higher, even more desirably 85% or higher, and most desirably 90% or higher.

Surprisingly, the polycrystalline diamond film also exhibits a number of cross-section desirable orientations. One such desirable orientation is located on a cross-section of the diamond film that is oriented at the [111]-orientation angle of 35.3°, i.e., at an intrinsic angle between the [110] planes and the [111] planes of the diamond lattice, from the growth surface. Such [111] orientation is desirably 40% or higher, more desirably 50% or higher, even more desirably 55% or higher, and most desirably 60% or higher. The [111] planes of the diamond lattice are the hardest among all diamond planes. Therefore, the polycrystalline diamond film described herein can be durable for applications involving wear such as drilling, milling, machining, cutting, lacing, etc., at an angle of 35.3° from the growth surface.

Another desirable orientation is located on the cross-section of the diamond film that is oriented at the [100] orientation angle of 45°, i.e., at an intrinsic angle between the [110] planes and [100] planes of the diamond lattice, from the growth surface. Such [100] orientation is desirably 25% or higher, more desirably 30% or higher, even more desirably 35% or higher, and most desirably 40% or higher. The [100] planes of the diamond lattice are the softest planes among all diamond planes. Therefore, the polycrystalline diamond film described herein can be fabricated into different geometries for applications involving precision lapping and polishing for tool-making, at an angle of 45° from the growth surface.

Yet another desirable orientation is located on the cross-section of the diamond film, that is oriented at a combined [100]&[331]-orientation angle of 45°, i.e., at an intrinsic angle between the [110] planes and [100] planes of the diamond lattice, from the growth surface. Such combined [100]&[331] orientation is desirably 50% or higher, more desirably 60% or higher, even more desirably 70% or higher, and most desirably 80% or higher. Such combined [100]&[331] orientation can be useful for forming diamond tools for applications involving precision lapping and polishing to precise geometries.

Such desirable orientations of diamond crystallites can have less surface area among grain boundaries. Therefore, having such desirable orientations can have a higher CCD (charge-carrier-distance) for detector applications. Moreover, such desirable orientations can improve thermal conductivity due to the presence of less grain boundaries where phonons are more often scattered than transported through. In this regard, phonon transport is a key property of thermal conductance in dielectric crystals like diamond.

The highly [110]-oriented polycrystalline diamond film described herein can also contribute to a lower level of diamond film stress that is benign for high speed growth of the polycrystalline diamond film to a desirable thickness without suffering premature delamination.

Diamond crystallites of the polycrystalline diamond film described herein also comprise or exhibit a twinning mechanism in which diamond crystal twins form around the [110] axis, exhibiting a star-shaped twinning morphology on the as-grown growth surface, or forming a bicycle-wheel-shaped (almost) concentric pies on the polished growth surface. Such (almost concentric) twinned diamond crystallite grain can comprise 5 slices or more of pie-shaped arcs or sections whose tips, most of the time, nearly converge to the center of the circle. The diameter of the concentric twinned grain can be on the order of sub-microns, a few microns, and/or a few tens of microns or greater. The arc-lengths of these many pre-shaped slices of twinned grains can be on the order of sub-microns, a few microns, and/or a few tens of microns or greater. It is believed that such concentric twinning mechanism can substantially reduce the stress of the diamond film described herein, allowing the diamond film to grow at a high growth rate without suffering premature delamination, i.e., delamination before desired, e.g., before growth completion.

By way of comparison, a polycrystalline diamond film of more or less randomly oriented, or lower level [110]-oriented, diamond crystallites having no observable concentric twinning mechanism, delaminates prematurely at a growth rate as low as 3.9 microns per hour or lower. It is believed that this premature delamination may be due to misalignment of diamond crystallites of the more or less randomly oriented diamond film.

In addition, concentric twinning around the [110] axis of the [110] oriented film can reduce the diamond film stress in almost all directions, i.e., 360°, which is believed to be a reason why the bicycle-shaped concentric pies are envisioned to be like mechanical wedges that avoid a build-up of stress to a level that causes the polycrystalline diamond film to prematurely delaminate.

It is believed that the low stress of the polycrystalline diamond film described herein results from the [110] orientation and concentric twinning around the [110] axis, and allows successful growth of the polycrystalline diamond film to any desirable film thickness, including, without limitation, ≥100 microns, more desirably ≥200 microns, even more desirably ≥300 microns, and most desirably ≥400 microns.

It is believed that the low stress of the polycrystalline diamond film described herein that results from the [110] orientation and concentric twinning, also allows successful growth of diamond film on wafers, e.g., semiconductor wafers such as, without limitation, Si and SiC wafers, with minimal cracking of the diamond film. It is believed that the total crack length of such diamond film grown on a wafer can be ≤500 mm, more desirably ≤400 mm, even more desirably ≤300 mm, even further more desirably ≤200 mm, and most desirably a non-cracked wafer. Benefits of minimum cracking of the polycrystalline diamond wafers described herein include the ability to produce small pieces of diamond parts with high yield and the ability to produce parts of desirable geometric dimensions for applications in optics, thermal management, friction control, chemical inertness, and any applications that needs parts of large geometric dimensions.

It is believed that the low stress of the polycrystalline diamond film described herein that results from the [110] orientation and concentric twinning around the [110] axis, also allows successful growth of the diamond film to wafers, e.g., semiconductor wafers, of large diameters, such as, without limitation a diameter of ≥120 mm, more desirably a diameter of ≥130 mm, even more desirably a diameter of ≥140 mm, and most desirably a diameter of ≥150 mm.

It is believed that the low stress of the polycrystalline diamond film described herein results from the [110] orientation and concentric twinning around the [110] axis, along with desired crystal surface uniformity resulting from the highly [110]-orientation which facilitates desirable surface finishing on both sides of the polycrystalline diamond wafer described herein. For the nucleation side of the polycrystalline diamond wafer, the finished surface average roughness, Ra, can be less than 100 angstroms, more desirably less than 70 angstroms, even more desirably less than 50 angstroms, and most desirably less than 30 angstroms. The surface peak-to-valley value of the nucleation side can be less than 10,000 angstroms, more desirably less than 5,000 angstroms, even more desirably less 1,000 angstroms, and most desirably less than 500 angstroms. For the growth side of polycrystalline diamond wafer, the finished surface average roughness, Ra, can be less than 200 angstroms, more desirably less than 150 angstroms, even more desirably less than 125 angstroms, and most desirably less than 100 angstroms. The surface peak-to-valley value of the growth side can be less than 50,000 angstroms, more desirably less than 30,000 angstroms, even more desirably less 20,000 angstroms, and most desirably less than 15,000 angstroms.

It is believed that the concentric twinning or concentric twins of the polycrystalline diamond film described herein disrupts the plane dimensions of the different planes in the diamond lattice of the diamond grain without creating new grain boundaries. It is also believed that this results in additional benefits of the polycrystalline diamond film described herein in thermal conductance and mechanical toughness. With respect to thermal conductance, phonon transport is the main thermal conductance mechanism for diamond crystal. It is believed that phonons scatter much less on planes where concentric twins exist, as compared to phonon scattering on boundaries among different diamond grains. Therefore, it is believed that thermal conductance in the concentric twin planes occurs at a speed near to that in a non-twinned diamond grain. Thus, concentric twinning of the polycrystalline diamond crystallites allows the polycrystalline diamond film described herein to have to possess a thermal conductivity that is near to the thermal conductivity of polycrystalline diamond of large grains, which is considered by those skilled in the art to be superior over polycrystalline diamond films formed from small crystal grains.

In addition, it is believed that diamond crystal planes are disrupted by the presence of twinning, which results in smaller sections of a twinned diamond grain. Such small sections of diamond within a twinned diamond grain behave similarly to a small grain polycrystalline diamond film. Specifically, small sections of diamond within a twinned diamond grain do not chip as easy as a large grain diamond film along [111] planes. Therefore, concentric twinning of the polycrystalline diamond film described herein possess both advantages, namely, (1) higher thermal conductivity due to a low level of phonon scattering and (2) better chipping/durability performance due to disruption of the [111] planes and other diamond crystal planes.

The polycrystalline diamond film described herein can be doped with other elements such as, without limitation, boron, nitrogen, oxygen, and/or other elements. Such doping can produce a polycrystalline diamond film with different characteristics related to, without limitation, temperature, pressure, power, gas flow, gas compositions, and cooling.

The polycrystalline diamond film described herein can be cut into different geometric dimensions, optionally lapped and/or polished, for applications such as, without limitation, mechanical applications (such as, but not limited to, cutting, drilling, milling, machining, lathing, etc.), thermal management applications (such as, but not limited to, laser, electronics, optics, semiconductor, industrial, etc.), detector applications for high energy radiation particles, microwave applications, acoustic applications, frictional control applications, wear-resistant applications, chemical inertness applications, electromagnetic wave applications, etc.

The polycrystalline diamond film described herein can be produced by any one of a number of chemical vapor deposition (CVD) methods including, without limitation, microwave-plasma chemical vapor deposition, DC-Arc Jet plasma chemical vapor deposition, hot-filament chemical vapor deposition, acetylene or other hydrocarbon torch chemical vapor deposition, etc.

In an example, the polycrystalline diamond film described herein can be produced by microwave plasma chemical vapor deposition comprising a stream of a mixture of hydrogen and methane or other hydrocarbons, a microwave plasma, optionally a trace amount of nitrogen, optionally a trace amount of other dopants such as, without limitation, boron, etc., optionally a steam of oxygen containing gas such as, without limitation, oxygen, carbon monoxide, carbon dioxide, alcohols, etc., and optionally a steam of inert gas such as, without limitation, argon, helium, neon, etc. Each diamond growth can optionally start with seeding, either by a growth substrate with diamond powders, by controlling gas concentrations and temperatures, by DC-biased enhanced seeding, etc.

The polycrystalline diamond film described herein can be CVD grown at a growth rate of ≥1.5 micron per hour, more desirably ≥2.5 micron per hour, even more desirably ≥3.5 micron per hour, and most desirably ≥4.5 microns per hour.

The polycrystalline diamond film described herein can be CVD grown at a temperature of ≥800° C., more desirably ≥850° C., and even more desirably ≥900° C. The most desirable growth temperature can range from 1000° C. to as high as 1300° C. or higher. It is envisioned, however, that a person skilled in the art can grow the polycrystalline diamond film described herein at a temperature higher than 1,300° C. or lower than 800° C.

The temperature distribution of the substrate surface during the growth of the polycrystalline diamond film described herein can be even (within 1-3 degrees Celsius), or center-cold/edge-hot, or center-hot/edge-cold, or having a non-centrically symmetric temperature profile. The temperature of the polycrystalline diamond film during CVD growth can be controlled by cooling, or can be controlled by the level of power delivery, or can be controlled by the pressure inside the CVD reaction system, or can be controlled by the gas flow of the reaction gas mixture, or some combination thereof. The growth temperature can be kept constant throughout the growth run, can be changed to a lower temperature or to a higher temperature, or can be a combination of constant temperature, temperature ramping up or temperature ramping down throughout the run.

The polycrystalline diamond film described herein can be grown at any flow rate of the mixture of hydrogen and methane, desirably ≥1000 mL/min, more desirably ≥1200 mL/min, further more desirably ≥1400 mL/min, and most desirably ≥1600 mL/min. The gas flow rate can be reactor-dependent whereupon a person skilled in the art can run at a flow rate ≥4,000 mL/min or ≤1000 mL/min. The gas delivery system can be simple or can be sophisticated, and can include one or more than one inlet. Exhausted gas can leave the reaction system in one or more than one outlet.

Chemical vapor deposition of diamond is typically carried out under vacuum, ranging from as low as sub-torrs to a pressure as high as one atmosphere.

The polycrystalline diamond film described herein can be grown at any concentration of carbon-containing compound such as, but not limited to, methane, desirably ≥0.5%, more desirably ≥0.7%, further more desirably ≥1.0%, even further more desirably ≥1.5%, and most desirably ≥2%. It is envisioned that a person skilled in the art can run at a concentration of carbon-containing compound ≥5% or ≤0.5%.

The following examples of the polycrystalline diamond film disclosed herein and comparative examples are for the purpose of illustration and not of limitation. Some examples of the polycrystalline diamond film disclosed herein and comparative examples are summarized in the following Table 1.

XRD crystal texture (sometimes called "preferred orientation") was measured using a Siemens model D5000 2-circle X-Ray Diffractometer. Portions of the as-grown polycrystalline diamond wafers, nominally 25 mm in diameter, were placed in a sample holder goniometer of the X-Ray Diffractometer at a calibrated height position. The sample holder goniometer was also rotated continuously during measurement to increase the number of crystals which can provide a diffracted beam into the detector. The

TABLE 1

| Examples | Example 1 | Example 2 | Example 3 | Example 4 | Example 5 | Example 6 | Example 7 |
|---|---|---|---|---|---|---|---|
| Disclosed Herein or Comparative | Disclosed | Comparative | Comparative | Comparative | Disclosed | Disclosed | Disclosed |
| Substrate diameter, mm | 160 | 160 | 160 | 160 | 160 | 160 | 160 |
| Methane Concentration, % | 3% | 0.60% | 2% | 3% | 3% | 3% | 3% |
| Temperature, ° C. | 1117 | 840 | 820-1020 | 1020-1060 | 1120 | 1120 | 1180 |
| Main $H_2$ Flow Rate, mL/min | 2400 | 2900 | 2600 | 2400 | 2400 | 2400 | 2400 |
| Methane Flow Rate, mL/min | 72 | 17.4 | 52 | 72 | 72 | 72 | 72 |
| Orientation | [110] | [100] | no | no | [110] | [110] | [110] |
| Twinning | Yes | no | no | no | Yes | Yes | Yes |

Method of Characterization

Images of Scanning Electron Microscopy (SEM) were collected on a Vega scanning electron microscope (SEM) equipped with an energy dispersive analysis X-Ray (EDAX) detector. The Vega SEM is available in the US from Tescan USA, Inc. of Warrendale, Pa. 15086.

Raman spectra were collected by an inVia confocal Raman Microscope available in the US from Renishaw Inc. of Hoffman Estates, Ill. 60192. Laser Raman spectroscopy is widely used as a standard for the characterization of single crystal diamond or polycrystalline diamond. It provides readily distinguishable signatures of each of the different forms (allotropes) of carbon (e.g., diamond, graphite, buckyballs, etc.). Combined with photoluminescence (PL) technology, laser Raman spectroscopy offers a non-destructive way to study various properties of diamond including phase purity, crystal size and orientation, defect level and structure, impurity type and concentration, and stress and strain of diamond crystallites and films. In particular, the width (full-width-half-maximum, FWHM) of the first order diamond Raman peak at 1332 $cm^{-1}$, as well as the Raman intensity ratio between diamond peak and graphitic peaks (D-band at 1350 $cm^{-1}$ and G-band at 1600 $cm^{-1}$), is a direct indicator of diamond quality. Furthermore, the stress and strain levels in diamond grains and films can be estimated from diamond Raman peak shift. It has been reported that diamond Raman peak shift rate under hydrostatic stress is about 3.2 $cm^{-1}$/GPa, with the peak shifting to lower wavenumber under tensile stress and higher wavenumber under compressive stress. The Raman spectra presented herein were collected using a Raman spectroscope with 514 nm excitation laser. More information regarding using Raman spectroscopy to characterize diamond is also available in the references (1) A. M. Zaitsev, *Optical Properties of Diamond*, 2001, Springer and (2) S. Prawer, R. J. Nemanich, *Phil. Trans. R. Soc. Lond.* A (2004) 362, 2537-2565.

Surface roughness (Ra) and Peak-to-Valley (PV) of the surface of a piece of polished diamond were measured with a NewView™ 600 Interferometer with a 20× Object available in the US from Zygo Corp. of Middlefield, Conn. 06455. The measured area was 200 microns by 350 microns.

Method of X-Ray Diffraction XRD Texture Measurement detector includes a photomultiplier tube and associated electronics that integrates the total number of detected X-ray photons reaching the detector at each discrete angle ("angular step increment"). In general, each sample was stepped in 0.02 degree ("2-theta") increments, scanned from a 2-theta of 20 degrees to a 2-theta of 144 degrees. For each angular measurement position, the theta angle represents the angle between the incident X-ray beam and the surface of the sample; The 2-theta angle is twice the theta angle and represents the total angle between the incident X-ray beam and the diffracted (also called "reflected") X-ray beam. For each angular measurement (incremental step change) both the goniometer tilt angle and the angle of the detector were incremented, with the angular adjustment of the detector being twice that of the sample goniometer.

In general, strong X-ray peak intensities are observed whenever one or more crystals in the sample satisfy the diffraction conditions. Large diffraction intensities are commonly observed from low index atomic (i.e., atomically dense) planes within the crystal when the angle between the incident X-ray beam and the detector position satisfy the Bragg condition ($n\lambda=2d \sin \theta$), where n is an integer, $\lambda$ is the wavelength of the incident X-rays, d is the inter-planar spacing of the parallel atomic planes which give rise to the observed diffracted beam, and $\theta$ or "theta" is the angle between the incident X-rays and the surface of the diamond sample. XRD measurements were performed used copper K-alpha X-rays having a wavelength of 0.154056 nanometers, although other X-ray wavelengths can be used.

In general, five low index atomic planes on the diamond crystal lattice give rise to large diffraction intensities. For a randomly oriented diamond powder, the planar indices, 2-theta angles, d-spacings, and expected ("random") intensities of the diffraction beam are shown in the following Table 2.

TABLE 2

Observed relative intensity of diffracted X-ray beams for a random assembly of diamond crystals.

| h, k, l planar indices | 2θ angle (degree) | d-spacing (Angstroms) | Relative Diffracted Intensity |
|---|---|---|---|
| 111 | 43.9 | 2.06 | 100 |
| 220 | 75.3 | 1.261 | 25 |
| 311 | 91.5 | 1.0754 | 16 |
| 400 | 119.5 | 0.8916 | 8 |
| 331 | 140.3 | 0.8182 | 16 |

The measured X-ray spectrum collected for the diamond sample is compared to the spectrum observed from a randomly oriented diamond powder sample. Specifically, the area under each observed 2-theta peak position (43.9 degrees, 75.3 degrees, etc.) is calculated. This value represents the observed intensity for the five measureable crystal orientations, namely the [111], [220], [311], [400], and [331] orientations. Herein, the [220] orientation is used interchangeably with the [110] orientation; and the [400] orientation is used interchangeable with [100] orientation.

Each measured peak area is then normalized by dividing by the Relative Diffracted Intensity measured from a randomly oriented powder. Finally these normalized values are renormalized again to express the total of the five observable peak intensities, a total of 100%. These final values (summing to 100%) are expressed graphically in the figures. A value exceeding 20% for any of the five angles represents a higher (non-random) orientation present for that angle, with the actual value expressed (as a percentage) corresponding to the fraction of crystals in the sample having the corresponding orientation.

Method of Determining Diamond Crystal Twinning for a Polycrystalline Diamond Film.

Disclosed herein is a method of determining the degree of crystal twinning of a polycrystalline diamond film. It is believed that the polycrystalline diamond film disclosed herein is highly twinned. In Example 1 described hereinafter, real boundaries among diamond grains are etched away faster by hydrogen microwave plasma than the intersections of twinned diamond grains. However, this is not to be construed in a limiting sense. Rather, the method disclosed herein is a method for quantifying the uniqueness in diamond crystal morphology and characteristics of the polycrystalline diamond film disclosed herein.

Twinning in crystals is very sophisticated (see Professor Stephen A. Nelson at Tulane University, "Twinning, Polymorphism, Polytypism, Pseudomorphism", updated on Sep. 16, 2013, http://www.tulane.edu/~sanelson/eens211/twinning.htm).

Next described are two different methods that can be used for determining the percentage of diamond crystal twinning for a polycrystalline diamond film. Method 1 is based on a SEM image of an as-grown surface of the polycrystalline diamond film, i.e., a 3D-based topography image, and Method 2 is based on an SEM image of a polished and etched growth surface of the polycrystalline diamond film, i.e., a more or less 2D-based topography image. Method 2 can give more precise and consistent results than Method 1.

Method 1, Semi-Quantitative Method of Determining the Percentage of Diamond Crystal Twinning from an SEM Image of an as-Grown Surface of a Polycrystalline Diamond Film Grown in the Manner Described Herein.

A piece of polycrystalline diamond was cut or broken into a suitable size (any geometric size) that fits within the chamber of the scanning electron microscope (SEM). The surface topography of the growth surface of the polycrystalline diamond was then studied by the SEM. The obtained SEM image was traced (albeit manually (by hand) or graphically, e.g., AutoCAD software) with thick (or thicker) lines for the boundaries among the diamond crystal grains and with a thin (or thinner) lines for twinning intersections of twinned diamond grains for information regarding the linear lengths of these line segments. Then, the total length for the grain boundary line segments (thick lines) is tallied, designated as $L_{Grain\_Boundary\_1}$; and the total length for the twinning intersection line segments (thin lines) is tallied, designated as $L_{Twinning\_Intersection\_1}$. The percentage of the twinning is then calculated via the following formula:

Twinning % (Method 1)=$L_{Twinning\_Intersection\_1}$/
($L_{Grain\_Boundary\_1}$+$L_{Twinning\_Intersection\_1}$)×100%

Method 2, Semi-Quantitative Method of Determining the Percentage of Diamond Crystal Twinning from an SEM Image of a Polished and Hydrogen-Plasma-Etched Growth Surface of a Polycrystalline Diamond Film Grown in the Manner Described Herein.

A piece of polycrystalline diamond grown in the manner described herein was cut into a suitable size (any geometric sizes), in this example, 1 inch in diameter. The surface topography of the growth surface of this diamond piece was then lapped with diamond-powder slurry. The lapped surface was then polished to a smooth surface. Then, the polished surface of this piece of polycrystalline diamond was etched with hydrogen microwave plasma for one hour. Hydrogen microwave plasma etches the boundaries among diamond crystal grains and the intersections of a twinned diamond grain. The topography of the polished and etched surface of this polycrystalline diamond piece was then studied by SEM. The obtained SEM image was then imported into AutoCAD software to sketch out the boundaries among the diamond crystal grains with a thick (or thicker) lines and the twinning intersections with a thin (or thinner) lines to obtain the information of linear lengths of these line segments. Then, the total length of the grain boundary line segments is tallied, designated as $L_{Grain\_Boundary\_2}$; and the total length of the twinning intersection line segments is tallied, designated as $L_{Twinning\_Intersection\_2}$. The percentage of the twinning is then calculated via the following formula:

Twinning % (Method 2)=$L_{Twinning\_Intersection\_2}$/
($L_{Grain\_Boundary\_2}$+$L_{Twinning\_Intersection\_2}$)×100%

Method of Chemical Vapor Deposition of Diamond by Microwave Plasma.

Chemical vapor deposition of diamond enhanced by microwave plasma is well known in the art. FIG. 1 shows a schematic diagram of an example microwave plasma CVD system 2 that can be used to grow polycrystalline diamonds 4 in the manner described herein. In use of the CVD system 2 shown in FIG. 1, a mixture of reactive gases 6 comprising hydrogen and methane was flowed into a microwave plasma CVD reactor 16 and the flow rates of the hydrogen and the methane was controlled by a mass flow controller 8. The exhausted gas 10 flows out CVD reactor 16, typically to a vacuum pump 12. The microwave is typically generated by a magnetron 14 and guided to CVD reactor 16 through a quartz window 18. Inside the reactor, the microwave energy is converted into a plasma 20 which radicalizes the hydrogen molecules of gases 6 into hydrogen free radicals, as well as methane molecules of gases 6 into methyl free radicals, methylene free radicals, methyne free radicals, and the secondary or tertiary free radicals that contain two or more carbons. At the bottom of CVD reactor 16, there sits a substrate holder or support that supports a substrate 24 upon which polycrystalline diamond film 4 grows. A substrate of silicon, titanium, niobium, molybdenum, tungsten, tantalum, or any suitable carbide formers sits on the substrate holder.

While plasma 20 is on, the radicalized free radicals that contain carbon bombard the surface of substrate 24, which leads to carbon fixation by a mechanism called "hit and stick". Then, the hydrogen free radicals bombard the fixed surface carbon species that still contain hydrogen atoms, and abstract the hydrogen atom(s) off such fixed carbon species, resulting in the formation of surface carbon free radicals for forming C—C bonds containing less number of hydrogen atoms until all hydrogen atoms are abstracted. Some pure carbon to carbon bonding can be $sp^3$ in nature, which is desirable for a diamond lattice. Some pure carbon to carbon bonding can be $sp^2$ in nature, which is undesirable since it is graphitic in nature. However, hydrogen free radicals are able to strip $sp^2$ carbon off the graphitic species faster than strip $sp^3$ carbon off the diamond lattice.

It is well known in the art that the concentrations of hydrogen and methane in the gas mixture are critical parameters for diamond growth, in addition to the growth temperature, if the plasma 20 size is tuned into a size that is large enough to cover the surface of substrate 24; the microwave power and pressure are highly substrate-size-dependent. A person skilled in the art should be able to follow this disclosed procedure and instructions to tune his or her plasma to a proper size that is large enough to cover substrates of different sizes for the purposes of seeding, deposition and growth of quality diamond.

Example 1

Successful High Speed Growth of Highly Twinned, [110] Oriented Polycrystalline Diamond Film at Temperatures of 1107° C. and 1117° C. for 188 Hours with 3% Methane A piece of metallic tungsten of 160 mm in diameter was used as the substrate 24 in microwave plasma CVD reactor system 2 (FIG. 1). A gas mixture 6 of 2500 mL/min hydrogen and 75 mL/min methane was flowed into the microwave plasma CVD reactor 16. After plasma 20 ignition, the microwave power and the reactor pressure were tuned so that the plasma size covered the entire surface of the metallic tungsten substrate 24. After one hour and 12 minutes of chemical vapor deposition of diamond, hydrogen flow was reduced to 2400 mL/min and methane flow was reduced to 72 mL/min. The diamond growth temperature at the center of the substrate was controlled by cooling substrate 24, e.g., via a thermal-electric cooler in contact with substrate 24 or by a fluid cooling substrate 24. A control pyrometer 26 was used to monitor the temperature of the diamond growing at the center of substrate 24 during diamond deposition. The diamond growth temperature at the center of substrate 24 was measured at 1117° C. at 67.6 hours and at 1107.7° C. at 171 hours via a separate measuring pyrometer. After 187.6 hours of diamond growth, the reaction was stopped, the grown diamond 4 and substrate 24 were removed from the microwave plasma CVD reactor 16, and the grown diamond 4 was separated from the metallic tungsten substrate 24 whereupon a free standing polycrystalline diamond wafer 4 was produced, namely, wafer 02A152.

Figure 2:
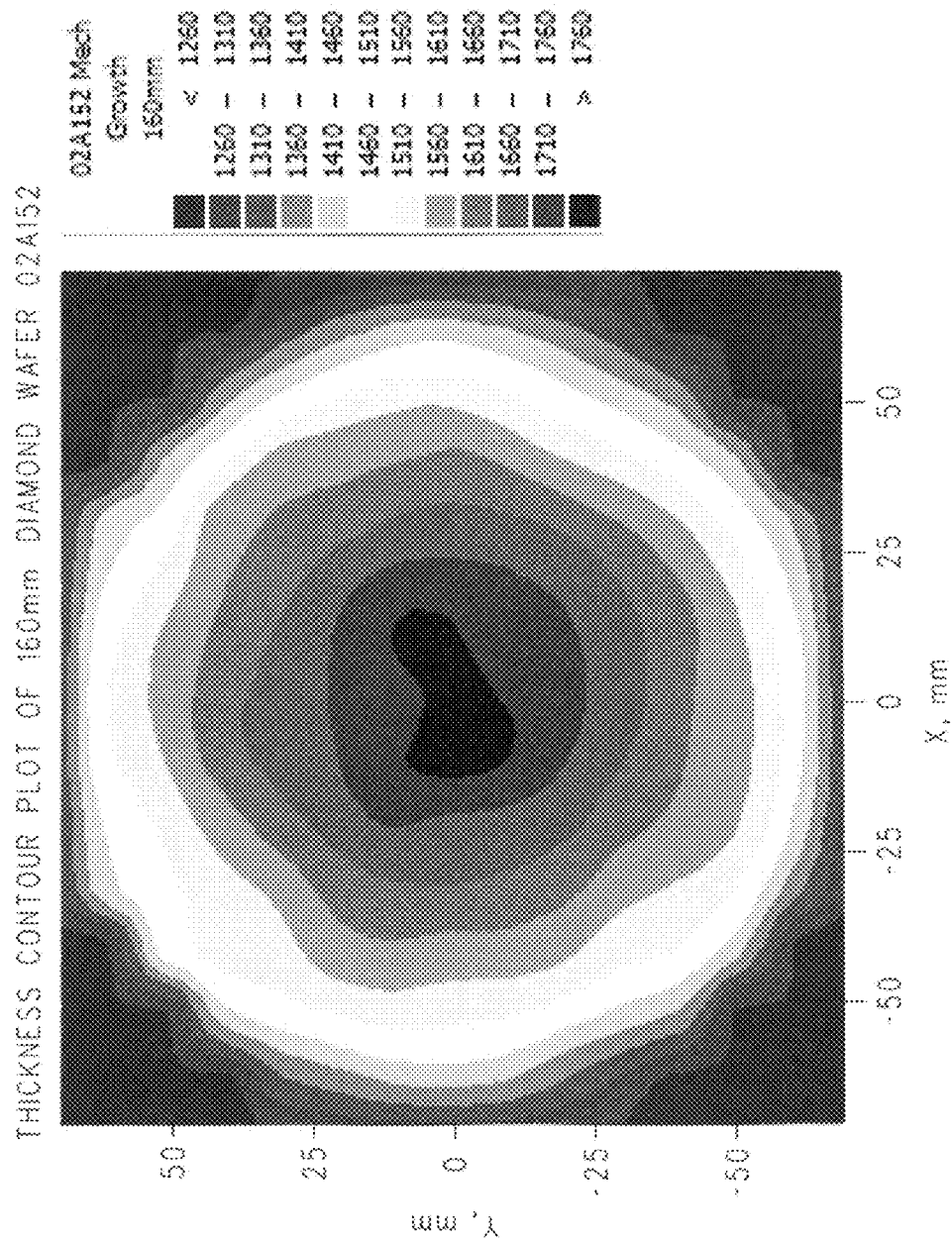
FIG. 2 is a thickness contour plot of a 160 mm diamond wafer successfully grown in accordance with the principles described herein.

As shown in FIG. 2, the center of wafer 02A152 is the thickest, namely, 1,773 microns, and the edge of this wafer is the thinnest, namely, 1,258 microns. The thickness varies from center to edge uniformly along a radial direction. Based on a growth time of 187.6 hours, the thickness of wafer 02A152 can be translated into diamond growth rates ranging from a minimal diamond growth rate of 6.69 μm/hr to a maximum diamond growth rate of 9.43 μm/hr, with an average diamond growth rate of 8.29 μm/hr.

Figure 3B:
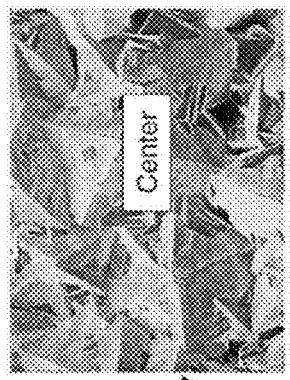
FIGS. 3B-3D are magnified views of the center, middle, and edge of the diamond wafer shown in FIG. 3A.
Figure 3C:
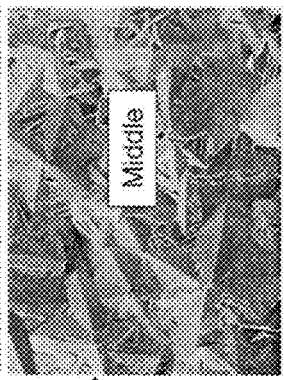
Figure 3D:
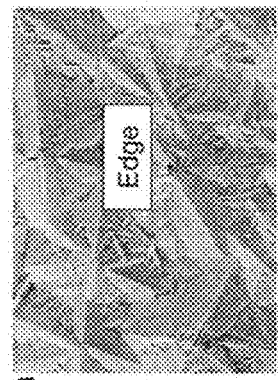
Figure 3A:
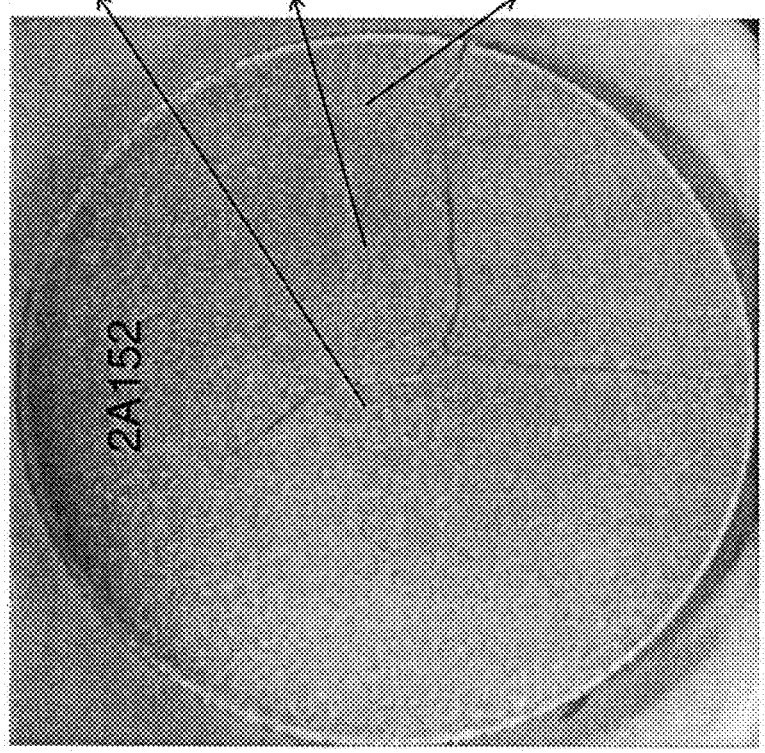
FIG. 3A is an optical image of the diamond wafer used to form the thickness contour plot of FIG. 2.

The appearance of polycrystalline diamond wafer 02A152 was observed to be uniform across the wafer, as shown in the optical images in FIGS. 3A-D. FIG. 3A shows that polycrystalline diamond wafer 02A152 cracked into three pieces during the diamond-substrate separation process. The SEM images in FIGS. 3B-3D show that wafer 02A152 is uniform radially across the wafer with respect to its crystal morphology from the center, to the middle (one-half the radius of the wafer), and to the edge. As can be seen in the as-grown growth surface of FIGS. 3B-3D, diamond crystallites of wafer 02A152 appear highly twinned, typical star-shaped grains.

Figure 4:
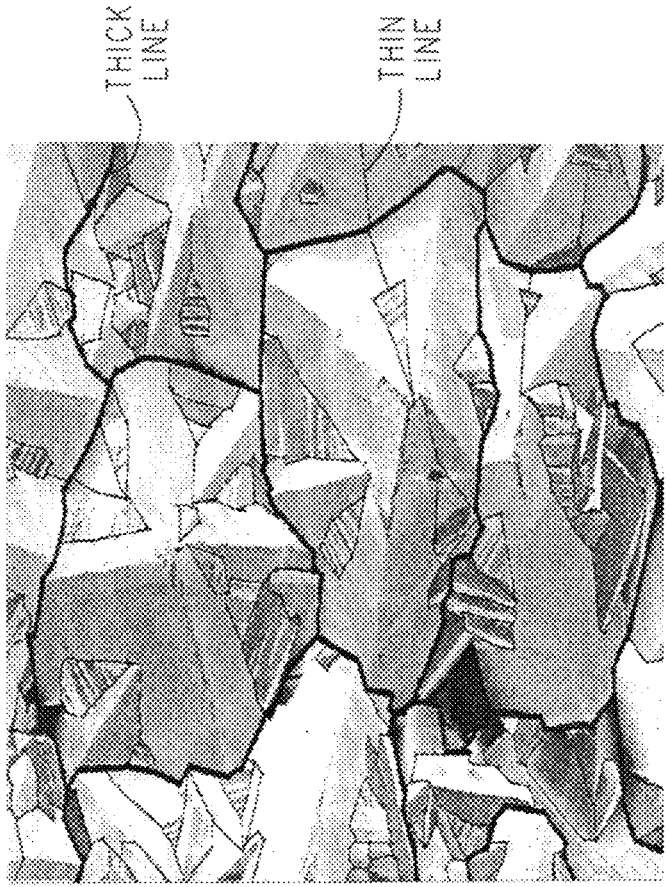
FIG. 4 is a scanning electron microscope (SEM) image of the center of the diamond wafer shown in FIG. 3A including thick lines at the boundaries among grains and thin lines at twinning intersections.

With reference to FIG. 4, the level of twinning for wafer 02A152 was then determined by Method 1 (described above), by measuring the total length of the boundaries among diamond crystal grains (thick lines) and the total length of the twinning intersections inside a diamond mother grain (thin lines) in the SEM image of the center of wafer 02A152. The total length of the twinning intersections (thin lines) in the diamond mother grain was found to be 2,700 mm and the total length for the boundaries between the diamond mother grains (thick lines) was measured to be 1,290 mm. Thus, the percentage of twinning (method 1) for wafer 02A152 was calculated to be 67.7% by division of 2,700 by a sum of 2,700 and 1,290.

Figure 5:
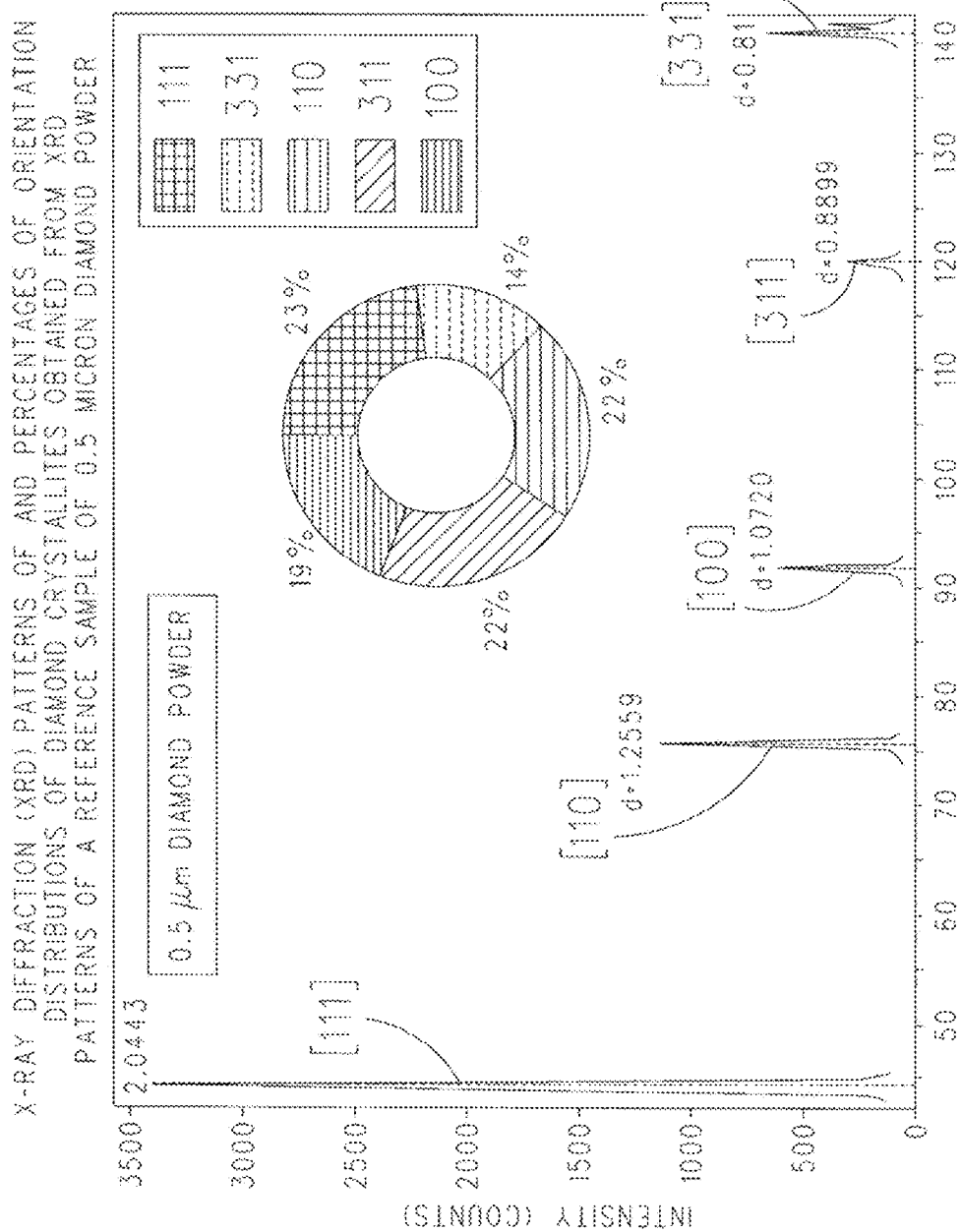
FIG. 5 shows X-ray diffraction (XRD) patterns and a ring representing percentages of orientations of diamond crystallites obtained from the XRD patterns of a reference sample of 0.5 micron diamond powder.

With reference to FIG. 5, in order to quantify the diamond crystal orientation in wafer 02A152, an experimental X-ray diffraction (XRD) was performed on a reference sample of diamond powder with average nominal particle size of 0.5 micron. The XRD patterns obtained from this reference sample, shown in FIG. 5, demonstrate that the diamond powder of 0.5 micron particle size are randomly oriented with 23% along the [111] direction, 14% along the [331] direction, 22% along the [110] direction, 22% along the [100] direction, and 19% along the [311] direction. This experiment confirms that the XRD instrument that was used to determine the crystal orientation of the diamond crystallites of the polycrystalline diamond films or wafers disclosed herein was properly set up for this purpose.

Figure 6:
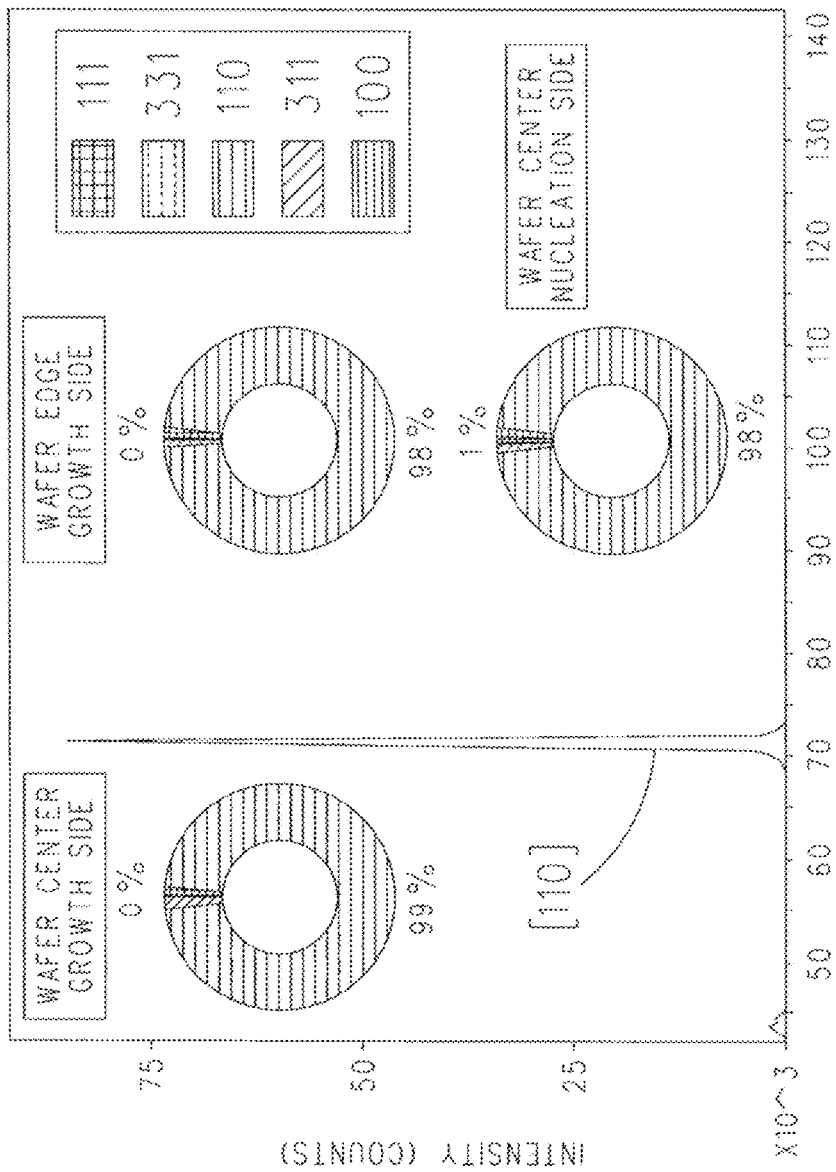
FIG. 6 shows XRD patterns and rings representing percentages of orientations of diamond crystallites obtained from the XRD patterns of the diamond wafer of FIG. 3A at the center of the growth side, at an edge of the growth side, and at the center of the nucleation side.

With reference to FIG. 6, XRD patterns of wafer 02A152 determined that diamond crystallites on the growth side at the center of wafer 02A152 are 99% oriented to the [110] direction of the diamond lattice. Diamond crystallites on the growth side at the edge are 98% oriented to the [110] direction of the diamond lattice. Surprisingly, diamond crystallites on the nucleation side at the center of this wafer are 98% oriented to the [110] direction of the diamond lattice; which is in contrast to diamond crystallites on the nucleation side of prior art CVD grown diamond wafers which are often randomly oriented. The XRD results in FIG. 6 along with SEM results in FIG. 3 demonstrate that polycrystalline diamond wafer 02A152 is unique, is highly oriented to the [110] direction of the diamond lattice, and is highly twinned into star-shaped grains (when viewed normal to the growth surface).

Figure 7:
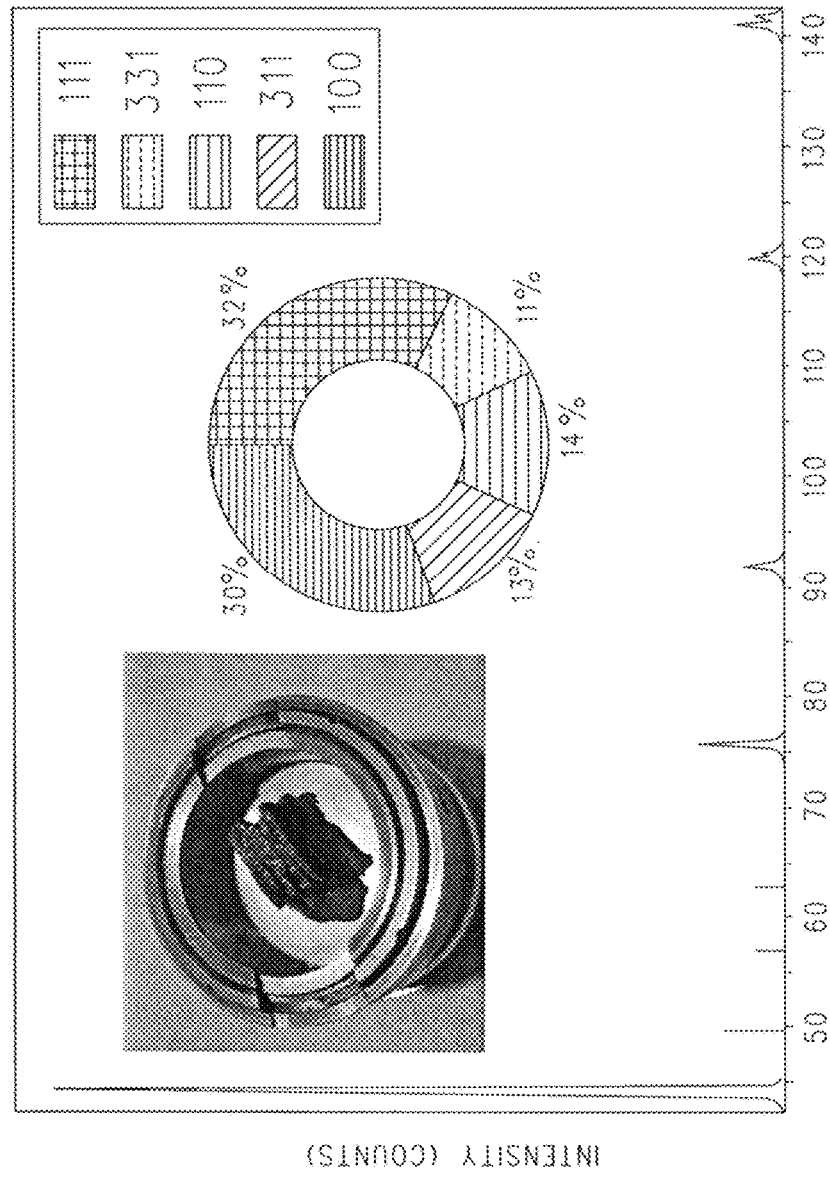
FIG. 7 shows an optical image, XRD patterns, and a ring representing percentages of orientations of diamond crystallites obtained from the XRD patterns of the center cross-section of the diamond wafer of FIG. 3A tilted 90° with respect to the diamond growth surface.

With reference to FIG. 7, XRD patterns of diamond crystallites from cross-sections at center of wafer 02A152 were determined to be randomly oriented, as shown by the ring representing the percentage of orientations of diamond crystallites obtained from the XRD patterns in FIG. 7. At an angle of 90° from the planes of growth and nucleation surfaces, (i.e., the cross-sections shown in the picture in FIG. 7) 32% of the diamond crystallites were determined to be oriented along the [111] direction, 11% along the [331] direction, 14% along the [110] direction, 13% along the [311] direction, and 30% along the [100] direction.

In a single crystal diamond lattice, there exists intrinsic angles between different refractive planes. Such intrinsic angles are shown in the following Table 3.

TABLE 3

|  | [111] | [110] | [311] | [100] | [331] |
|---|---|---|---|---|---|
| [111] |  | 35.3 | 29.5 | 54.7 | 22.0 |
| [110] | 35.3 |  | 31.4 | 45.0 | 13.3 |
| [311] | 29.5 | 31.4 |  | 25.2 | 25.9 |
| [100] | 54.7 | 45.0 | 25.2 |  | 46.5 |
| [331] | 22.0 | 13.3 | 25.9 | 46.5 |  |

The angle between the [110] planes and [111] planes is 35.3°. The angle between the [110] planes and [311] planes is 31.4°, very close to the angle of 35.3° between the [110] planes and [111] planes. The angle between the [110] planes and [100] planes is 45°. Finally, the angle between the [110] planes and [331] planes is 13.3°.

Figure 8:
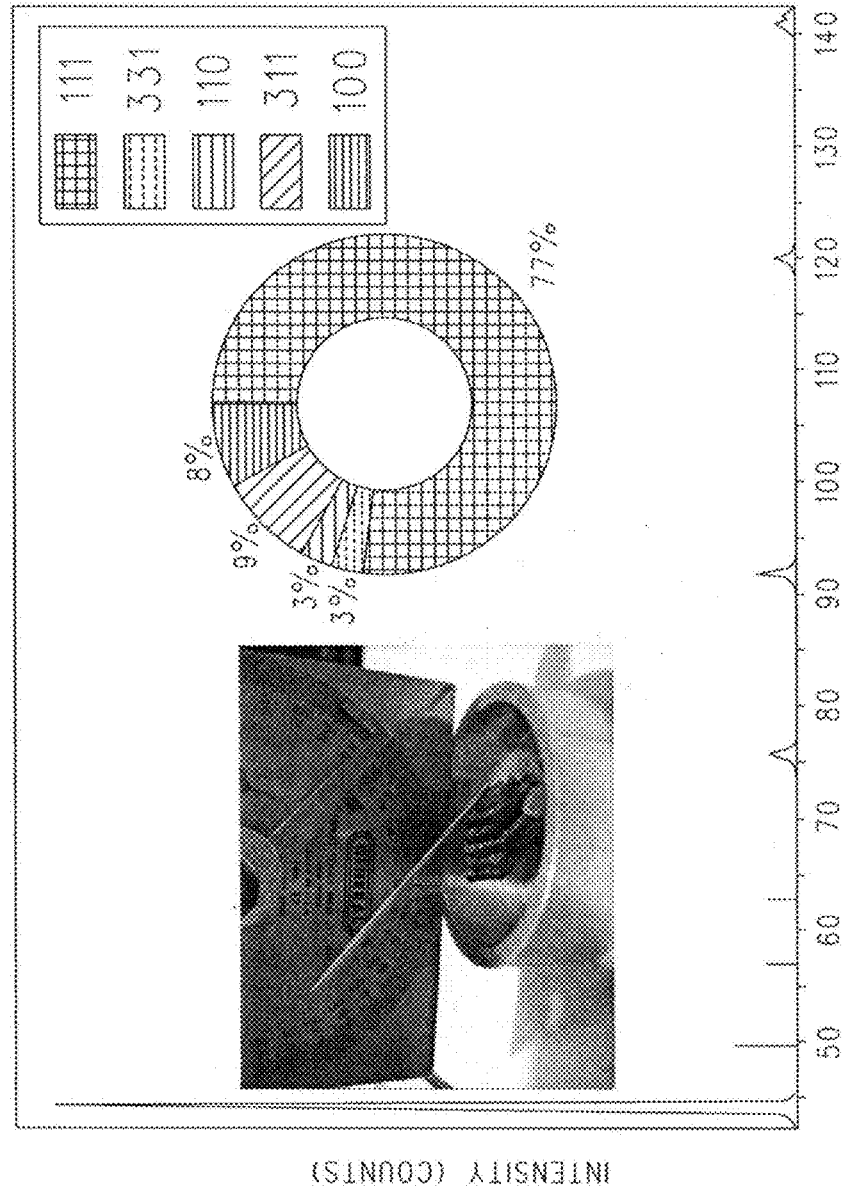
FIG. 8 shows an optical image, XRD patterns and a ring representing percentages of orientations of diamond crystallites obtained from the center cross-section of the diamond wafer of FIG. 3A tiled 35° with respect to the diamond growth surface.

With reference to FIG. 8, XRD patterns of cross-sections of wafer 02A152 oriented at an angle of 35° with respect to the diamond growth surface (an intrinsic angle between the [110] planes and the [111] planes) determined that 77% of the diamond crystallites were oriented to the [111] direction of the diamond crystal lattice, while both diamond crystallites oriented to the [331] and the [110] directions accounted for 3% each, and diamond crystallites oriented to [311] and [100] directions accounted for another 9% and 8%, respectively.

As discussed above, [111] surfaces of diamond crystals are the hardest, therefore the [111] planes are the most wear-resistant ones for working surfaces for mechanical applications. Thus, the polycrystalline diamond film described in this Example 1 allows tools to be designed in a way that the working surfaces use the cross-section surfaces that are 35° from the diamond growth surface, i.e., the hardest surface of the polycrystalline diamond film. Thus, the polycrystalline diamond film described in this Example 1 enables durable tools, with respect to wear performance, to be made. In addition, utilizing the hardest surfaces of the polycrystalline diamond is expected to lead to a lower frequency in changing tool. Utilizing the hard surfaces of the polycrystalline diamond also enables tools to perform jobs more precisely. Finally, utilizing the hard surfaces of the polycrystalline diamond film of Example 1 enables tools to perform some jobs that can be too difficult to perform with a piece of conventionally randomly-oriented polycrystalline diamond.

Figure 9:
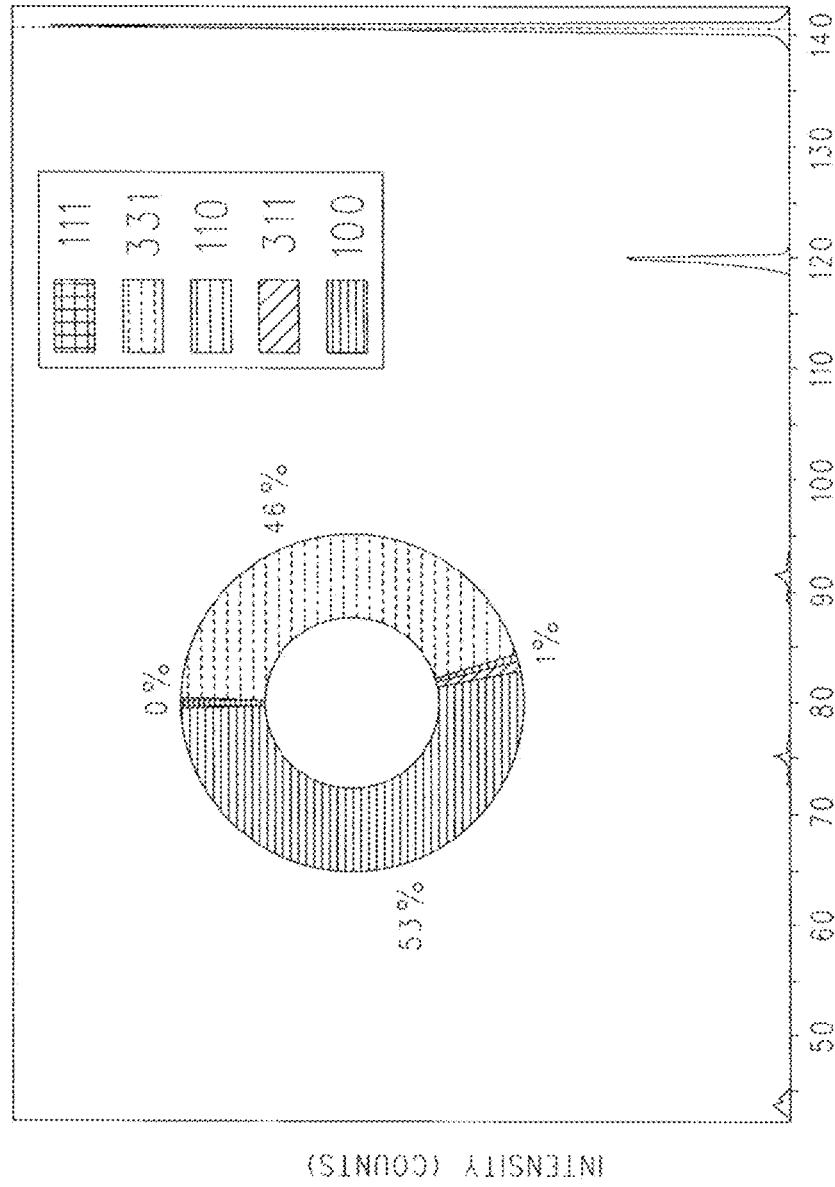
FIG. 9 shows XRD patterns and a ring representing percentages of orientations of diamond crystallites obtained from the center cross-section of the diamond wafer of FIG. 3A tiled 45° with respect to the diamond growth surface.

FIG. 9 shows XRD patterns of the center cross-section of wafer 02A152 tilted 45° from the plane of the growth surface, i.e., an intrinsic angle between the [110] planes and [100] planes. As can be seen, 53% of diamond crystallites are oriented to the [100] planes, while another 46% of the diamond crystallites are oriented along the [331] planes or direction. The remaining directions of diamond crystallites account for 1%.

As discussed above, the softest faces of a diamond lattice are the [100] planes. In many cases, a working edge surface of a piece diamond is produced by laser-cutting the diamond piece from a polycrystalline diamond wafer, followed by lapping the diamond piece to a desired geometric surface, and, optionally, polishing to a desired surface roughness, a desired edge sharpness, etc. Lapping and polishing a [100]-dominated surface is the easiest. Therefore, the polycrystalline diamond film described in this Example 1 has advantages in not only having a durability-preferred working angle (~35° from the diamond growth surface, as discussed above), but also having a fabrication-preferred edge-making angle (45° from the growth surface).

Figure 10:
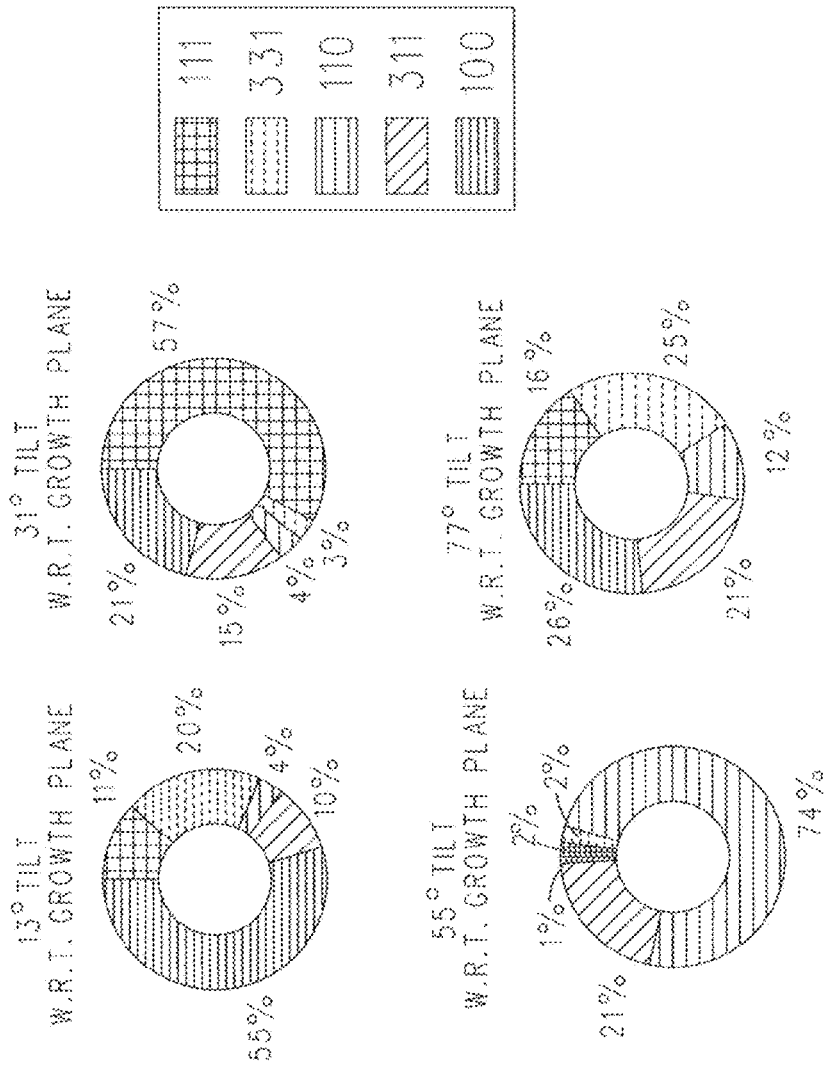
FIG. 10 shows rings representing percentages of orientations of diamond crystallites obtained from XRD patterns of the center cross-section of the diamond wafer of FIG. 3A tiled at 13°, 31°, 55°, and 77° with respect to the diamond growth surface.

With reference to FIG. 10, XRD patterns of the center section of wafer 02A152 at the various tilt angles shown in FIG. 10 show that diamond crystallites at a tilt angle of 13° (upper left ring in FIG. 10) from the diamond growth surface (which is an intrinsic angle between the [110] planes and [331] planes) only have 20% [331]-orientation, while 55% of the diamond crystallites are [100]-oriented. It is believed that there is a co-existence of [100] and [331] planes at the intrinsic angle of 45° and 13° from the growth surface (the [110]-orientation). It is to be appreciated that the intrinsic angle between the [100] planes and [331] planes is 46.5°. It is believed that diamond crystallites that are highly oriented to the [110] direction might have been twinned whereupon some of the [100] planes and [331] planes are rotated by 46.5°. If so, it may be possible to observe [100] planes and [331] planes at an intrinsic angle of 45° or 13° at the same time. Nevertheless, as discussed previously, an angle of 13° from diamond growth surface can also be used as a fabrication-preferred sharp-edge-making angle since it shows that 55% diamond crystallites are oriented to the [100] direction or plane.

A tilt angle of 31° (upper right ring in FIG. 10) from the diamond growth surface is an intrinsic angle between the [110] planes and [311] planes. However, at this intrinsic angle) (31°, 15% of the diamond crystallites are oriented in the [311] direction or plane, and 57% of the diamond crystallites are oriented to the [111] direction or plane, while the [331], [110], and [100]-oriented diamond crystallites account for 3%, 4%, and 21%, respectively. These results further confirm that the polycrystalline diamond film described herein can be formed with a durability-preferred working angle, around 35° from the diamond growth surface.

At a random angle of 55° (lower left ring in FIG. 10) from the diamond growth surface, the polycrystalline diamond described herein has 74% of its crystals orientated to the direction or plane, while the [111], [331], [311], and [100]-oriented diamond crystallites only account for 26%.

At another random angle of 77° (lower right ring in FIG. 10) from the diamond growth surface, the polycrystalline diamond described herein has near-random diamond crystal orientations, namely, 16% for the [111]-oriented, 25% for the [331]-oriented, 12% for the [110]-oriented, 21% for the [311]-oriented, and 26% for the [100]-oriented.

With reference to FIG. 11A the growth surface of a one-inch (25.4 mm) piece of diamond laser-cut from wafer 02A152 was lapped and polished. The surface SEM morphology of this polished piece is shown in FIG. 11A. As can be seen in FIG. 11A, diamond crystal twins are formed around the [110] axis, resulting in the illustrated bicycle-wheel shape, or concentric, morphology. Such concentric twinning creates pie-shape or wedge shape crystal sections as shown in FIG. 11A.

With reference to FIG. 11B and with continuing reference to FIG. 11A, in order to confirm the twinned diamond crystal grains in wafer 02A152, the polished growth surface shown in FIG. 11A was further etched in hydrogen microwave plasma for one hour. It is to be appreciated that hydrogen free radicals in a hydrogen microwave plasma etch carbon atoms away from the polycrystalline diamond surface. It is also to be appreciated that these hydrogen free radicals of the hydrogen microwave plasma etch carbon atoms off the boundaries of diamond crystals and twinning intersections within an diamond mother grain faster than carbon atoms off the regular diamond surface planes (mainly the [110] planes, in this example). The SEM image of the polished and etched surface shown in FIG. 11B clearly shows that, within a diamond grain, there can be as many as 16-20 pieces of wedge-shaped or pie-shaped twinned crystal sections that have different SEM brightness in almost alternative patterns, with each section having a radius that ranges from a few microns to as large as 150 microns or greater. The tips of the wedges or pies tend to converge at the center of the "bicycle wheel" in the polished surface (FIG. 11A) or polygons of the polished and etched surface (FIG. 11B). The polygon side length of these wedges can be a few microns to a few tens of microns or greater. Such nearly concentric twinning is believed to be unique and possibly results in a substantial reduction in the stress of the polycrystalline diamond film during growth along radial directions (360°) of these 'bicycle-wheels' or polygons. Without such concentric twinning and/or the [110]-preferred orientation, successful growth of a polycrystalline diamond film, optionally with a large diameter, to a desirable thickness without premature-delamination was not attainable, as will be discussed in Comparative Examples 3 and 4 discussed hereinafter.

Figure 11C:
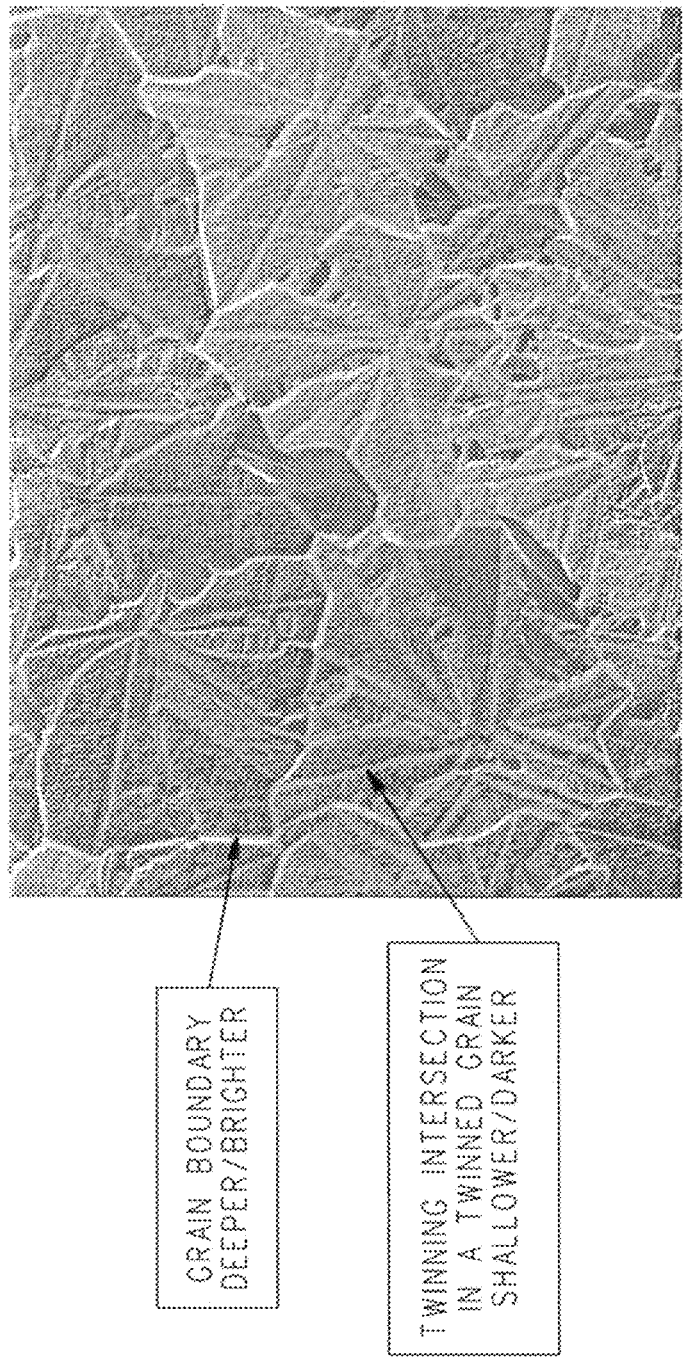
FIG. 11C is an SEM image of the growth side of the diamond wafer of FIG. 3A showing the boundaries between grains as deeper/brighter lines and showing twinning intersections as shallower/darker lines.

With reference to FIG. 11C and with continuing reference to FIGS. 11A and 11B, to further illustrate the difference between boundaries among inter-crystal grains and twinning intersections, the polished-growth-surface of the 1-inch piece of wafer 02A152 (FIG. 11B) was etched a second time with hydrogen microwave plasma. Both the boundaries among diamond inter-crystal grains and the twinning intersections were enhanced by this second hydrogen microwave plasma etching, as shown in FIG. 11C. As can be seen, the boundaries among the mother diamond grains are etched more severely (deeper) than the twinning intersections, evidenced by the boundaries among the diamond crystal grains appearing brighter and deeper than the twinning intersections which appear darker and shallower.

Figure 11D:
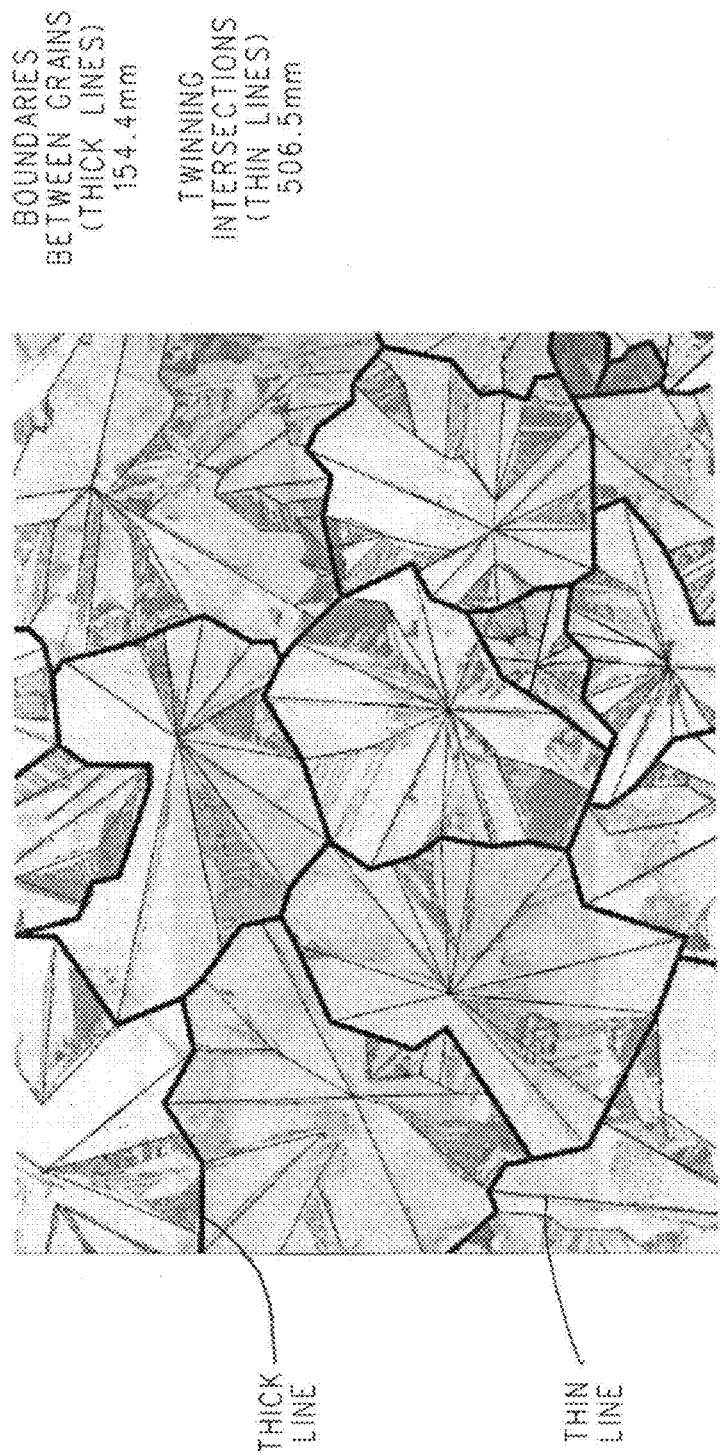
FIG. 11D is an SEM image of the growth side of the diamond wafer of FIG. 3A including thick lines between grain boundaries and thin lines between twinning intersections.

To quantify the degree of twinning, the SEM image of FIG. 11B was imported into AutoCAD software where the boundaries among diamond crystal grains were traced with thick line segments and the boundaries among twinning intersections inside diamond grains were traced with thinner line segments. The results of this tracing is shown in FIG. 11D. The total length of the line segments for the grain boundaries (thick lines) and the length for the line segments for the twinning intersections (thin lines) were tallied. With the 16 diamond mother grains involved, it was found that $L_{Twinning\_Intersection\_2}=506.5$ mm and $L_{Grain\_Boundary\_2}=154.4$ mm. Therefore, the twinning percentage (Method 2) for wafer 2A152 was found to be 76.6% by a division of 506.5 by a sum of 506.5 and 154.4.

Concentric twinning also introduces substantial discontinuity of the crystal planes so that the sizes of these crystal planes are greatly reduced. Therefore, a multi-twinned grain practically has smaller planes that behave just like those from small diamond grains, mitigating the spreading and propagation of the diamond [111] plane cleavage into a localized area for improved durability. Twinning also keeps the mother grain effectively large so (it is believed) that phonons can efficiently transport through the crystal lattices at a speed which is close to that in a non-twinned grain. It is to be appreciated that phonons transporting through diamond lattice is intrinsically much faster than the speed at which phonons transport across grain boundaries.

It is to be appreciated that polycrystalline diamond film having smaller grains typically performs superior in mechanical applications with respect to toughness or brittleness over diamond film having larger grains. However, polycrystalline diamond film having smaller grains have a greater area of inter-grain boundaries which slows the speed of phonon transport and reduces thermal conductivity of the diamond film, which can lead to undesirable temperature elevations of a working piece of a diamond tool formed from the diamond film having smaller grains and the object that this diamond tool works. At elevated temperatures, a diamond film of smaller grains, such as a diamond film having nano-meter sized diamond grains, deteriorates in air, or even in a protective environment. At elevated temperatures, a diamond film having nano-meter sized diamond grains deteriorates faster in air due to both graphitization and oxidation than it does in an inert atmosphere due to graphitization. It is to be appreciated that oxidation also releases energy, thereby further heating the diamond tool. Thus, the polycrystalline diamond, highly [110]-oriented and twinned, described herein is useful for mechanical applications, thermal management, and other applications.

The average surface roughness (Ra) and Peak-to-Valley (PV) of the polished growth side of wafer 02A152 (FIG. 11A) were measured via an interferometer (20× Object) to be 31.9 angstroms and 13,297 angstroms, respectively. Furthermore, the average surface roughness (Ra) and Peak-to-Valley (PV) on the polished nucleation side of wafer 02A152 were measured via the interferometer (20× Object) to be 18.1 angstroms and 292.5 angstroms, respectively. For polycrystalline diamond, it is surprising to attain such low surface roughness and peak-to-valley values on both of the polished surfaces, which can be due to the uniformity of the diamond crystallites in a highly [110]-oriented, and twinned polycrystalline diamond wafer described herein.

Comparative Example 2

Low Speed Growth of Highly [100] Oriented Polycrystalline Diamond Film

A piece of metallic tungsten of 176 mm in diameter was used as a substrate 24 in a microwave plasma chemical vapor deposition (CVD) reactor 16 (FIG. 1). A mixture of 2900 mL/min hydrogen and 17.4 mL/min methane was flowed into CVD reactor 16. A trace amount of nitrogen was also introduced into the reactor to promote the growth of the diamond film on the substrate. After plasma 20 ignition, the microwave power and the reactor pressure were tuned so that the plasma 20 size covered the entire surface of the metallic tungsten substrate 24. After one hour and 25 minutes of chemical vapor deposition of diamond, hydrogen flow was increased to 3000 mL/min and methane flow was increased to 18 mL/min. At 19 hours of deposition or diamond growth, the hydrogen flow was changed from 3000 mL/min to 2900 mL/min, while methane flow was changed from 18 mL/min to 17.4 mL/min. The diamond growth temperature at the center of the substrate was maintained at 840° C. by cooling substrate 24, e.g., via a thermal-electric cooler in contact with substrate 24 or by a fluid cooling substrate 24. A control pyrometer 26 was used to monitor the temperature of the diamond growing at the center of the substrate 24 during diamond deposition. At 63 hours of deposition, hydrogen and methane flows were changed back to 3000 mL/min and 18 mL/min, respectively. After 135.6 hours of diamond deposition or growth, the reaction was stopped and the diamond film 4 was separated from the metallic tungsten substrate 24 thereby producing a free standing polycrystalline diamond wafer, namely wafer 02A159. The growth rate of wafer 02A159 was observed to range from 0.96 micron per hour to 1.98 micron per hour, averaging 1.67 micron per hour.

Figures 12A, 12B:
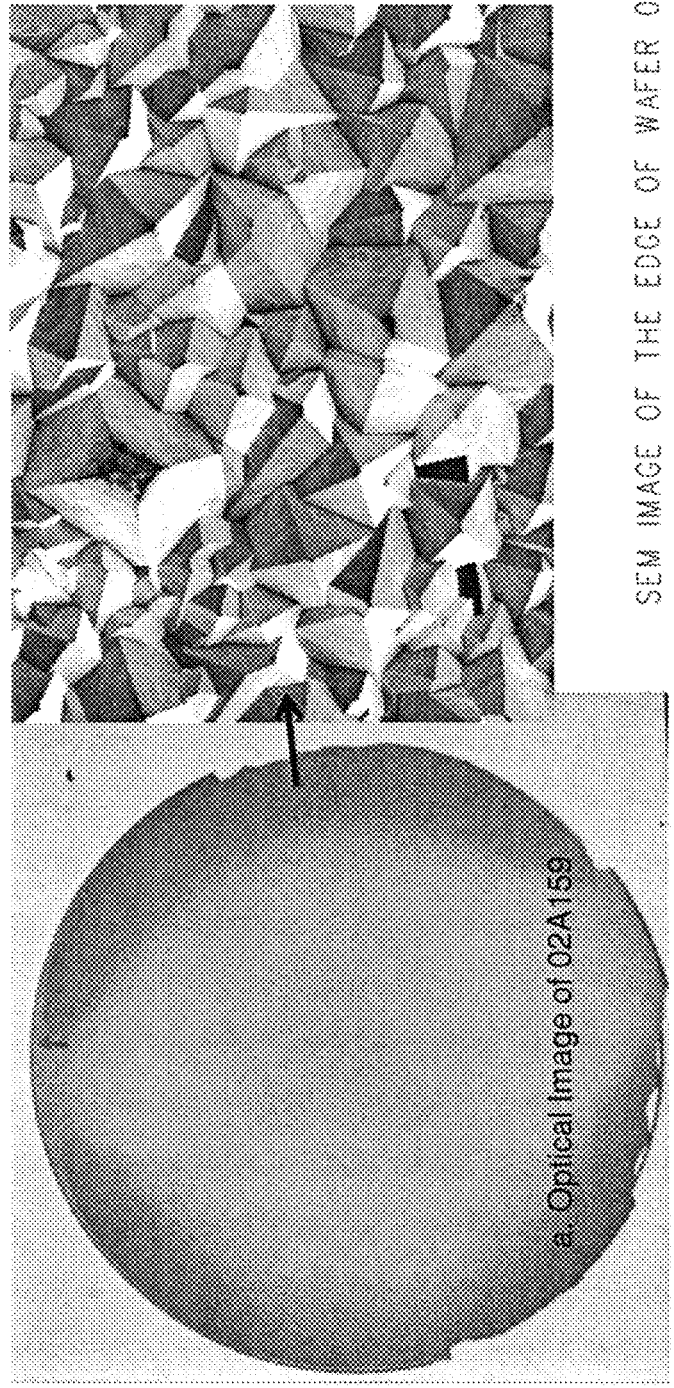
FIG. 12A is an optical image of a diamond wafer grown in accordance with Example 2 described herein.
FIG. 12B is an SEM image of the edge of a diamond wafer shown in FIG. 12A.
Figure 13:
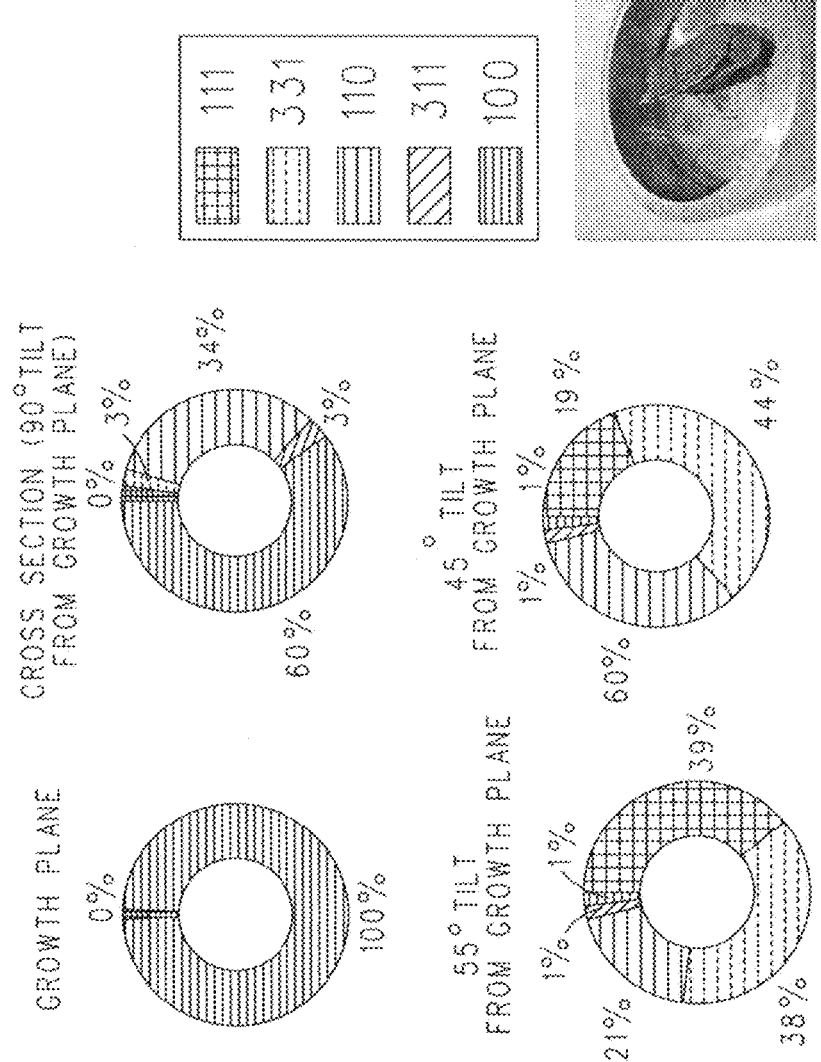
FIG. 13 shows rings representing percentages of orientations of diamond crystallites obtained from XRD patterns of the diamond wafer shown in FIG. 12A taken normal with respect to the diamond growth surface (upper left ring), a cross-section tilted 90° with respect to the diamond growth surface (upper right ring), a cross-section tilted 55° with respect to the diamond growth surface (lower left ring), and a cross-section tilted 45° with respect to the diamond growth surface (lower right XRD pattern)

With reference to FIGS. 12A, 12B, and 13, wafer 02A159 exhibited a dark color edge on its perimeter as shown in the optical image of wafer 02A159 in FIG. 12A. As shown by the X-Ray Diffraction patterns in FIG. 13, the diamond crystalline morphology of wafer 02A159 in the growth direction (upper left ring in FIG. 13) is more than 99% in the [100] orientation. The diamond crystalline morphology of such [100]-oriented crystals shown in the SEM image of FIG. 12B are tetragonal pyramids or tetragonal pyramids without sharp tips.

As shown generally in Table 3 above, an angle of 54.7° is the intrinsic angle between the [100] planes and the [111] planes in the diamond crystal lattice of wafer 02A159. A cross section of the [100]-oriented film of wafer 02A152 tilted to an angle of 55° from the growth plane or surface and X-ray diffraction (XRD) data were collected, as shown in FIG. 13, lower left ring. As shown for this 55° tilt of wafer 02A159, 39% of the diamond crystallites are oriented to the [111] plane or direction. The orientation distributions of the remaining diamond crystallites of wafer 02A159 tilted at 55° were determined to be 38% for the [331] orientation, 21% for the [110] orientation, and 2% total for the [311] and [100] orientations.

When tilted to an angle of 45° (lower right ring in FIG. 13) (an intrinsic angle between the [100] planes and the [110] planes) from the growth surface, the orientation distributions of the diamond crystallites of wafer 02A159 determined via XRD were 19% for the [111] orientation, 44% for the [331] orientation, 35% for the [110] orientation, and 2% total for the combination of the [311] orientation and the [100] orientations.

In addition, XRD of the cross-section 90° from the growth surface (upper right ring in FIG. 13) shows orientation distributions of 60% for the [100] orientation, 34% for the [110] orientation, 3% for the [311] plane, 3% for the [331] orientation, and almost nothing for the [111] orientation.

This Example 2 shows that at the intrinsic angle between the [100] orientation plane and the [111] orientation plane, there are not dominant amounts of diamond crystallites that are oriented to the [111] plane or direction. As discussed above, the [111] direction of the diamond lattice is the hardest and most durable for wearing applications. Therefore, the [100]-oriented diamond wafer 02A159 of this comparative Example 2 is inferior in hardness to the [110]-oriented diamond wafer 02A159 of Example 1. Moreover, wafer 02A159 of this Example 2 (predominantly [100]-oriented at the edge) grew slower than wafer 02A152 of Example 1 (the [110]-oriented and highly twinned), i.e., 1.67 microns per hour for wafer 02A159 (Example 2) vs. 8.28 microns per hour for wafer 02A152 (Example 1).

Comparative Example 3

Growth of Randomly Oriented Polycrystalline Diamond Films with Premature Delamination at Temperatures Between 820° C. to 1020° C. with a Mixture of Hydrogen and 2% Methane A piece of metallic tungsten of 160 mm in diameter was used as a substrate 24 in a microwave plasma chemical vapor deposition (CVD) reactor 16 (FIG. 1). In a first instance of diamond growth in accordance with Example 3, a mixture of 2600 mL/min hydrogen and 52 mL/min methane was flowed into the microwave plasma CVD reactor 16 with a methane concentration of 2%, instead of 3% in Example 1. A trace amount of nitrogen was also introduced into CVD reactor 16 to promote the growth of diamond film 4 on substrate 24. After plasma ignition, the microwave power and the reactor pressure were tuned so that the plasma 20 size covered the entire surface of the metallic tungsten substrate 24. The diamond growth temperature at the center of substrate 24 was maintained at 820° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate 24 during diamond deposition. After 94 hours of diamond growth, the diamond film 4 on tungsten substrate 24 unexpectedly delaminated, resulting in shattering of the diamond film 4 along with a substantial temperature increase. In response to this delamination, the microwave plasma CVD growth of the diamond film 4 on the substrate 24 was terminated. This delaminated and shattered diamond film 4 was identified as wafer 01A164-2 with a thickness of 380 microns. The diamond growth rate at the center of wafer 01A164-2 was determined to be 3.9 microns per hour.

In a second instance of diamond growth in accordance with Example 3 a piece of metallic tungsten of 160 mm in diameter was used as a substrate 24 in the microwave plasma chemical vapor deposition (CVD) reactor 16 (FIG. 1). A mixture of hydrogen and methane was flowed into the microwave plasma CVD reactor 16 with a methane concentration of 2%, instead of 3% in Example 1. A trace amount of nitrogen was also introduced into CVD reactor 16 to promote growth of the diamond film 4 on substrate 24. After plasma ignition, the microwave power and the reactor pressure were tuned so that the plasma 20 size covered the entire surface of the metallic tungsten substrate 24. The diamond growth temperature at the center of substrate 24 was controlled at 870° C. by cooling substrate 24, e.g., via a thermal-electric cooler in contact with substrate 24 or by a fluid cooling substrate 24. A control pyrometer 26 was used to monitor the temperature of the diamond 4 growing at the center of substrate 26 during diamond deposition. After 36 hours of diamond growth, the diamond film 4 on tungsten substrate 24 unexpectedly, delaminated, resulting in shattering of the diamond film 4 along with a substantial temperature increase. In response to this delamination, the microwave plasma CVD growth of the diamond film 4 on the substrate 24 was terminated. This delaminated and shattered diamond film 4 was identified as wafer 01A164-3 with a thickness of 145 microns at the center. The diamond growth rate at the center of wafer 01A164-3 was determined to be 4.0 microns per hour.

In a third instance of diamond growth in accordance with example 3, a piece of metallic tungsten of 160 mm in diameter was used as a substrate 24 in a microwave plasma CVD reactor 16 (FIG. 1). A mixture of hydrogen and methane was flowed into the microwave plasma CVD reactor 16 with a methane concentration of 2%, instead of 3% in Example 1. A trace amount of nitrogen was also added to the mixture to promote the growth of the diamond film 4 on the substrate 24. After plasma ignition, the microwave power and the reactor pressure were tuned so that the plasma 20 size covered the entire surface of the metallic tungsten substrate 24. The diamond growth temperature at the center of substrate 24 was controlled at 920° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate 24 during diamond deposition. After 18 hours of diamond growth, the diamond film 4 on the tungsten substrate 24 unexpectedly delaminated, resulting in shattering of the diamond film along with a substantial temperature increase. In response to delamination of the diamond film from the substrate, the microwave plasma CVD growth of the diamond film on the substrate was terminated. The delaminated and shattered diamond film was identified as wafer 01A164-4 with a thickness of 84 microns at the center. The diamond growth rate at the center of diamond 01A164-4 was determined to be 4.8 microns per hour.

This third instance of diamond growth in accordance with Example 3 was repeated a second time with the same results, namely, the diamond film 4 unexpectedly delaminated and shattered. This latter delaminated and shattered diamond film 4 was identified as wafer 01A166-1 with a thickness of 72 microns at the center at the time of unexpected premature delamination (19 hours), which translates to an average growth rate of 3.9 microns per hour. It is believed that the difference in growth rate between wafer 01A164-4 and wafer 01A166-1 can be from thickness measurements at different areas of the shattered diamond films.

In a fourth instance of diamond growth in accordance with Example 3, a piece of metallic tungsten of 160 mm in diameter was used as a substrate 24 in a microwave CVD reactor 16 (FIG. 1). A mixture of hydrogen and methane was flowed into the microwave plasma CVD reactor 16 with a methane concentration of 2%, instead of 3% in Example 1. A trace amount of nitrogen was also added to the mixture promote the growth of the diamond film 4 on the substrate 24. After plasma ignition, the microwave power and the reactor pressure were tuned so that the plasma 20 size covered the entire surface of the metallic tungsten substrate 24. The diamond growth temperature at the center of substrate 24 was controlled at 1020° C. by cooling substrate 24, e.g., via a thermal-electric cooler in contact with substrate 24 or by a fluid cooling substrate 24. A control pyrometer 26 was used to monitor the temperature of the diamond 4 growing at the center of substrate 24 during diamond deposition. After 15 hours of diamond growth, the diamond film 4 on the tungsten substrate 24 unexpectedly delaminated, resulting in shattering of the diamond film 4 along with a substantial temperature increase. In response to this delamination, the microwave plasma CVD growth of the diamond film 4 on the substrate 24 was terminated. This delaminated and shattered diamond film was identified as wafer 01A166-2 with a thickness of 67 microns at the center. The diamond growth rate at the center of wafer 01A166-2 was determined to be 4.5 microns per hour.

In summary of Example 3, diamond growth rate increases with growth temperature. At the same time, however, the time for premature delamination of diamond films decreases as the growth temperature increases, supported by the fact that diamond films grown at temperatures of 820° C., 870° C., 920° C., 920° C., or 1020° C. correspond to delamination from the tungsten substrate 24 at 94 hours, 36 hours, 19 hours, 18 hours, and 15 hours, respectively. Premature delamination is undesirable since the resulting diamond film thickness is not controllable; the diamond film is often too thin to be useful for practical applications (370, 145, 84, 72, and 67 microns in thickness, respectively); and these films typically shatter or crack into many small pieces. It is believed that premature delamination is due to stress inside the diamond films that grow at a faster growth rate at an elevated growth temperature. To this end, it is desirable to grow diamond films to desirable and useful thickness without premature delamination.

Figure 14:
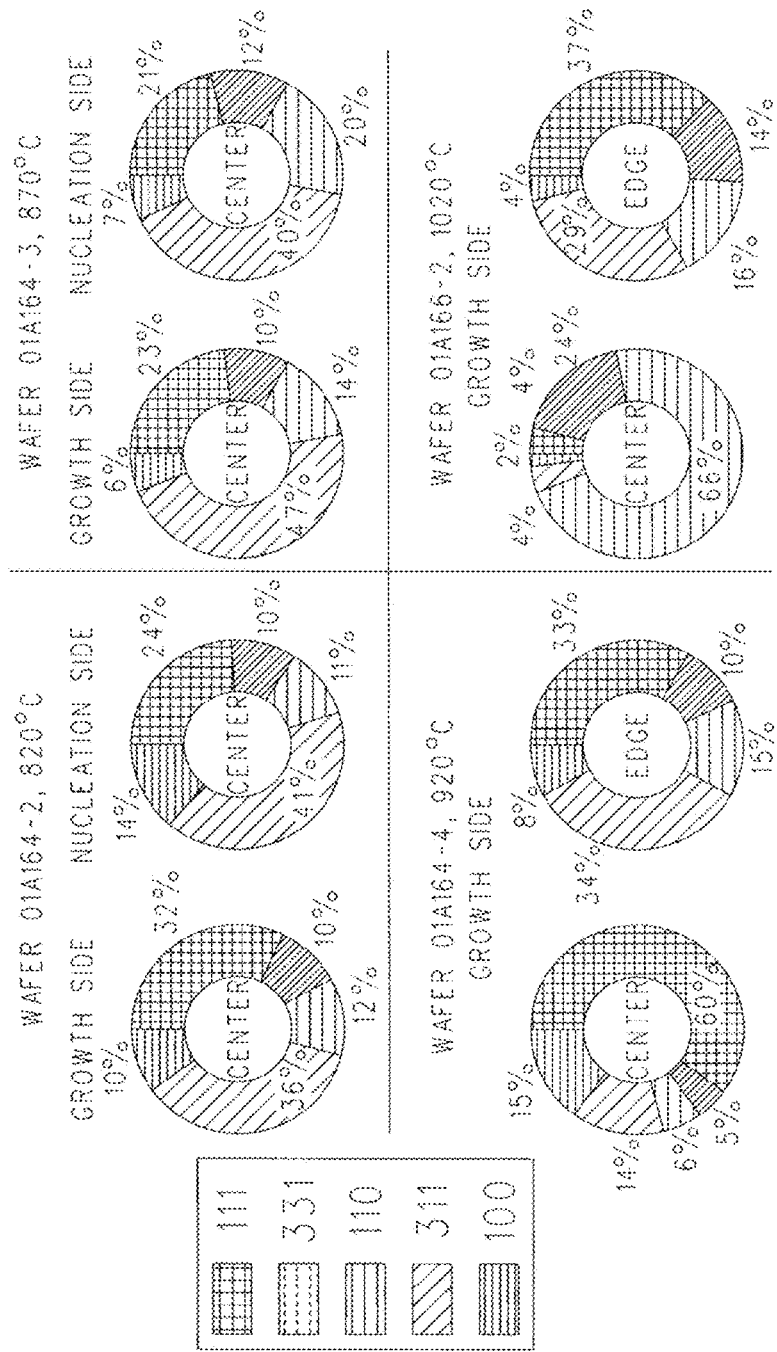
FIG. 14 shows rings representing percentages of orientations of diamond crystallites obtained from XRD patterns of the growth and nucleation sides of four different diamond wafers (films) grown at different temperatures with 2% methane in hydrogen.

It was observed for wafers 01A164-2, 01A164-3, 01A164-4, and 01A166-2 that diamond crystallites of the diamond films that prematurely delaminated at a growth temperatures of 820° C., 870° C., 920° C., 920° C., and 1020° C., respectively, are more or less randomly oriented, as shown in FIG. 14, either on the substrate side or on the nucleation side, and either in the center or at the edge. In contrast to this Example 3, the [110]-oriented, twinned diamond film described in Example 1 grows to any desirable thickness without premature delamination. Therefore, the [110]-orientation of the diamond film described in Example 1 is believed to at least one key to successfully growing a diamond film to any desirable thickness.

Figure 15:
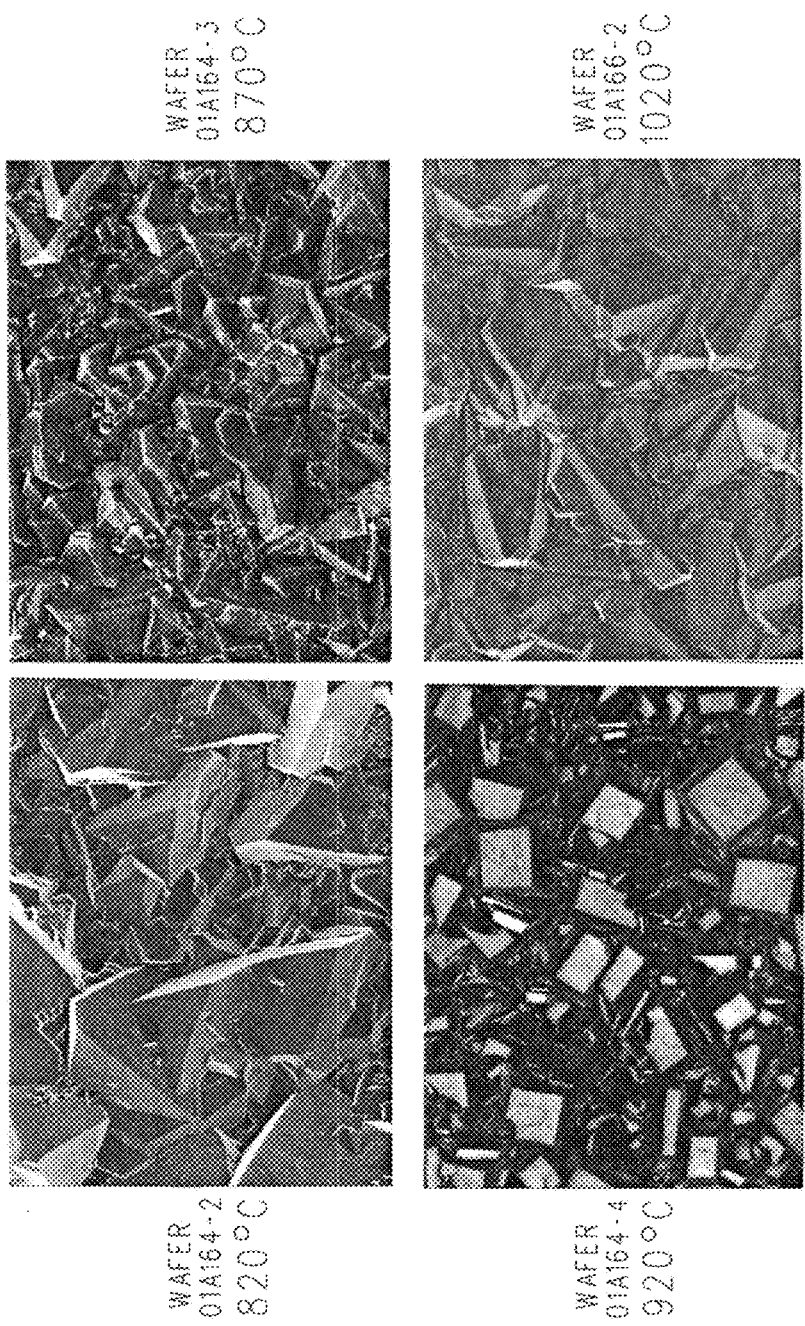
FIG. 15 shows four SEM images corresponding to the diamond wafers associated with the rings representing percentages of orientations of diamond crystallites obtained from XRD patterns shown in FIG. 14.

It was also observed for wafers 01A164-2, 01A164-3, 01A164-4, and 01A166-2 that diamond crystallites of the randomly-oriented diamond films that grow at growth temperatures of 820° C., 870° C., 920° C., 920° C., and 1020° C., respectively, do not show star-shaped twinning or concentrically-twinning (as descried in Example 1), as shown in FIG. 15. Accordingly, while not bound by the explanation offered in this disclosure, diamond films of concentrically-twinned diamond crystallites described herein (Example 1) are believed to have a minimum level of stress in the diamond films, which allows such diamond films to grow to any desirable thickness without suffering premature delamination.

Comparative Example 4

Growth of Randomly Oriented Polycrystalline Diamond Films with Premature Delamination in the Wafer at Temperatures of 1020° C. and 1060° C. with a Mixture of Hydrogen and 3% Methane A piece of metallic tungsten of 160 mm in diameter was used as a substrate 24 in a microwave plasma CVD reactor 16 (FIG. 1). In a first instance of diamond growth in accordance with Example 4, a mixture of 2400 mL/min hydrogen and 72 mL/min methane was flowed into the microwave plasma CVD reactor 16 with a methane concentration of 3%, the same as Example 1. After plasma ignition, the microwave power and the reactor pressure were tuned so that the plasma 20 size covered the entire surface of the metallic tungsten substrate 24. The diamond growth temperature at the center of substrate 24 was controlled at 1060° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate 24 during diamond deposition. After 16 hours of diamond growth, the diamond film 4 on the tungsten substrate 24 unexpectedly delaminated, resulting in shattering of the diamond film 4 along with a substantial temperature increase. In response to this delamination, the microwave plasma CVD growth of the diamond film 4 on the substrate 24 was terminated. This delaminated and shattered diamond film was identified as wafer 01A231A with a thickness of 110 microns. The diamond growth rate at the center of wafer 01A231A was determined to be 6.88 microns per hour.

Figure 16:
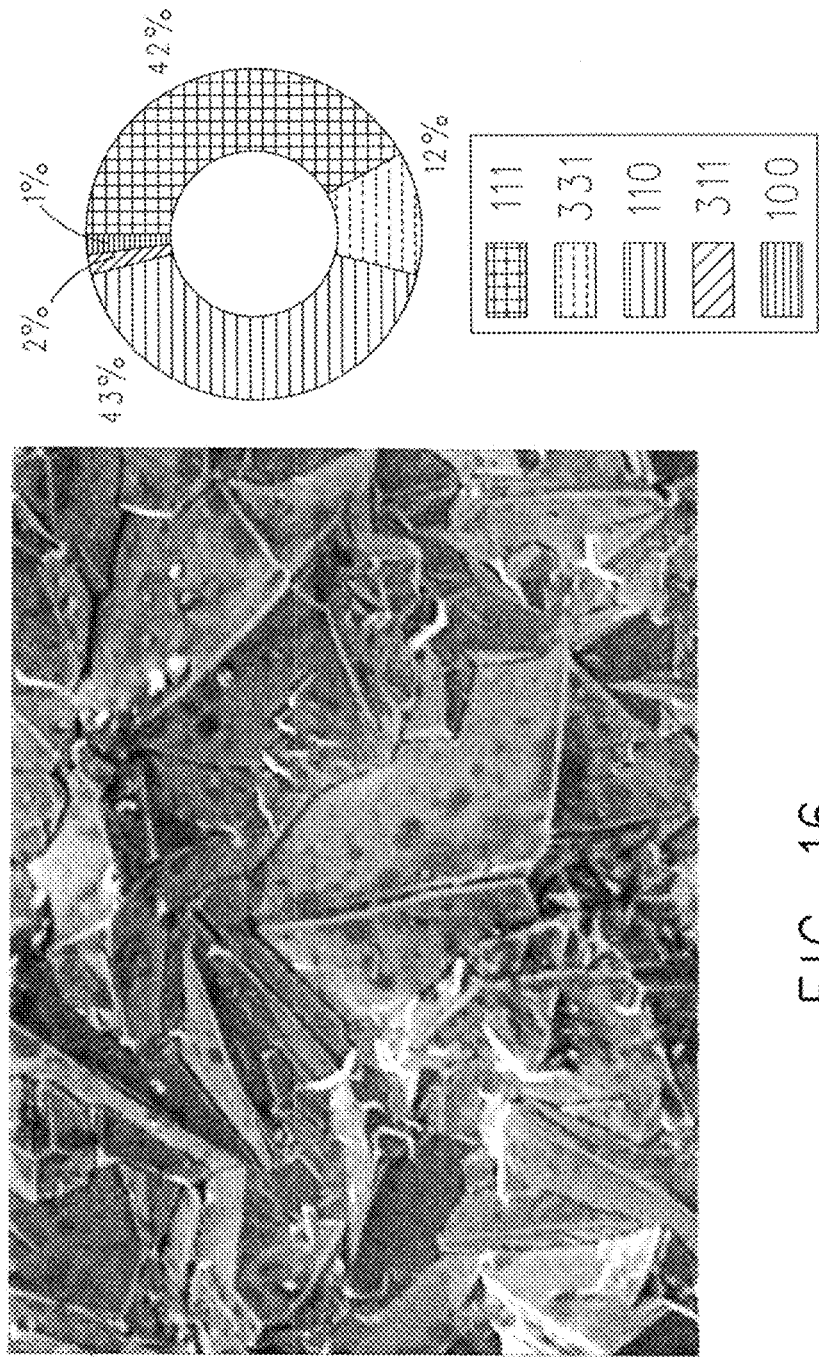
FIG. 16 shows an SEM image and a ring representing the percentages of diamond crystallites obtained from XRD patterns for a diamond wafer grown at 1060° C. with 3% methane in hydrogen in accordance with an instance of wafer growth described in Example 4 described herein.

The fact that wafer 01A231A prematurely delaminated and shattered at the 16th hour of growth suggests that diamond crystallites in the diamond film 4 suffered a level of stress that was high enough to cause the diamond film 4 to delaminate and shatter. Such catastrophic level of stress is believed to be due to misalignment of the diamond crystallites, suggested by the randomly oriented diamond crystal orientations shown in the SEM image of FIG. 16, and lack of crystal twinning for relieving the film stress. XRD results (represented by the percentage of orientation distributions of diamond crystallites shown by the ring in FIG. 16) show that wafer 01A231A has 42% orientation along the [111] direction, 12% orientation along the [331] direction, 43% orientation along the [110] direction, 2% orientation along the [311] direction, and 1% orientation along the [100] direction. The SEM image of wafer 01A231A in FIG. 16 does not show the star-shaped crystallite grains that are typical in quality diamond films described herein (e.g., Example 1). This Example 4 confirms that the highly-twinned, [110]-oriented diamond film of Example 1 has lower level of stress that allows the diamond film to grow to a desired thickness as described in Example 1 above and as will be described further in the following Examples 5, 6, and 7.

In a second instance of diamond growth in accordance with Example 4, a piece of metallic tungsten of 160 mm in diameter was used as a substrate 24 in a separate microwave plasma CVD reactor 16 similar to the one used in Example 1. A mixture of 2400 mL/min hydrogen and 72 mL/min methane was flowed into the microwave plasma CVD reactor 16 with a methane concentration of 3%, the same as Example 1. After plasma ignition, the microwave power and the reactor pressure were tuned so that the plasma 20 size covered the entire surface of the metallic tungsten substrate 24. The diamond growth temperature at the center of substrate 24 was controlled at 1020° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate 24 during diamond deposition. After 9 hours of diamond growth, the diamond film 4 on the tungsten substrate 26 unexpectedly delaminated, resulting in shattering of the diamond film 4 along with a substantial temperature increase. In response to this delamination, the microwave plasma CVD growth of the diamond film 4 on the substrate 24 was terminated. The delaminated and shattered diamond film 4 was identified as wafer 01A231B with a thickness of 60 microns. The diamond growth rate at the center of wafer 01A231B was determined to be 6.67 microns per hour.

Figure 17:
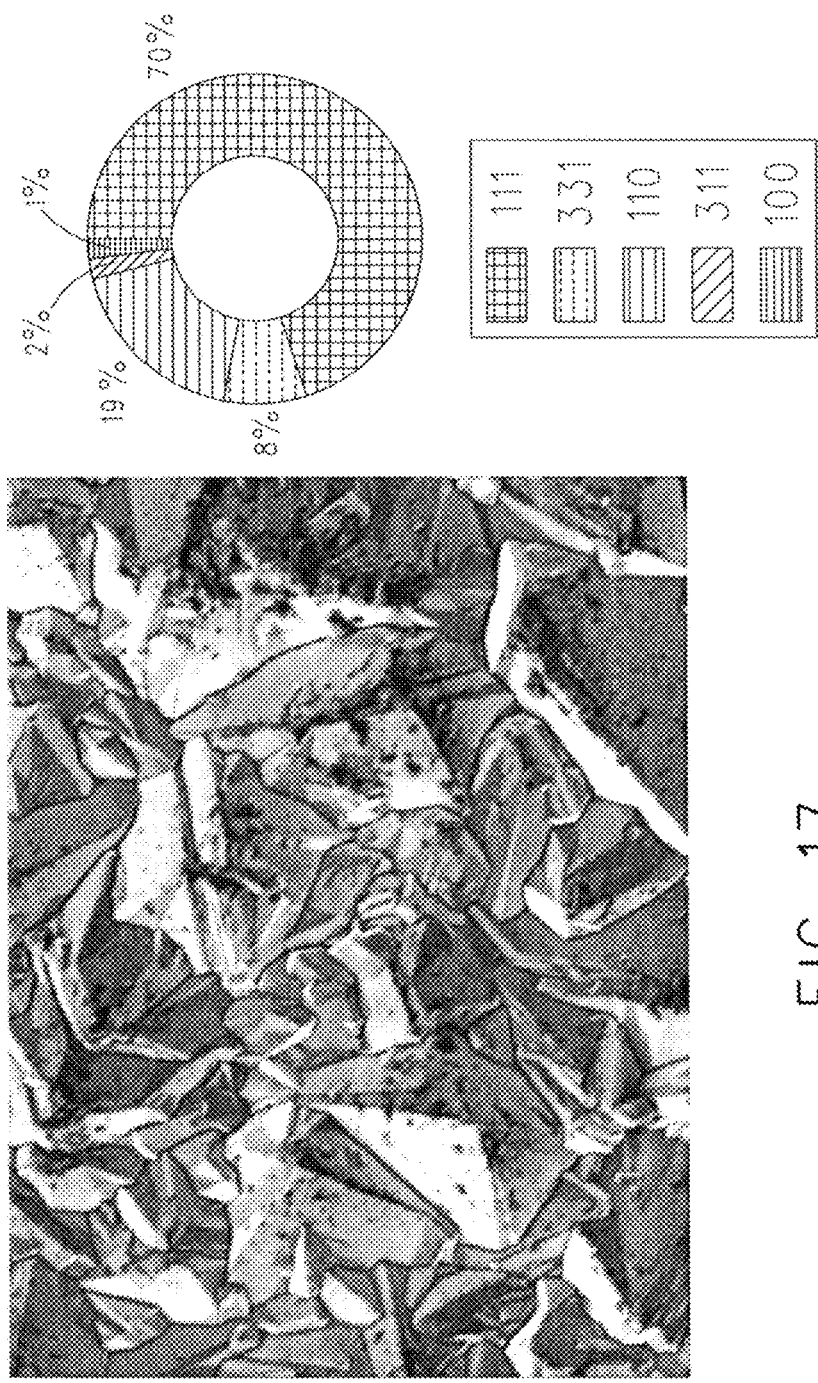
FIG. 17 shows an SEM image and a ring representing percentages of orientations of diamond crystallites obtained from XRD patterns for a diamond wafer grown at 1020° C. with 3% methane in hydrogen in accordance with another instance of Example 4 described herein.

The fact that wafer 01A231B prematurely delaminated and shattered at the 9th hour of growth suggests that diamond crystallites in the film suffered a level of stress that was high enough to cause the film to delaminate and shatter. Such catastrophic level of stress is believed to be due to misalignment of the diamond crystallites, suggested by random diamond crystal orientations, as shown in the SEM image of FIG. 17, as well as a lack of crystal twinning for relieving the film stress. XRD results (represented by the percentage of orientation distributions of diamond crystallites shown by the ring in FIG. 17) show that the polycrystalline diamond of wafer 01A231B has 70% orientation along the [111] direction, 8% orientation along the [331] direction, 19% orientation along the [110] direction, 2% orientation along the [311] direction, and 1% orientation along the [100] direction. The SEM image of wafer 01A231B in FIG. 17 does not show the star-shaped crystallite grains that are typical in quality diamond films described herein (e.g., Example 1). This Example 4 further confirms that a highly-twinned [110]-oriented diamond film of Example 1 has a lower level of stress that allows the diamond film to grow to a desired film thickness is, as described in Examples 1, 5, 6, and 7.

As discussed herein, the surface of the substrate can optionally be treated by diamond rubbing to achieve a higher level of adhesion. Due to the premature delamination in wafers 01A231A and 01A231B, in a third instance of diamond growth in accordance with Example 4, the same substrate 24 that was used in the second instances of diamond growth in accordance with Example 4 was rubbed with diamond powders for the purpose of attaining better seeding for better adhesion of diamond film to the substrate. Such diamond-powder-rubbed metallic tungsten substrate 24 (160 mm in diameter) was placed into a separate microwave plasma CVD reactor 16 similar to the one used in Example 1. In this third instance of diamond growth in accordance with Example 4, a mixture of 2400 mL/min hydrogen and 72 mL/min methane was flowed into the microwave plasma CVD reactor 16 with a methane concentration of 3%, the same as Example 1. After plasma ignition, the microwave power and the reactor pressure were tuned so that the plasma 20 size covered the entire surface of the metallic tungsten substrate 24. The diamond growth temperature at the center of substrate 24 was controlled at 1020° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate 24 during diamond deposition. After 101 hours of diamond growth, CVD growth of the diamond film 4 was stopped and the diamond film 4 was separated from the substrate 24. The thus separated diamond film 4 was identified as wafer 01A231 with a center thickness of 665 microns. The diamond growth rate at the center of wafer 01A231 was determined to be 6.58 microns per hour.

In this third instance of diamond growth in accordance with Example 4, rubbing the substrate with diamond powders prevented the diamond film 4 from prematurely delaminating. However, such adhesion enhancement did not help control the stress of the diamond film 4 inasmuch as wafer 01A231 suffered microcracks throughout the nucleation side of the wafer, as shown in the right SEM image in FIG. 18. Microcracks in diamond wafers are highly undesirable.

Figure 18:
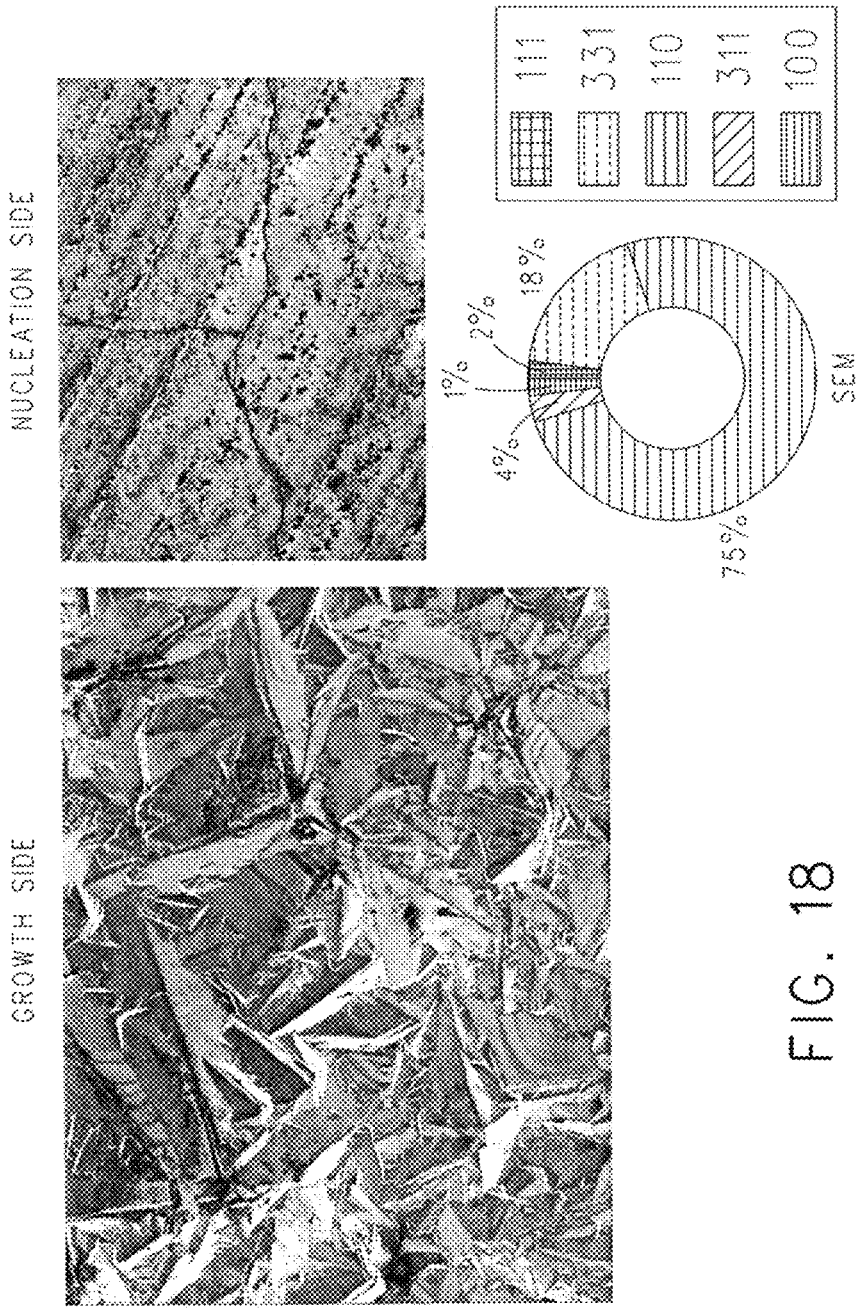
FIG. 18 shows SEM images of the growth side and nucleation side, and a ring representing percentages of orientations of diamond crystallites obtained from XRD patterns for a diamond wafer grown at 1020° C. with 3% methane in hydrogen on a diamond-powders-rubbed substrate in accordance with another instance of Example 4 described herein.

As can be seen in the left SEM image of FIG. 18, wafer 01A231 that suffered microcracks on the nucleation side does not have the twinning features on the growth side that are typically in diamond films described herein in Examples 1, 5, 6, and 7. Wafer 01A231 also does not have the level of [110]-orientation that is present in the diamond film described herein in Examples 1, 5, 6, and 7. XRD results (represented by the percentages of orientation distributions of diamond crystallites shown by the ring in FIG. 18) show that wafer 01A213 has 2% orientation along the [111] direction, 18% orientation along the [331] direction, 75% orientation along the [110] direction, 4% orientation along the [311] direction, and 1% orientation along the [100] direction. These orientations further support that the diamond film described herein in Examples 1, 5, 6, and 7 is unique in its [110] orientation and its twinning features, i.e., twinned around the [110] axis of the diamond lattice forming star-shaped morphology on the growth surface or a bicycle-shaped concentric pies after surface polishing on the growth surface. The uniqueness of the diamond film described herein in Examples 1, 5, 6, and 7 is that it grow fast and has both [110]-orientation and star-shaped/concentric crystal twinning, leading to a polycrystalline diamond film having a minimum stress that allows successful growth of the diamond film to a desirable film thickness without suffering microcracks.

Example 5

Figure 19:
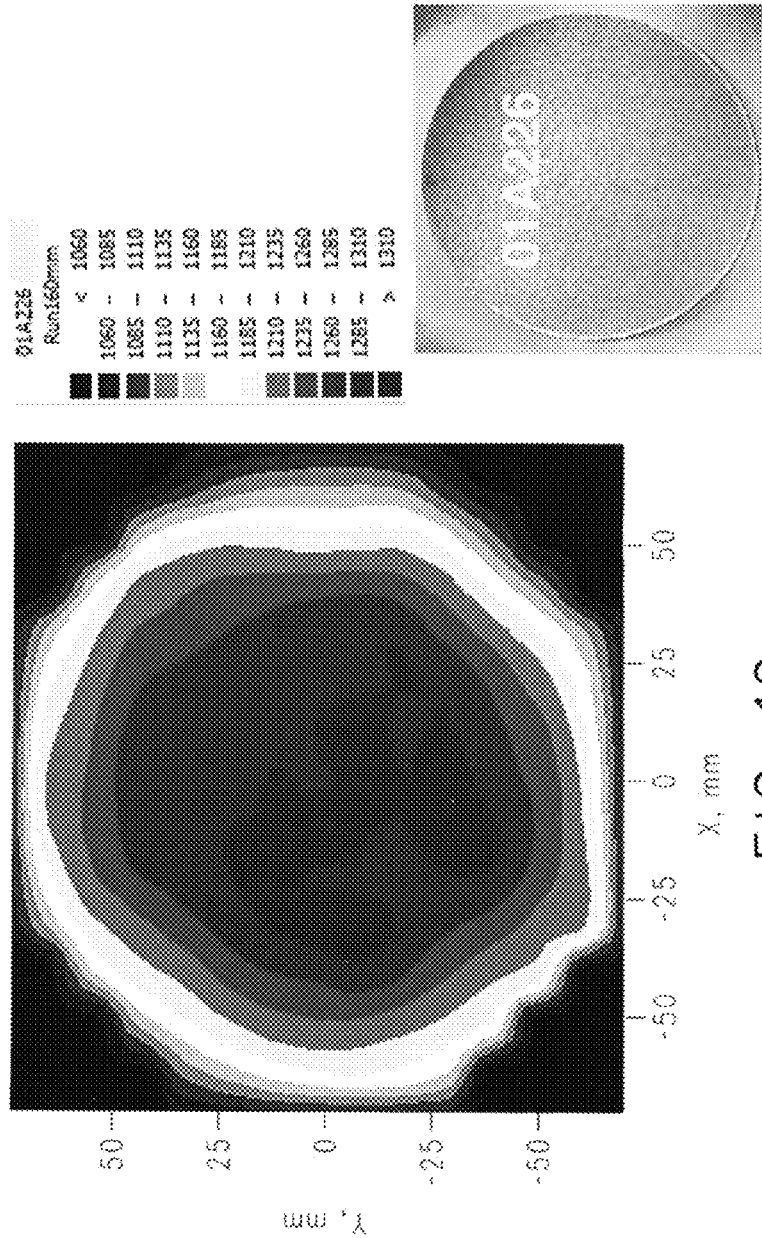
FIG. 19 is an optical image and a thickness contour plot of a diamond wafer grown in accordance with Example 5 described herein.

Successful Growth of Highly Twinned, [110]-Oriented Polycrystalline Diamond Film at 1120° C. in a Separate CVD Reactor for 162 Hours with 3% Methane A piece of metallic tungsten of 160 mm in diameter was used as a substrate 24 in a separate microwave plasma CVD reactor 16 similar to the one used in Example 1. A mixture of 2400 mL/min hydrogen and 72 mL/min methane was flowed into the microwave plasma CVD reactor 16 with a methane concentration of 3%, also the same as Example 1. After plasma ignition, the microwave power and the reactor pressure were tuned so that the plasma 20 size covered the entire surface of the metallic tungsten substrate 24. The diamond growth temperature at the center of substrate 24 was controlled at 1120° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate 24 during diamond deposition. After 162 hours of diamond growth, the reaction was stopped and the grown diamond 4 was separated from the metallic tungsten substrate, whereupon a free standing polycrystalline diamond wafer 4 was produced, identified as wafer 01A226, shown in the optical image of FIG. 19. Wafer 01A226 is 160 mm in diameter and contained no cracks as shown in the optical image of FIG. 19.

The average growth rate for wafer 01A226 was determined to be 7.56 microns per hour. The thickness of the wafer 01A226 was uniform, ranging from 1,060 to 1,310 microns with a standard deviation of 5.29%, as shown in the following Table 4 and in the thickness contour plot of FIG. 19.

1,185 mm. Thus, the percentage of twinning (Method 1) for wafer 01A226 was determined to be 78.8% by division of 4,420 by a sum of 4,420 and 1,185.

The growth surface of a one-inch (25.4 mm) diameter piece of diamond laser-cut from wafer 01A226 was lapped and polished. The SEM image of FIG. 22A shows that this piece of diamond has diamond crystals twins around the [110] axis, resulting in bicycle-wheel shaped, or concentric, morphology. Such concentric twinning is observed in FIG. 22A as pie-shape or wedge-shape crystal sections.

In order to better confirm the twinned diamond crystal grains, the polished growth surface of wafer 01A226 was etched in hydrogen microwave plasma for one hour. Hydrogen free radicals in hydrogen microwave plasma etch carbon atoms away from the polycrystalline diamond surface. Moreover, hydrogen free radicals of the hydrogen microwave plasma etch carbon atoms off the boundaries among diamond crystal grains and twinning intersections within a twinned diamond grain faster than the hydrogen microwave plasma etches carbon atoms off of the regular diamond surface planes, mainly the [110] planes, in this particular case. FIG. 22B is an SEM image of the hydrogen microwave plasma etched surface of wafer 01A226. As can be seen in FIG. 22B, within a diamond grain there can be a number, e.g., without limitation, 16-20, of instances of wedge-shaped or pie-shaped twinned crystal sections that have different SEM brightness in almost alternative patterns. The radius of these wedge-shaped or pie-shaped twinned crystal sections ranges from a few microns to as large as 100 microns or greater. The tips of the wedge-shaped or pie-shaped twinned crystal sections tend to converge at the center of the "bicycle wheel" as can be seen in the polished surface of FIG. 22A and the polished and etched surface of FIG. 22B. The polygon side length of these wedges range from a few microns to a few tens of microns or greater. It is believed that such nearly concentric twinning is unique and results in a substantial reduction in the stress of polycrystalline diamond films during growth along the radial directions (360°) of

TABLE 4

Highly Twinned, [110]-Oriented Diamond Films that Grow for Different Times

| Wafer # | H2 mL/min | CH4 mL/min | Growth Temp., ° C. | Growth Time, hr. | Avg. Growth Rate μm/hr | Std. Dev., % | Crack (mm) | [110], % |
|---|---|---|---|---|---|---|---|---|
| 02A152 | 2400 | 72 | 1117 | 188 | 8.29 | 8.88% | ~250 (3 pc) | 99% |
| 01A226 | 2400 | 72 | 1120 | 162 | 7.56 | 5.29% | 0 | 96% |
| 01A227 | 2400 | 72 | 1120 | 90 | 7.37 | 4.55% | 0 | 93% |
| 01A235 | 2400 | 72 | 1180 | 120 | 8.45 | 7.83% | 0 | 95% |

Figures 20A, 20B:
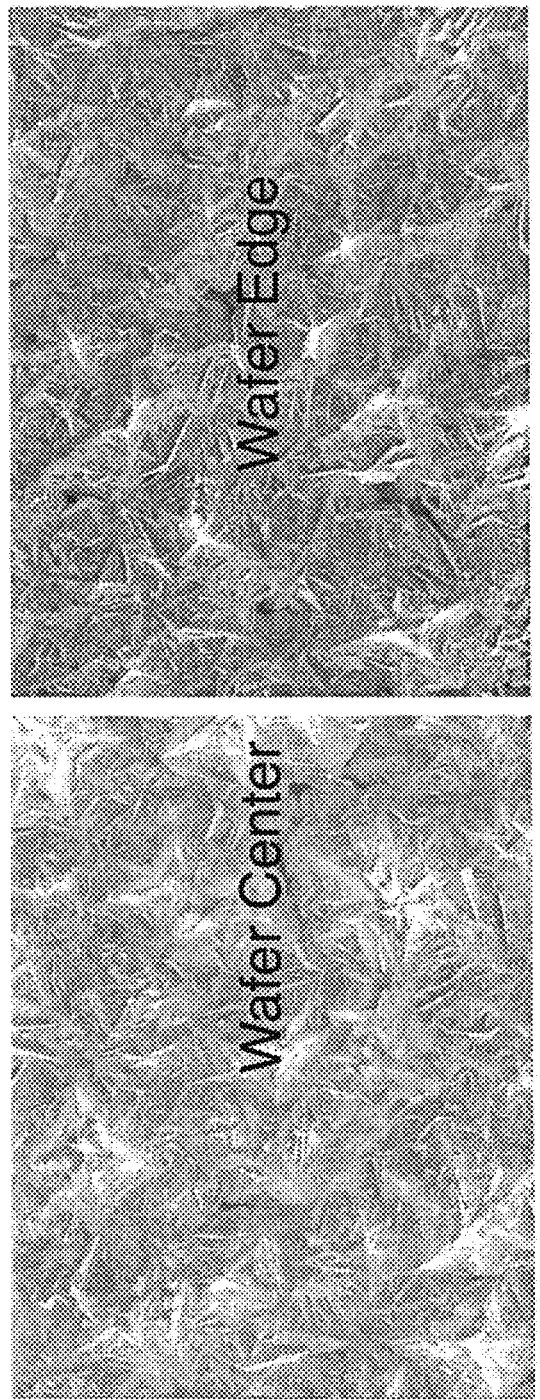
FIGS. 20A and 20B are SEM images at the center and edge of the growth side of the diamond wafer shown in FIG. 19.

As shown in FIGS. 20A and 20B the morphologies of diamond crystallites in the center and at the edge of wafer 01A226 are twinned, shown as uniform star-shapes (observed from the growth surface).

Figure 21:
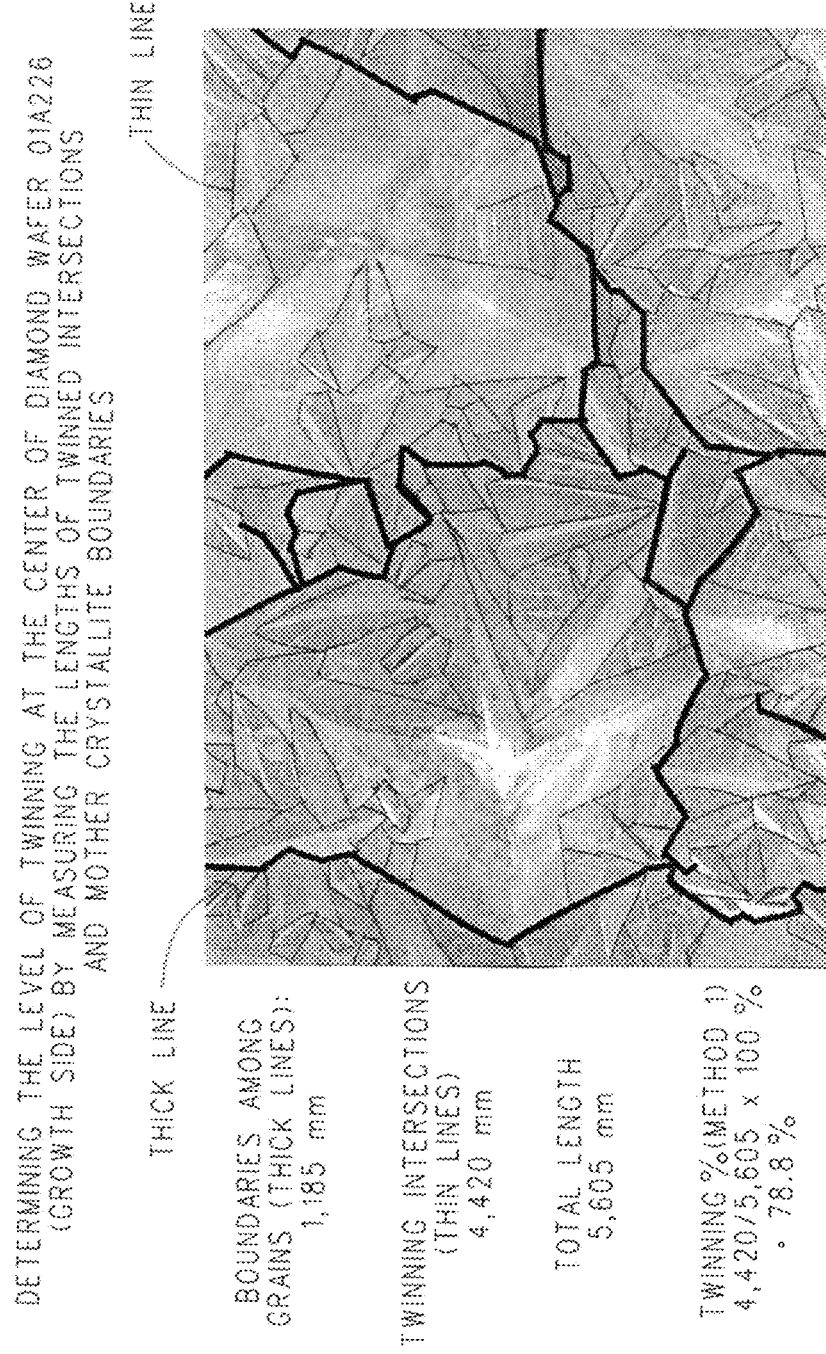
FIG. 21 is an SEM image including thick lines between grain boundaries and thin lines between twinning intersections of the wafer shown in FIG. 19.

The level of twinning for wafer 01A226 was determined by Method 1 above, namely, measuring the total length of the boundaries between diamond crystal grains (thick lines) and the total length of the twinning intersections (thin lines) inside a diamond mother grain in an SEM image of the center of the wafer 01A226, as shown in FIG. 21. The total length of the twinning intersections in the mother grain (thin lines) of wafer 01A226 in FIG. 21 was measured to be 4,420 mm and the total length for the boundaries between the diamond mother grains (thick lines) was measured to be these 'bicycle-wheels' or polygons. Without such concentric twinning and/or [110]-preferred orientation, successful growth of a polycrystalline diamond film to a desirable thickness without premature-delamination was not attainable, see, e.g., Examples 3 and 4.

Figure 22C:
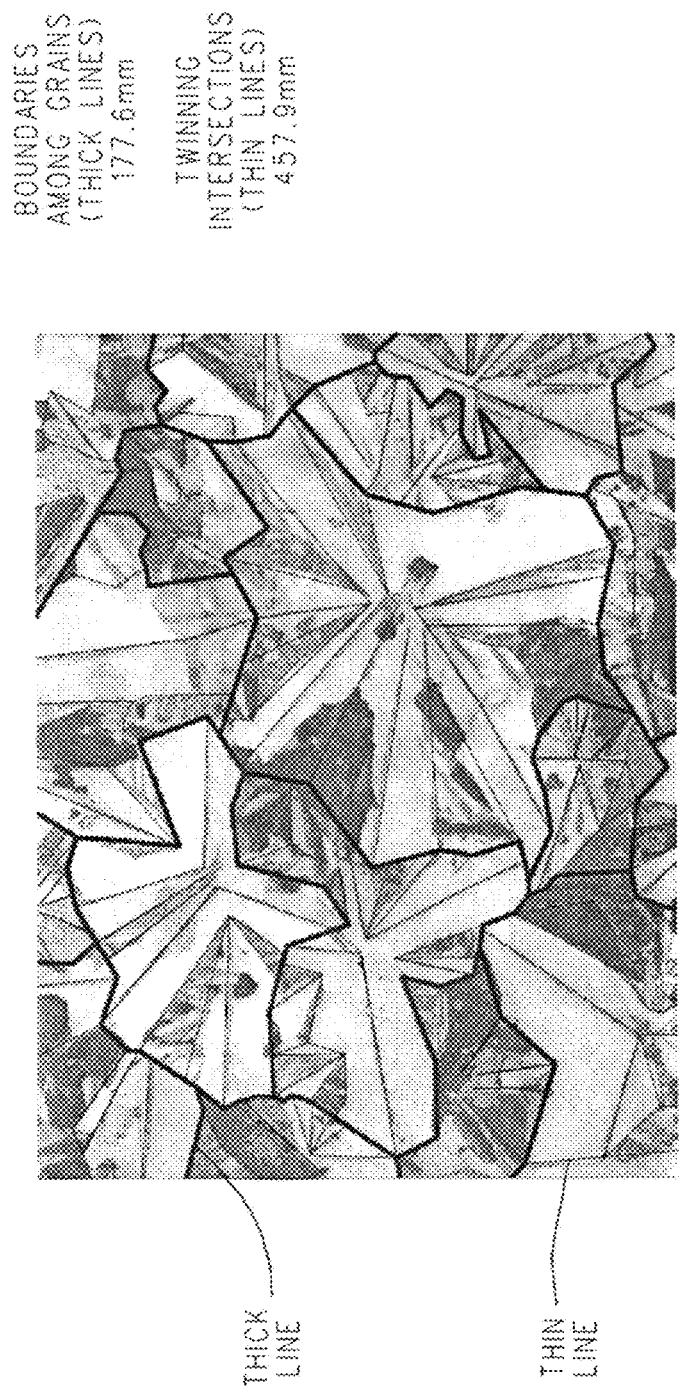
FIG. 22C is an SEM image of the polished-and-etched growth side of the diamond wafer shown in FIG. 19 including thick lines between grain boundaries and thin line between twinning intersections.

To quantify the degree of twinning, the SEM image of FIG. 22B was imported into AutoCAD® software. AutoCAD® is a US registered trademark of Autodisk, Inc., of Sausalito, Calif., USA. The boundaries among diamond crystal grains were traced with thicker line segments; while the twinning intersections inside each diamond grain were traced with thinner line segments, as shown in FIG. 22C. The total length of line segments for the grain boundaries ($L_{Grain\_Boundary\_2}$) and the total length for the line segments for the twinning intersections ($L_{Twinning\_Intersection\_2}$) were determined from the thicker and thinner line segments. With 17 diamond mother grains involved, it was found that $L_{Twinning\_Intersection\_2}$=457.9 mm and $L_{Grain\_Boundary\_2}$=177.6 mm. Therefore, the twinning percentage (Method 2) for diamond 01A226 was determined to be 72.1% by division of 457.9 by a sum of 457.9 and 177.6.

It was observed that concentric twinning also introduces discontinuities into the crystal planes, whereupon the sizes of the crystal planes are reduced over diamond wafers that do not exhibit concentric twinning. Therefore, a multi-twinned diamond grain practically has smaller planes that behave similar to small diamond grains, while twinning maintains the mother grain effectively large so that phonons can efficiently transport through the diamond crystal lattice at a speed which is close to that in a non-twinned grain. To this end, phonons transporting through diamond lattice is intrinsically faster than the speed that phonons transport across grain boundaries.

Moreover, polycrystalline diamond of smaller grains typically perform superior in mechanical applications with respect to toughness or brittleness over diamond film of larger grains. However, polycrystalline diamond of smaller grains have a greater area of inter-grain boundaries which slow down the speed of phonon transport and reduce thermal conductivity of the diamond, which can lead to temperature elevations of the working piece of the diamond tool and the object on which this diamond tool acts on. At elevated temperatures, diamond of smaller grains, such as nano-sized diamond having large amounts of surface area among the grain boundaries, deteriorates in air or even in a protective environment. At elevated temperatures, nano-sized diamond deteriorates faster in air due to both graphitization and oxidation than it does in an inert atmosphere due to graphitization. Moreover, oxidation releases energy which heats the diamond tool to an even higher temperature. Thus, the polycrystalline, highly [110]-oriented and twinned diamond described herein is unique for mechanical applications, thermal management, and other applications.

Figure 23:
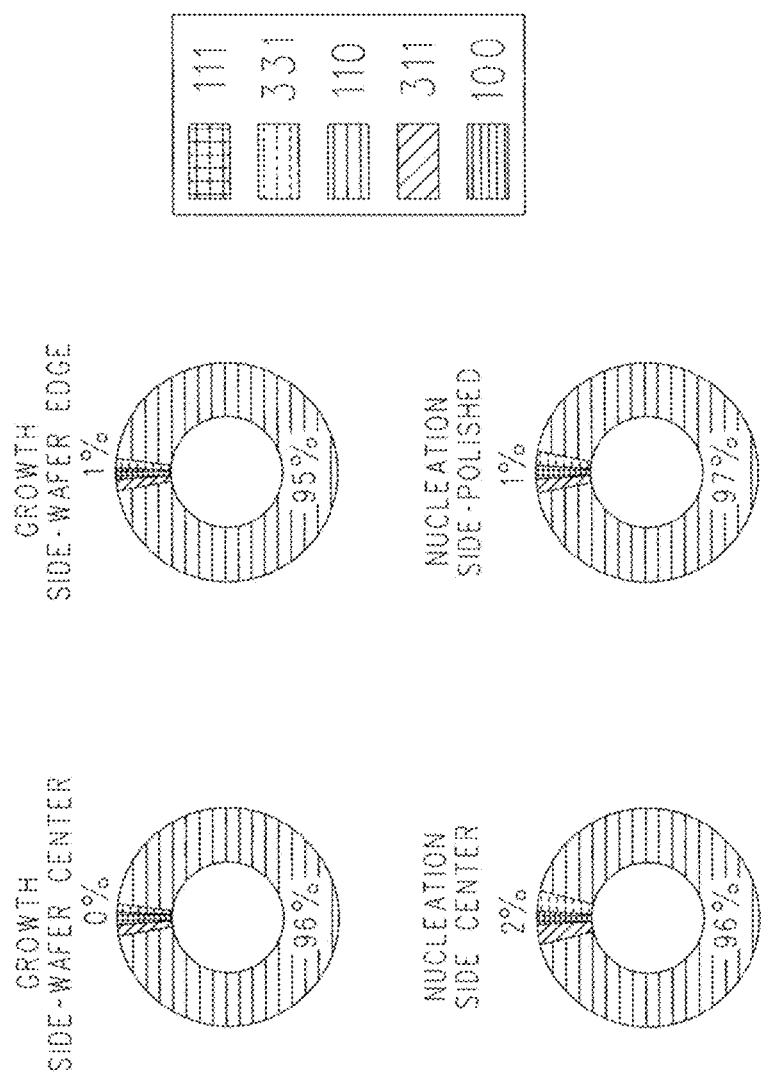
FIG. 23 shows rings representing percentages of orientations of diamond crystallites obtained from the XRD patterns at the centers and the edges of the growth and nucleation sides of the diamond wafer of FIG. 19.

In addition, as shown in FIG. 23, diamond crystallites in polycrystalline diamond wafer 01A226 are highly [110]-oriented. To this end, XRD results (represented by the percentages of orientation distributions of diamond crystallites shown by the ring in FIG. 23) of the center-growth side (top left ring in FIG. 23) of wafer 01A226 has 96% orientation along the [110] plane or direction. The edge-growth side (top right ring in FIG. 23) of the wafer 01A226 has 95% orientation along the [110] direction. The center of the nucleation side (bottom left ring in FIG. 23) has 96% orientation along the [110] plane or direction. Finally, the polished nucleation side of a 1-inch laser-cut part of wafer 01A226 (bottom right side of FIG. 23) has 97% orientation along the [110] plane or direction. These XRD results demonstrate that wafer 01A226 is uniformly and highly [110]-orientated.

The average surface roughness (Ra) and Peak-to-Valley (PV) on the polished growth side surface (FIG. 22A) of wafer 01A226 were measured with an interferometer to be 60.7 angstroms and 12,895 angstroms, respectively. Furthermore, the average surface roughness (Ra) and Peak-to-Valley (PV) on the polished nucleation side of wafer 01A226 were measured with an interferometer to be 12.4 angstroms and 332.5 angstroms, respectively. For polycrystalline diamond, it was surprising to observe such low surface roughness and peak-to-valley values on both sides of the polished surfaces of wafer 01A226, particularly on the nucleation side, which, it is believed, can be due to the uniformity of the diamond crystallites in highly [110]-oriented, and twinned polycrystalline wafer 01A226.

This example demonstrates that growth of a highly twinned, [110]-oriented polycrystalline diamond film can be successfully repeated in a separate microwave plasma CVD reactor 16 with similar results.

Example 6

Figure 24:
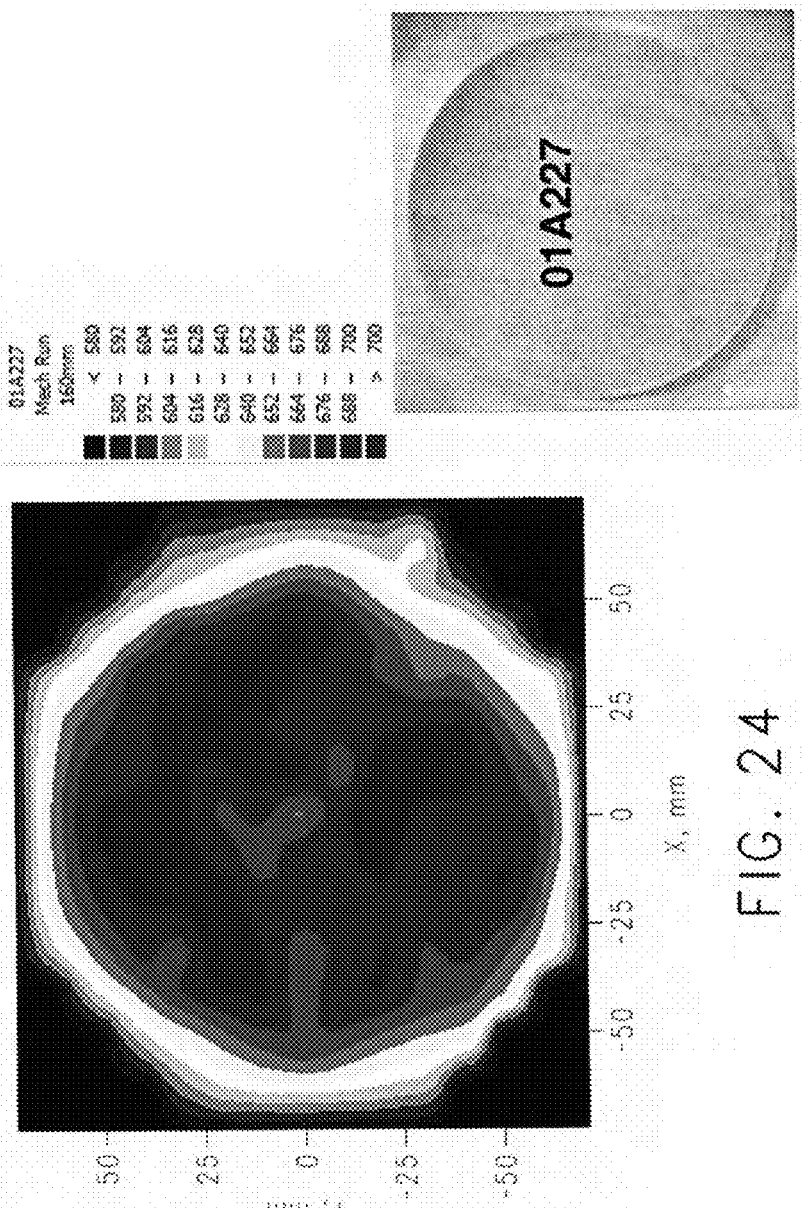
FIG. 24 is an optical image and a thickness contour plot of the diamond wafer grown in accordance with Example 6 described herein.

Successful Growth of Highly Twinned, [110]-Oriented Polycrystalline Diamond Film at 1120° C. in a Separate CVD Reactor for 90 Hours with 3% Methane A piece of metallic tungsten 160 mm in diameter was used as a substrate 24 in a separate microwave plasma CVD reactor 16 similar to the one used in Example 1. A mixture of 2400 mL/min hydrogen and 72 mL/min methane was flowed into the microwave plasma CVD reactor 16 with a methane concentration of 3%, also the same as Example 1. After plasma ignition, the microwave power and the reactor pressure were tuned so that the plasma 20 size covered the entire surface of the metallic tungsten substrate 24. The diamond growth temperature at the center of substrate 24 was controlled at 1120° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate during diamond deposition. After 90 hours of diamond growth, the reaction was stopped and the grown diamond 4 was separated from the metallic tungsten substrate 24, whereupon a free standing polycrystalline diamond wafer 4 was produced, identified as wafer 01A227, shown in the optical image of FIG. 24. As can be seen in FIG. 24, polycrystalline diamond wafer 01A227 is uniform and includes no cracks.

Figures 25A, 25B:
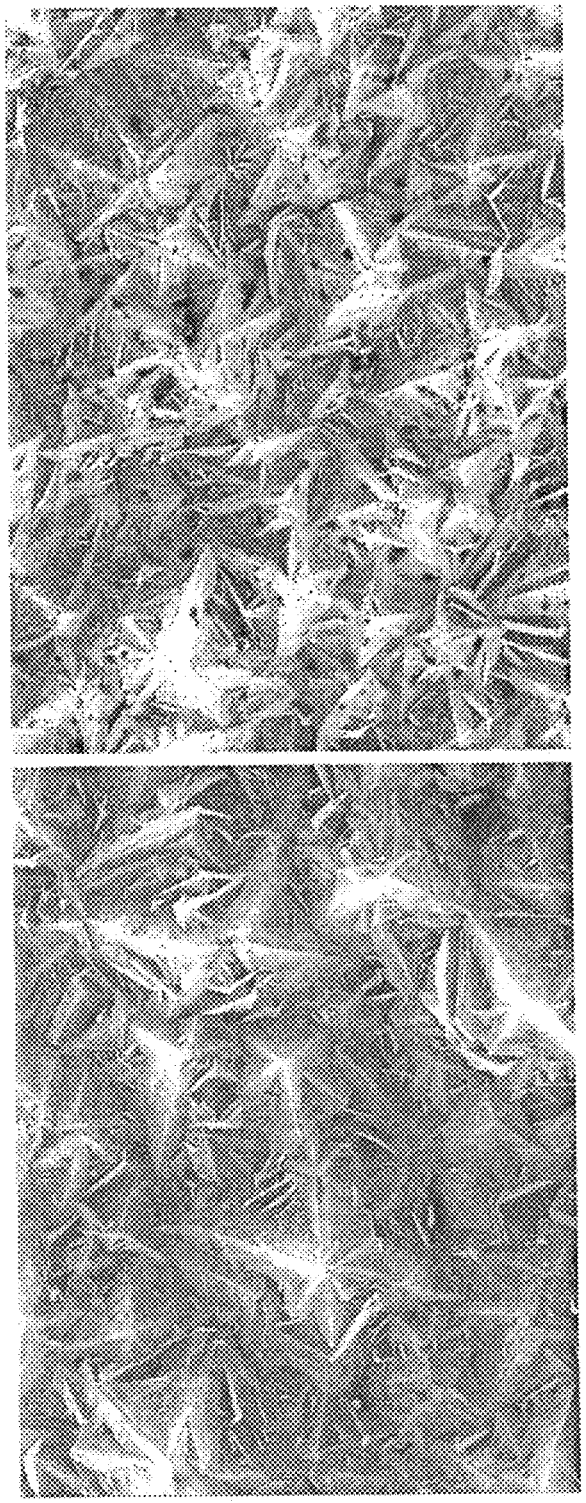
FIGS. 25A and 25B are SEM images of the center and edge of the growth side of the diamond wafer shown in FIG. 24.

The average growth rate for wafer 01A227 was determined to be 7.37 micron per hour. The thickness of the wafer 01A227 was observed to be uniform, ranging from 580 to 700 microns with a standard deviation of 4.55%, as shown in Table 4 (above) and the thickness contour plot of FIG. 24. As shown in FIGS. 25A and 25B, the morphologies of diamond crystallites in the center and at the edge of the growth surface are twinned, shown as uniform star-shapes.

Figure 26:
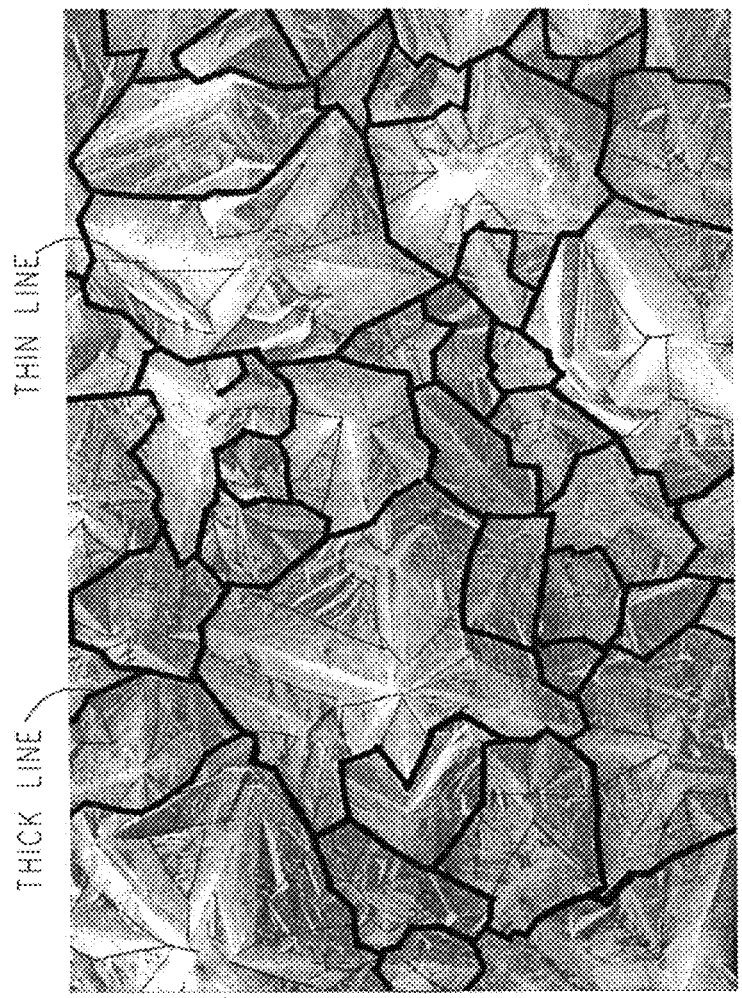
FIG. 26 is an SEM image of the center of the diamond wafer shown in FIG. 24 including thick lines between boundary grains and thin lines between twinning intersections.

With reference to FIG. 26, the level of twinning for wafer 01A227 was determined by Method 1, i.e., by measuring the total length of the boundaries among diamond crystal grains (thick lines) and the total length of the twinning intersections inside a diamond mother grain (thin lines) in the SEM image of the center of wafer 01A227. The total length of the twinning intersections in a diamond mother grain was found to be 2,530 mm and the total length of the boundaries among the diamond mother grains was measured to be 2,780 mm. Thus, the percentage of twinning (Method 1) for wafer 01A227 was determined to be 47.6% by division of 2,530 by a sum of 2,530 and 2,780.

Figure 27:
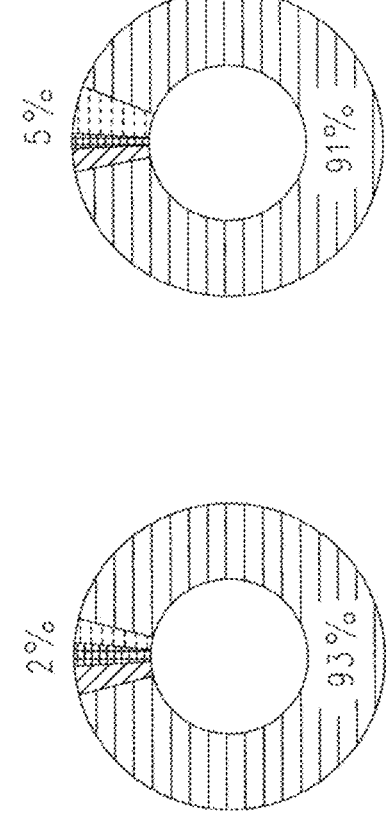
FIG. 27 shows rings representing percentages of orientations of diamond crystallites obtained from XRD patterns of a one-inch sample of the growth side and a nucleation side-polished of the diamond wafer shown in FIG. 24.

As shown in FIG. 27, diamond crystallites of the polycrystalline diamond 01A227 are highly [110]-oriented. Via XRD patterns (represented by the percentage of orientation distributions of diamond crystallites shown by the ring in FIG. 27) it was determined that the center-growth side (left ring in FIG. 27) of wafer 01A226 has 93% [110]-orientation, and that the nucleation side of wafer 01A226 (after polishing) (right ring in FIG. 27) has 91% [110]-orientation.

The growth surface of a one-inch (25.4 mm) piece of diamond laser-cut from wafer 01A227 was lapped and polished (FIG. 28A). With reference to FIG. 28A, it was observed that this one-inch piece of wafer 01A227 had diamond crystals twins around the [110] axis, resulting in a bicycle-wheel shaped, or concentric, morphology. Such concentric twinning creates the pie-shape or wedge-shape crystal sections shown in FIG. 28A.

To confirm the unique twinned diamond crystal grains in wafer 01A227, the polished growth surface of wafer 01A227 was etched in hydrogen microwave plasma for one hour. Hydrogen free radicals in hydrogen microwave plasma etch carbon away from the polycrystalline diamond surface. Moreover, hydrogen free radicals of the hydrogen microwave plasma also etch carbon atoms off the boundaries among diamond crystal grains and twinning intersections within an twinned diamond grain faster than the hydrogen microwave plasma etches carbon atoms off of the regular diamond surface planes, mainly the [110] planes, in this particular case. FIG. 22B is an SEM image of the hydrogen microwave plasma etched surface. As can be seen in FIG. 28B, within a diamond grain, there can be a number, e.g., without limitation 16-20, of instances of wedge-shaped or pie-shaped twinned crystal sections that have different SEM brightness in almost alternative patterns. The radius of these wedge-shaped or pie-shaped twinned crystal sections range from a few microns to as large as 150 microns or greater. The tips of the wedge-shaped or pie-shaped twinned crystal sections tend to converge at the center of the "bicycle wheel" as can be seen in the wedge-shaped or pie-shaped twinned crystal sections polished surface of FIG. 28A and of the polished and etched surface of FIG. 28B. The polygon side length of these wedges range from a few microns to a few tens of microns or greater. It is believed that such nearly concentric twinning is unique and results in a substantial reduction in the stress of polycrystalline diamond films during growth along the radial directions (360°) of these 'bicycle-wheels' or polygons. Without such concentric twinning and/or [110]-orientation, successful growth of a polycrystalline diamond film to a desirable thickness without premature-delamination was not attainable, see, e.g., Examples 3 and 4.

Figure 28C:
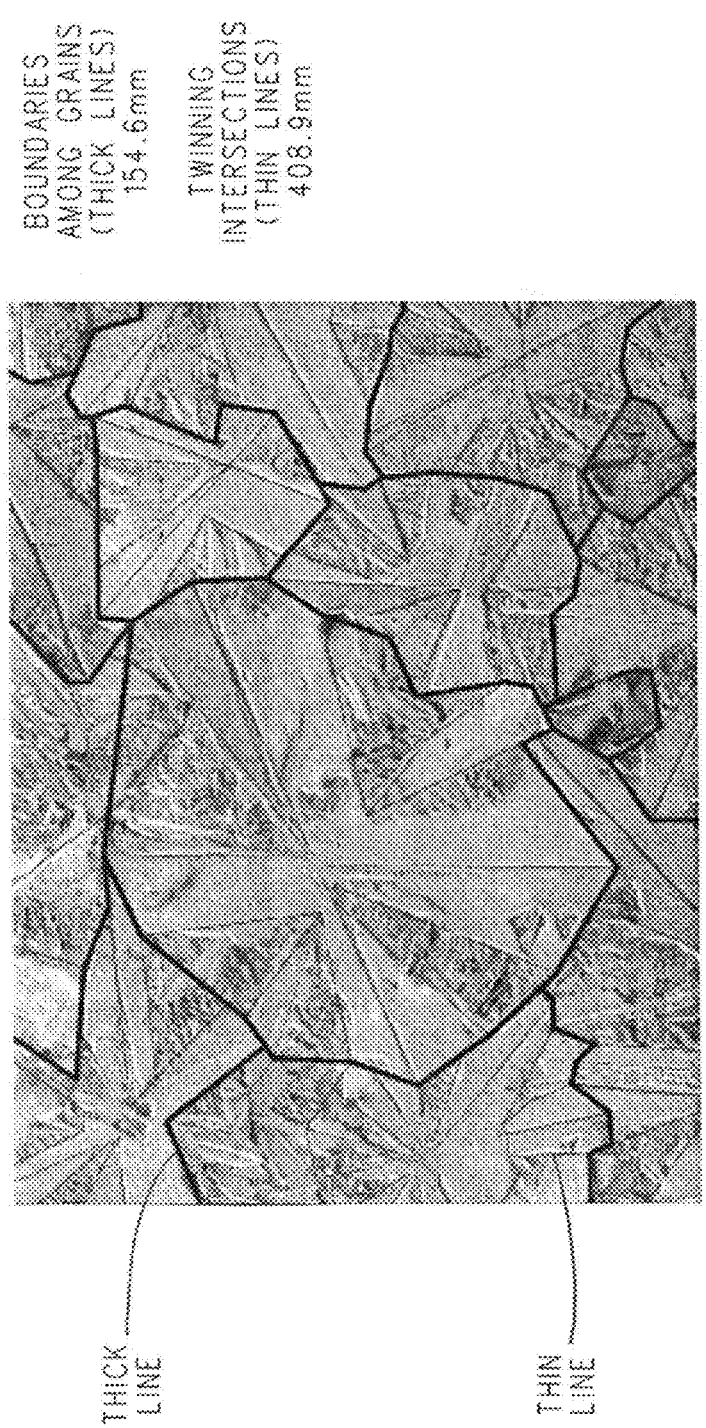
FIG. 28C is an SEM image of the polished-and-etched growth surface of the diamond wafer shown in FIG. 24 including thick lines between boundary grains and thin lines between twinning intersections.

To quantify the degree of twinning, the SEM image of FIG. 28B was imported into AutoCAD® software. The boundaries among diamond crystal grains were traced with thicker line segments while the twinning intersections inside a diamond grain were traced with thinner line segments, as shown in FIG. 28C. The total length of line segments for the grain boundaries ($L_{Grain\_Boundary\_2}$) and the total length for the line segments for the twinning intersections ($L_{Twinning\_Intersection\_2}$) were tallied. With 15 diamond mother grains involved, it was found that $L_{Twinning\_Intersection\_2}=408.9$ mm and $L_{Grain\_Boundary\_2}=154.6$ mm. Therefore, the twinning percentage (Method 2) for wafer 01A227 was determined to be 72.6% by a division of 408.9 by a sum of 408.9 and 154.6.

It was observed that concentric twinning also introduces discontinuities into the crystal planes, whereupon the sizes of the crystal planes are reduced over diamond wafers that do not exhibit concentric twinning. Therefore, a multi-twinned diamond grain practically has smaller planes that behave similar to small diamond grains. This is beneficial in mitigating the spread and propagation of the diamond [111] cleavage at a localized grain for improved durability, while twinning maintains the mother grain effectively large so that phonons can efficiently transporting through the diamond crystal lattice at a speed which is close to that in a non-twinned grain. To this end, phonon transport through diamond lattice is intrinsically faster than the speed that phonons transport across grain boundaries.

Moreover, polycrystalline diamond of smaller grains typically perform superior in mechanical applications with respect to toughness or brittleness over diamond film of larger grains. However, polycrystalline diamond of smaller grains have a greater area of inter-grain boundaries which slow down the speed of phonon transport and reduce thermal conductivity of the diamond, which can lead to temperature elevations of the working piece of the diamond tool and the object on which this diamond tool acts on. At elevated temperatures, diamond of smaller grains, such as nano-sized diamond having large amounts of surface area among the grain boundaries, deteriorates in air or even in a protective environment. Moreover, at elevated temperatures, nano-sized diamond deteriorates faster in air due to both graphitization and oxidation than it does in an inert atmosphere due to graphitization. Moreover, oxidation releases energy which heats the diamond tool to even a higher temperature. Thus, the polycrystalline highly [110]-oriented and twinned diamond described herein is unique for mechanical applications, thermal management, and other applications.

The average surface roughness (Ra) and Peak-to-Valley (PV) on the polished growth side of wafer 01A227 were measured with an interferometer to be 33.6 angstroms and 10,754 angstroms, respectively. Furthermore, the average surface roughness (Ra) and Peak-to-Valley (PV) on the polished nucleation side of wafer 01A227 were measured with an interferometer to be 19.5 angstroms and 11,972 angstroms (a relatively high PV value can be due to presence of some dust particles on this surface), respectively. For polycrystalline diamond, it is surprising to observe such low surface roughness on both sides of the polished surfaces, particularly on the nucleation side, which, it is believed, can be due to the uniformity of the diamond crystallites in highly [110]-oriented, and twinned polycrystalline wafer 01A227.

This example, along Examples 1, 5 and 7 (described hereinafter), demonstrate that highly twinned, [110]-oriented polycrystalline diamond wafers of different thicknesses can be successfully produced in different microwave plasma CVD reactors with similar properties that are beneficial in many diamond applications, such as, but not limited to mechanical, thermal, optical, detector, microwave, electromagnetic wave management, acoustic wave management, chemical inertness, wearing, friction controls, etc.

Example 7

Successful Growth of Highly Twinned, [110]-Oriented Polycrystalline Diamond Film at 1180° C. in a Separate CVD Reactor for 90 Hours with 3% Methane A piece of metallic tungsten 160 mm in diameter was used as a substrate 24 in a separate microwave plasma CVD reactor 16 similar to the one used in Example 1. A mixture of 2400 mL/min hydrogen and 72 mL/min methane was flowed into the microwave plasma CVD reactor 16 with a methane concentration of 3%, also the same as Example 1. After plasma ignition, the microwave power and the reactor pressure were tuned so that the plasma 20 size covered the entire surface of the metallic tungsten substrate 24. The diamond growth temperature at the center of substrate 24 was controlled at 1180° C. by cooling substrate 24, e.g., via a thermal-electric cooler in contact with substrate 24 or by a fluid cooling substrate 24. A control pyrometer 26 was used to monitor the temperature of the diamond 4 growing at the center of the substrate during diamond deposition.

Figure 29:
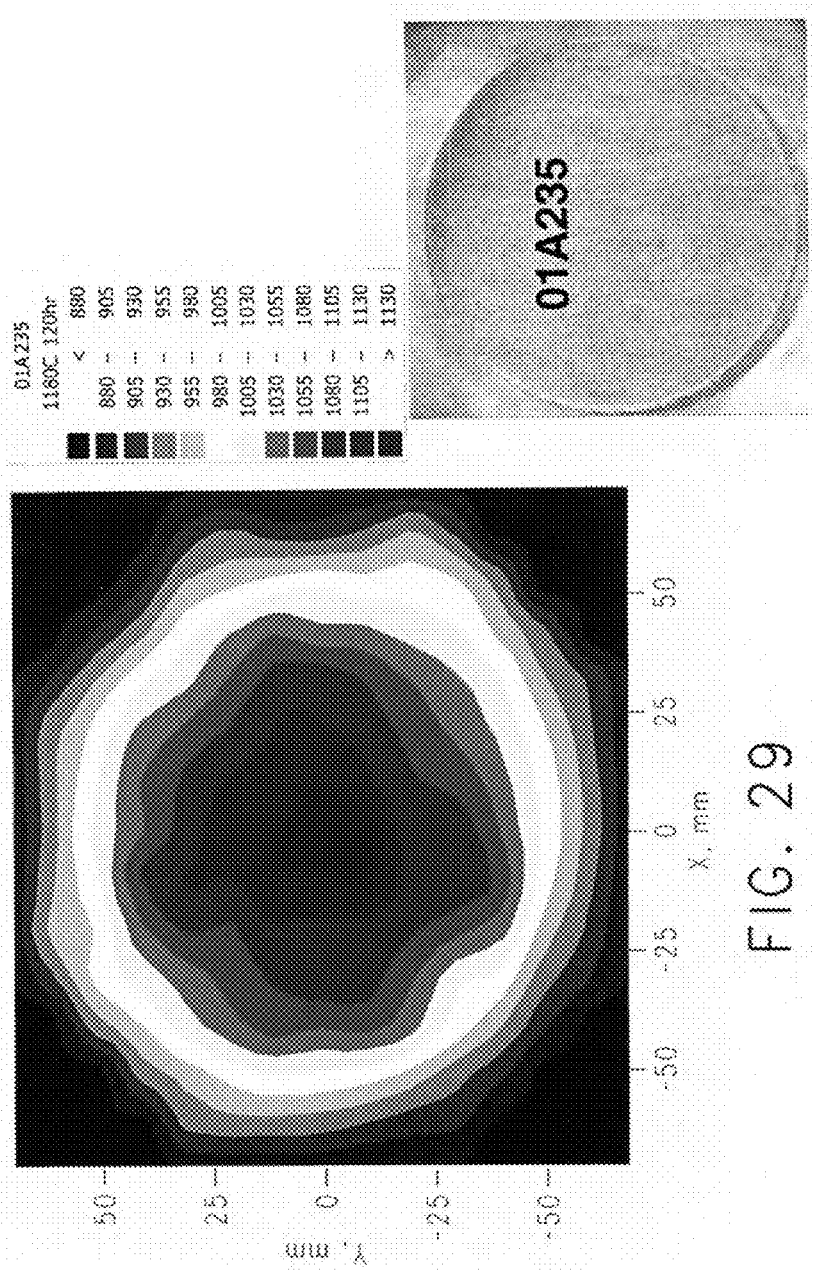
FIG. 29 is an optical image and a thickness contour plot of the diamond wafer grown in accordance with Example 7 described herein.

After 120 hours of diamond growth, the reaction was stopped and the grown diamond 4 was separated from the metallic tungsten substrate 24, whereupon a free standing polycrystalline diamond wafer was produced, namely, wafer 01A235, shown in the optical image of FIG. 29. From this optical image, it can be seen that wafer 01A235 contained no cracks.

Figure 30A:
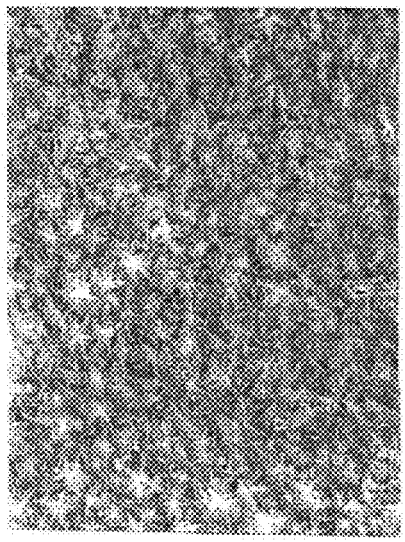
FIGS. 30A-30C show three different magnifications (low, intermediate, and high) of the center of the diamond wafer shown in FIG. 29.
Figure 30B:
Figure 30C:
Figure 30D:
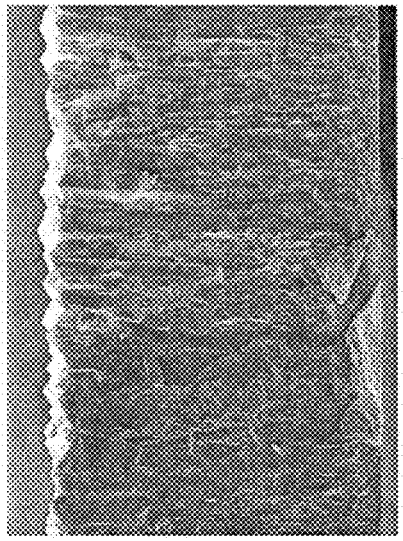
FIG. 30D is a cross-section of the diamond wafer shown in FIG. 29.

The average growth rate of wafer 01A235 was determined to be 8.45 micron per hour, with a minimum growth rate of 7.28 micron per hour and a maximum growth rate of 9.56 micron per hour. The thickness of wafer 01A235 was observed to be uniform, ranging from 874 to 1147 microns with a standard deviation of 7.83%, as shown in Table 4 above and in the contour plot of FIG. 29. As shown in FIGS. 30A-30C the morphologies of diamond crystallites in the center of wafer 01A234 are twinned, shown as uniformly star-shapes (observed from the growth surface) at three different magnifications, i.e., FIG. 30A lowest magnification, FIG. 30B intermediate magnification (between magnifications of FIG. 30A and FIG. 30C) and FIG. 30C highest magnification. FIG. 30D shows an image of a magnified cross-section of wafer 01A235 with columnized diamond growth.

In addition, as shown in FIGS. 31A and 31B diamond crystallites in the polycrystalline diamond 01A235 are highly [110]-oriented. XRD patterns (represented by the percentage of orientation distributions of diamond crystallites shown by the ring in FIG. 31A) of both center and edge parts of the growth side of wafer 01A235 (left top and left bottom rings in FIG. 31A) of wafer 01A235 show 95% [110] orientation. At the same time, both center part and edge part of the nucleation side of the wafer 01A235 (right top and right bottom rings in FIG. 31A) show 87% and 89% [110]-orientation.

Raman spectroscopy (FIG. 31B) was also used to study the diamond quality of a wafer 01A235, wherein the central part of the growth side of wafer 01A235 shows a sharp $Sp^3$ diamond signature peak at Raman Shift of 1332 $cm^{-1}$ with a FWHM of 4.82 $cm^{-1}$. The edge part of the growth side of wafer 01A235 also shows same $Sp^3$ diamond signature peak with a FWHM of 5.09 $cm^{-1}$. A natural single crystal diamond also has a peak of Raman Shift at the same location with a FWHM of 4.04 $cm^{-1}$.

As can be seen from Examples 1, 5, 6, and 7, highly twinned, [110]-oriented polycrystalline diamond wafers of different thicknesses can be successfully produced in different CVD reactors at different growth temperatures with properties that are highly beneficial in many diamond applications, such as, but not limited to mechanicals, thermal, optical, detector, microwave, electromagnetic wave management, acoustic wave management, chemical inertness, wearing, friction controls, etc.

The embodiments have been described with reference to various examples. Modifications and alterations will occur to others upon reading and understanding the forgoing examples. For example, while microwave plasma CVD has been described as an example method of growing diamond wafers, it is envisioned that any other suitable and/or desirable CVD growth method can be used for growing diamond wafers, such as, without limitation, hot filament CVD and plasma enhanced CVD. Accordingly, the forgoing examples are not to be construed as limiting the disclosure.

The invention claimed is:

1. A method of chemical vapor deposition (CVD) growth of a free standing polycrystalline diamond film in a CVD reactor, the free standing polycrystalline diamond film having a thickness ≥100 micron and a percentage of orientation along a [110] diamond lattice direction ≥70% of the total number of diamond crystallites forming the polycrystalline diamond film, the method comprising:

(a) igniting and maintaining a plasma above a surface of a conductive substrate disposed in the CVD reactor in the presence of flow of a gas mixture of gaseous hydrogen (H) and a gaseous hydrocarbon (GH) into the CVD reactor, wherein the CVD reactor is maintained at a pressure (P) 100 torr<P≤350 torr during growth of the polycrystalline diamond film, whereupon the maintained plasma forms the polycrystalline diamond film on the surface of the conductive substrate; and (b) concurrent with step (a), controlling a temperature T at the center of the diamond film such that 1000° C.≤T≤1300° C.

2. The method of claim 1, wherein the flow of the gas mixture includes:
   a flow of GH ($F_{GH}$) of 10 mL/min≤$F_{GH}$≤200 mL/min; and
   a flow of H ($F_H$) of 1000 mL/min≤$F_H$≤3500 mL/min.

3. The method of claim 1, wherein the gas mixture is introduced into the CVD reactor at a flow rate of ≥1000 mL/min.

4. The method of claim 1, wherein a concentration of the gaseous hydrocarbon ($C_{GH}$) in the mixture is 0.5%≤$C_{GH}$≤5%.

5. The method of claim 1, wherein GH is methane ($CH_4$).

6. The method of claim 5, wherein a concentration of methane ($C_{CH4}$) in the mixture is 1-4%.

7. The method of claim 1, further including forming the plasma in step (a) by introducing microwave energy into the CVD reactor, wherein a power of the microwave energy introduced into the CVD reactor is between 15 k watts-30 k watts.

8. The method of claim 7, wherein the microwave energy is introduced into the CVD reactor at a frequency of 915 Mhz.

9. The method of claim 1, wherein the mixture further includes at least one of the following: nitrogen, boron, an oxygen containing gas, and an inert gas.

10. The method of claim 1, wherein the polycrystalline diamond film is grown by one of the following techniques: microwave-plasma CVD, DC-Arc Jet plasma CVD, hot-filament CVD, and hydrocarbon (e.g., acetylene) torch CVD.

* * * * *